(12) United States Patent
More

(10) Patent No.: US 12,302,603 B2
(45) Date of Patent: May 13, 2025

(54) SEMICONDUCTOR DEVICE AND METHODS OF FORMATION

(71) Applicant: Taiwan Semiconductor Manufacturing Company, Ltd., Hsinchu (TW)

(72) Inventor: Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 474 days.

(21) Appl. No.: 17/661,152

(22) Filed: Apr. 28, 2022

(65) Prior Publication Data

US 2023/0352593 A1    Nov. 2, 2023

(51) Int. Cl.
| | |
|---|---|
| H01L 27/12 | (2006.01) |
| H01L 21/02 | (2006.01) |
| H10D 30/01 | (2025.01) |
| H10D 30/67 | (2025.01) |
| H10D 62/10 | (2025.01) |
| H10D 64/01 | (2025.01) |
| H10D 84/01 | (2025.01) |
| H10D 84/03 | (2025.01) |

(52) U.S. Cl.
CPC ..... *H10D 30/6713* (2025.01); *H01L 21/0259* (2013.01); *H10D 30/031* (2025.01); *H10D 30/6735* (2025.01); *H10D 30/6757* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/038* (2025.01)

(58) Field of Classification Search
CPC ....... H01L 29/78618; H01L 21/823807; H01L 21/823814; H01L 29/0665; H01L 29/42392; H01L 29/66553; H01L 29/66742; H01L 29/78696; H01L 29/66439; H01L 29/775; H01L 29/0847; H01L 21/02603; H01L 21/823412; H01L 29/66636; H01L 21/823871; H01L 2924/13063; H01L 29/41725; H01L 29/458; H01L 29/0669; H01L 29/66575; H01L 29/772; H01L 29/1029; H01L 29/7802; H01L 29/66431; H01L 29/8083; H01L 29/1095; H01L 29/7371
See application file for complete search history.

(56) References Cited

U.S. PATENT DOCUMENTS

| | | |
|---|---|---|
| 10,170,484 B1 | 1/2019 | Sung et al. |
| 2018/0158951 A1 | 6/2018 | Huang et al. |

(Continued)

FOREIGN PATENT DOCUMENTS

TW    201931565 A    8/2019

*Primary Examiner* — Niki H Nguyen
(74) *Attorney, Agent, or Firm* — Harrity & Harrity, LLP

(57) ABSTRACT

Some implementations described herein provide a nanostructure transistor and methods of formation. The nanostructure transistor includes concave-shaped regions at ends of a plurality of channel layers. The nanostructure transistor further includes convex-shaped portions of an epitaxial material, included as part of a source/drain region of the nanostructure transistor, that extend into the concave-shaped regions. Masking, etching, and cleaning operations, performed after deposition of a buffer layer, may form the concave-shaped regions.

20 Claims, 34 Drawing Sheets

(56) References Cited

U.S. PATENT DOCUMENTS

2018/0294331 A1* 10/2018 Cho ................ H01L 29/78696
2020/0044087 A1   2/2020 Guha et al.
2020/0135476 A1   4/2020 Huang et al.
2020/0273861 A1   8/2020 Bi et al.

* cited by examiner

SEMICONDUCTOR DEVICE AND METHODS OF FORMATION

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for a transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
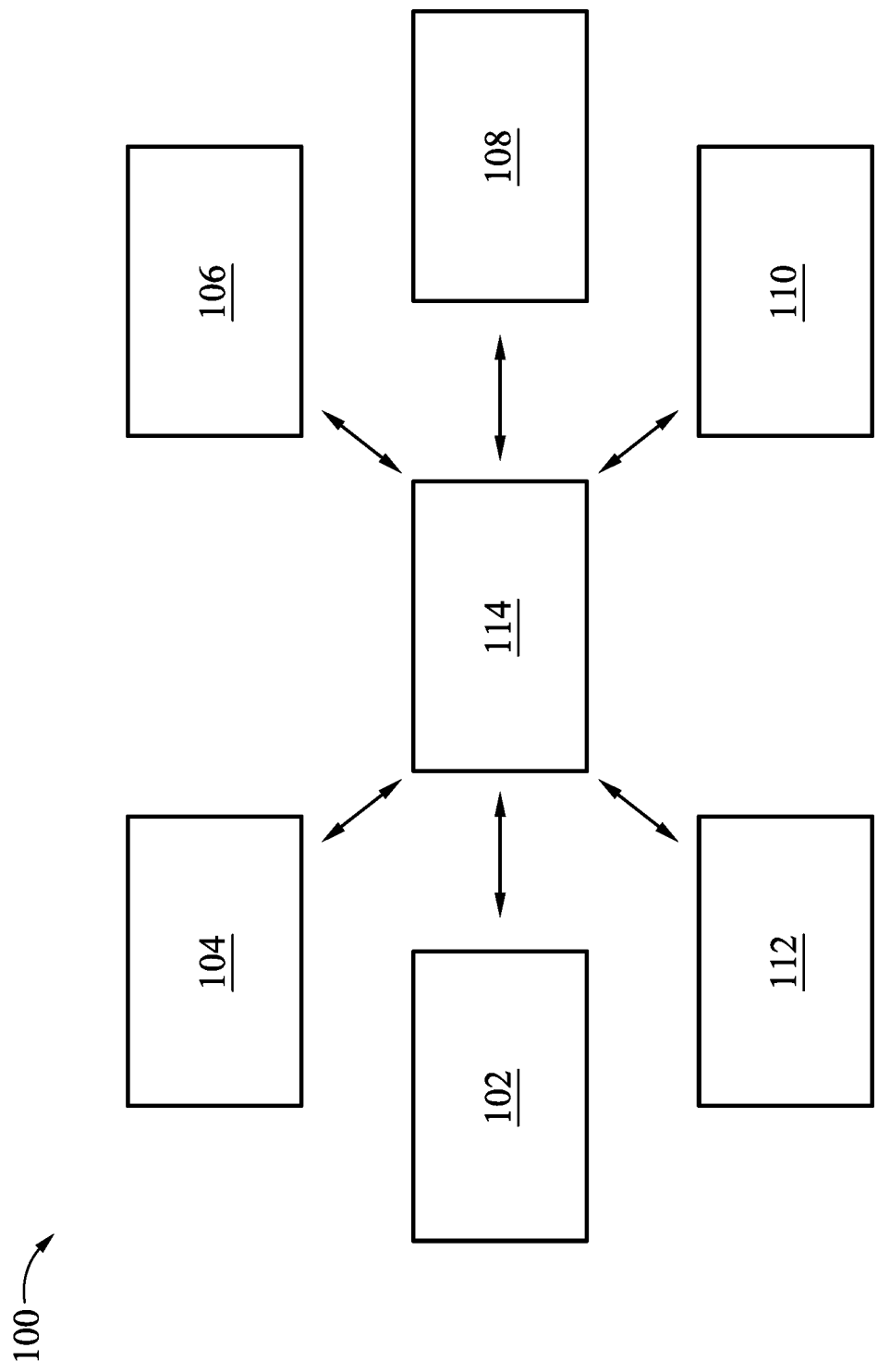
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, reducing geometric and dimensional properties of a fin field-effect transistor (finFET) may decrease a performance of the finFET. As an example, a likelihood of short channel effects such as drain-induced barrier lowering in a finFET may increase as finFET technology processing nodes decrease. A likelihood of electron tunneling and leakage in a finFET may increase as a gate length of the finFET decreases.

Nanostructure transistors (e.g., nanowire transistors, nanosheet transistors, gate-all-around (GAA) transistors, multi-bridge channel transistors, nanoribbon transistors, and/or other types of nanostructure transistors) may overcome one or more of the above-described drawbacks of finFETs. However, nanostructure transistors face fabrication challenges that can cause performance issues and/or device failures. For example, an increased length of a nanosheet used to form a channel of a nanostructure transistor may increase a channel resistance ($R_{ch}$) of the nanostructure transistor, while a low volume of epitaxial materials within a source/drain region may increase a parasitic resistance ($R_p$) of the nanostructure transistor. The epitaxial materials of the source/drain region may be susceptible to damage, such as non-merge issues, due to irregularities in shapes between ends of the nanosheets and inner spacers above or below the ends of the nanosheets.

Some implementations described herein provide a nanostructure transistor and methods of formation. The nanostructure transistor includes concave-shaped regions at ends of a plurality of channel layers. The nanostructure transistor further includes convex-shaped portions of an epitaxial material, included as part of a source/drain region of the nanostructure transistor, that extend into the concave-shaped regions. Masking, etching, and cleaning operations, performed after deposition of a buffer layer, may form the concave-shaped regions.

In this way, a performance of the nanostructure transistor is improved. For example, a length of channels of the nanostructure transistor may be reduced to decrease the channel resistance ($R_{ch}$) of the nanostructure transistor. Additionally, or alternatively, a volume of epitaxial materials within the source/drain region may be increased to decrease the parasitic resistance ($R_p$) of the nanostructure transistor. Such decreases in $R_{ch}$ and/or $R_p$ may increase a drive current of the nanostructure transistor. The concave-shaped ends of the channel layers may also reduce a likelihood of non-merge issues to improve a yield of semiconductor devices including the nanostructure channel transistor.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2-15 and elsewhere herein, the semiconductor processing tools 102-112 may perform a combination of operations to form portions of a nanostructure transistor. As an example, one combination of operations includes forming, over a semiconductor substrate, a plurality of nanostructure layers in a direction that is perpendicular to the semiconductor substrate. In some implementations, the plurality of nanostructure layers comprises a plurality of sacrificial layers alternating with a plurality of channel layers. The combination of operations includes forming inner spacers on ends of the plurality of sacrificial layers, forming concave-shaped regions in ends of the plurality of channel layers, and forming a source/drain region adjacent to the inner spacers and the concave-shaped regions. In some implementations, forming the source/drain region includes forming convex-shaped portions of an epitaxial layer of the source/drain region within the concave-shaped regions at the ends of the plurality of channel layers. The combination of operations further includes forming a gate structure including a portion that wraps around the plurality of channel layers.

Additionally, or alternatively, another combination of operations includes forming, over a semiconductor substrate, a first plurality of channel layers for an n-type metal-oxide (NMOS) nanostructure transistor and a second plurality of channel layers for a p-type metal-oxide (PMOS) nanostructure transistor. In some implementations, forming the first plurality of channel layers includes forming the first plurality of channel layers along a first axis that is perpendicular to the semiconductor substrate, and forming the second plurality of channel layers includes forming the second plurality of channel layers along a second axis that is perpendicular to the semiconductor substrate. The combination of operations includes depositing, over ends of the first plurality of channel layers, a masking material, removing, from ends of the second plurality of channel layers, portions to form concave-shaped regions at the ends of the second plurality of channel layers, and removing the masking material after forming the concave-shaped regions. The combination of operations includes forming a first source/drain region adjacent to the first plurality of channel layers and a second source/drain region adjacent to the second plurality of channel layers. In some implementations, forming the first source/drain region includes forming a first portion of an epitaxial layer over the ends of the first plurality of channel layers, and forming the second source/drain region includes forming a second portion of the epitaxial layer within the concave-shaped regions at the ends of the second plurality of channel layers. The combination of operations includes forming a first gate structure and a second gate structure. In some implementations, forming the first gate structure includes forming a portion that wraps around the first plurality of channel layers, and forming the second gate structure includes forming a portion that wraps around the second plurality of channel layers.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
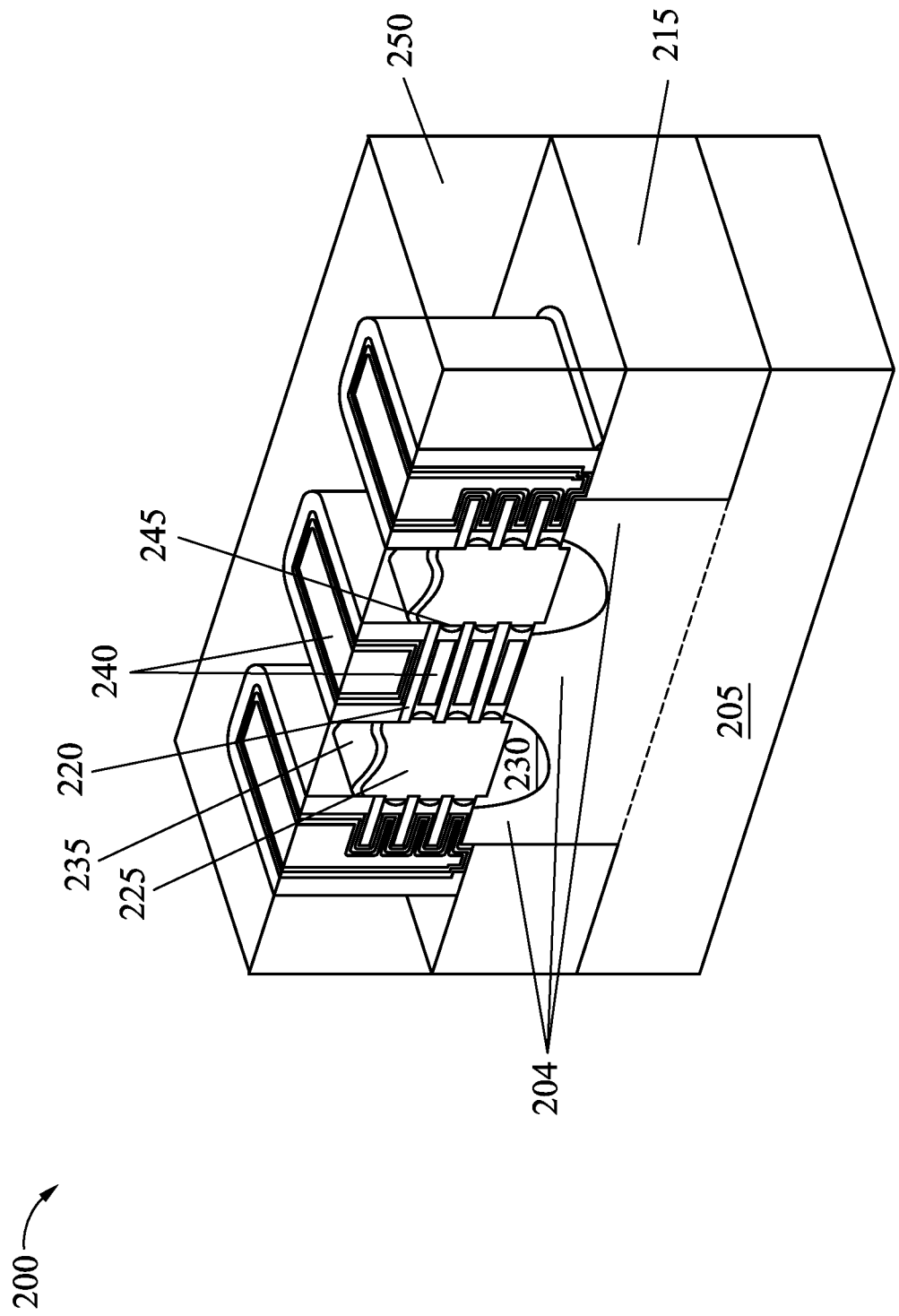
FIG. 2 is a diagram of an example semiconductor device described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2. FIGS. 3A-10D are schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 205. The semiconductor substrate 205 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The semiconductor substrate 205 may include various layers, including conductive or insulating layers formed on a semiconductor substrate. The semiconductor substrate 205 may include a compound semiconductor and/or an alloy semiconductor. The semiconductor substrate 205 may include various doping configurations to satisfy one or more design parameters. For example, different doping profiles (e.g., n-wells, p-wells) may be formed on the semiconductor substrate 205 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 205 may include an epitaxial layer (epi-layer), may be strained for performance enhancement, and/or may have other suitable enhancement features. The semiconductor substrate 205 may include a portion of a semiconductor wafer on which other semiconductor devices are formed.

Mesa regions 210 are included above (and/or extend above) the semiconductor substrate 205. A mesa region 210 provides a structure on which nanostructures of the semiconductor device 200 are formed, such as nanostructure channels, nanostructure gate portions that wrap around each of the nanostructure channels, and/or sacrificial nanostructures, among other examples. In some implementations, one or more mesa regions 210 are formed in and/or from a fin structure (e.g., a silicon fin structure) that is formed in the semiconductor substrate 205. The mesa regions 210 may include the same material as the semiconductor substrate 205 and are formed from the semiconductor substrate 205. In some implementations, the mesa regions 210 are doped to form different types of nanostructure transistors, such as p-type nanostructure transistors and/or n-type nanostructure transistors. In some implementations, the mesa regions 210 include silicon (Si) materials or another elementary semiconductor material such as germanium (Ge). In some implementations, the mesa regions 210 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 210 are fabricated by suitable semiconductor process techniques, such as masking, photolithography, and/or etch processes, among other examples. As an example, fin structures may be formed by etching a portion of the semiconductor substrate 205 away to form recesses in the semiconductor substrate 205. The recesses may then be filled with isolating material that is recessed or etched back to form shallow trench isolation (STI) regions 215 above the semiconductor substrate 205 and between the fin structures. Source/drain recesses may be formed in the fin structures, which results in formation of the mesa regions 210 between the source/drain recesses. However, other fabrication techniques for the STI regions 215 and/or for the mesa regions 210 may be used.

The STI regions 215 may electrically isolate adjacent fin structures and may provide a layer on which other layers and/or structures of the semiconductor device 200 are formed. The STI regions 215 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 215 may include a multi-layer structure, for example, having one or more liner layers.

The semiconductor device 200 includes a plurality of nanostructure channels 220 that extend between, and are electrically coupled with, source/drain regions 225. The nanostructure channels 220 are arranged in a direction that is approximately perpendicular to the semiconductor substrate 205. In other words, the nanostructure channels 220 are vertically arranged or stacked above the semiconductor substrate 205.

The nanostructure channels 220 include silicon-based nanostructures (e.g., nanosheets or nanowires, among other examples) that function as the semiconductive channels of the nanostructure transistor(s) of the semiconductor device 200. In some implementations, the nanostructure channels 220 may include silicon germanium (SiGe) or another silicon-based material. The source/drain regions 225 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 225, n-type metal-oxide semiconductor (NMOS) nanostructure transistors that include n-type source/drain regions 225, and/or other types of nanostructure transistors.

In some implementations, a buffer region 230 is included under a source/drain region 225 between the source/drain region 225 and a fin structure above the semiconductor substrate 205. A buffer region 230 may provide isolation between a source/drain region 225 and adjacent mesa regions 210. A buffer region 230 may be included to reduce, minimize, and/or prevent electrons from traversing into the mesa regions 210 (e.g., instead of through the nanostructure channels 220, thereby reducing current leakage), and/or may be included to reduce, minimize and/or prevent dopants from the source/drain region 225 into the mesa regions 210 (which reduces short channel effects).

A capping layer 235 may be included over and/or on the source/drain region 225. The capping layer 235 may include silicon, silicon germanium, doped silicon, doped silicon germanium, and/or another material. The capping layer 235 may be included to reduce dopant diffusion and to protect the source/drain regions 225 in semiconductor processing operations for the semiconductor device 200 prior to contact formation. Moreover, the capping layer 235 may contribute to metal-semiconductor (e.g., silicide) alloy formation.

At least a subset of the nanostructure channels 220 extend through one or more gate structures 240. The gate structures 240 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 240 so that one or more other layers and/or structures of the semiconductor device 200 may be formed prior to formation of the gate structures 240. This reduces and/or prevents damage to the gate structures 240 that would otherwise be caused by the formation of the one or more layers and/or structures. A replacement gate process (RGP) is then performed to remove the dummy gate structures and replace the dummy gate structures with the gate structures 240 (e.g., replacement gate structures).

As further shown in FIG. 2, portions of a gate structure 240 are formed in between pairs of nanostructure channels 220 in an alternating vertical arrangement. In other words, the semiconductor device 200 includes one or more vertical stacks of alternating nanostructure channels 220 and portions of a gate structure 240, as shown in FIG. 2. In this way, a gate structure 240 wraps around an associated nanostructure channel 220 on all sides of the nanostructure channel 220 which increases control of the nanostructure channel 220, increases drive current for the nanostructure transistor(s) of the semiconductor device 200, and reduces short channel effects (SCEs) for the nanostructure transistor(s) of the semiconductor device 200.

Some source/drain regions 225 and gate structures 240 may be shared between two or more nanoscale transistors of the semiconductor device 200. In these implementations, one or more source/drain regions 225 and a gate structure 240 may be connected or coupled to a plurality of nanostructure channels 220, as shown in the example in FIG. 2. This enables the plurality of nanostructure channels 220 to be controlled by a single gate structure 240 and a pair of source/drain regions 225.

Inner spacers (InSP) 245 may be included between a source/drain region 225 and an adjacent gate structure 240. In particular, inner spacers 245 may be included between a source/drain region 225 and portions of a gate structure 240 that wrap around a plurality of nanostructure channels 220. The inner spacers 245 are included on ends of the portions of the gate structure 240 that wrap around the plurality of nanostructure channels 220. The inner spacers 245 are included in cavities that are formed in between end portions of adjacent nanostructure channels 220. The inner spacer 245 are included to reduce parasitic capacitance and to protect the source/drain regions 225 form being etched in a nanosheet release operation to remove sacrificial nanosheets between the nanostructure channels 220. The inner spacers 245 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

In some implementations, the semiconductor device 200 includes hybrid fin structures (not shown). The hybrid fin structures may also be referred to as dummy fins, H-fins, or non-active fins, among other examples. Hybrid fin structures may be included between adjacent source/drain regions 225, between portions of a gate structure 240, and/or between adjacent stacks of nanostructure channels 220, among other examples. The hybrid fins extend in a direction that is approximately perpendicular to the gate structures 240.

Hybrid fin structures are configured to provide electrical isolation between two or more structures and/or components included in the semiconductor device 200. In some implementations, a hybrid fin structure is configured to provide electrical isolation between two or more stacks of nanostructure channels 220. In some implementations, a hybrid fin structure is configured to provide electrical isolation between two or more source/drain regions 225. In some implementations, a hybrid fin structure is configured to provide electrical isolation between two or more gates structures or two or more portions of a gate structure 240. In some implementations, a hybrid fin structure is configured to provide electrical isolation between a source/drain region 225 and a gate structure 240.

A hybrid fin structure may include a plurality of types of dielectric materials. A hybrid fin structure may include a combination of one or more low dielectric constant (low-k) dielectric materials (e.g., a silicon oxide ($SiO_x$) and/or a silicon nitride ($Si_xN_y$), among other examples) and one or more high dielectric constant (high-k) dielectric materials (e.g., a hafnium oxide ($HfO_x$) and/or other high-k dielectric material).

The semiconductor device 200 may also include an interlayer dielectric (ILD) layer 250 above the STI regions 215. The ILD layer 250 may be referred to as an ILD0 layer. The ILD layer 250 surrounds the gate structures 240 to provide electrical isolation and/or insulation between the gate structures 240 and/or the source/drain regions 225, among other examples. Conductive structures such as contacts and/or interconnects may be formed through the ILD layer 250 to the source/drain regions 225 and the gate structures 240 to provide control of the source/drain regions 225 and the gate structures 240.

As described in connection with FIGS. 3A-15 and elsewhere herein, the semiconductor device 200 may be formed to include features corresponding to one or more portions of a nanostructure transistor. For example, the semiconductor device 200 may include a plurality of channel layers over the semiconductor substrate 205. In some implementations, the plurality of channel layers are arranged in a direction that is perpendicular to the semiconductor substrate 205. In some implementations, the plurality of channel layers include concave-shaped regions at ends of the plurality of channel layers. The semiconductor device 200 includes a gate structure (e.g., of the gate structures 240) wrapping around each of the plurality of channel layers, and a source/drain region (e.g., of the source/drain regions 225) adjacent to the plurality of channel layers and the gate structure.

As indicated above, FIG. 2 is provided as an example. Other examples may differ from what is described with regard to FIG. 2.

Figure 3A:
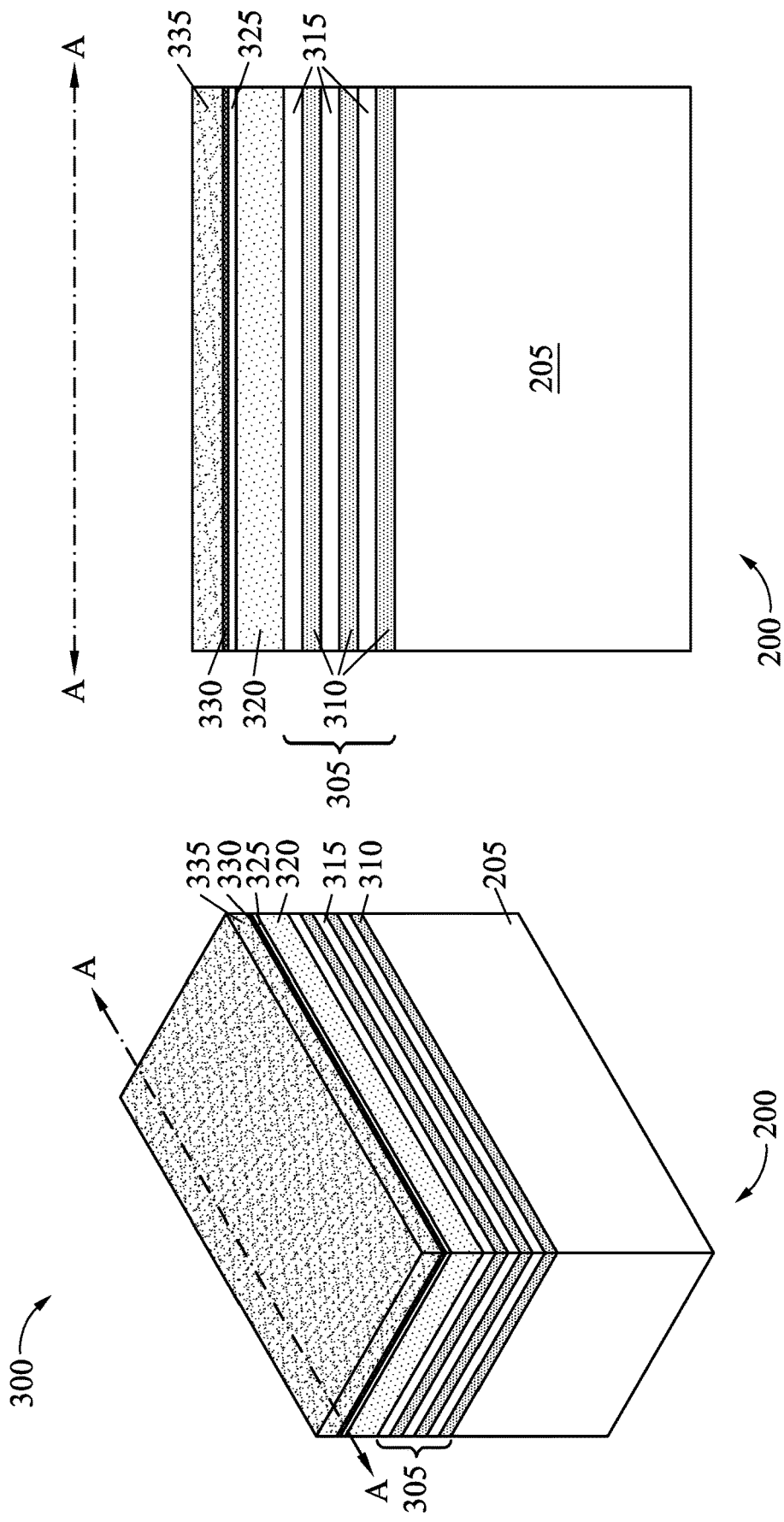
FIGS. 3A and 3B are diagrams of an example implementation of a fin formation process described herein.
Figure 3B:
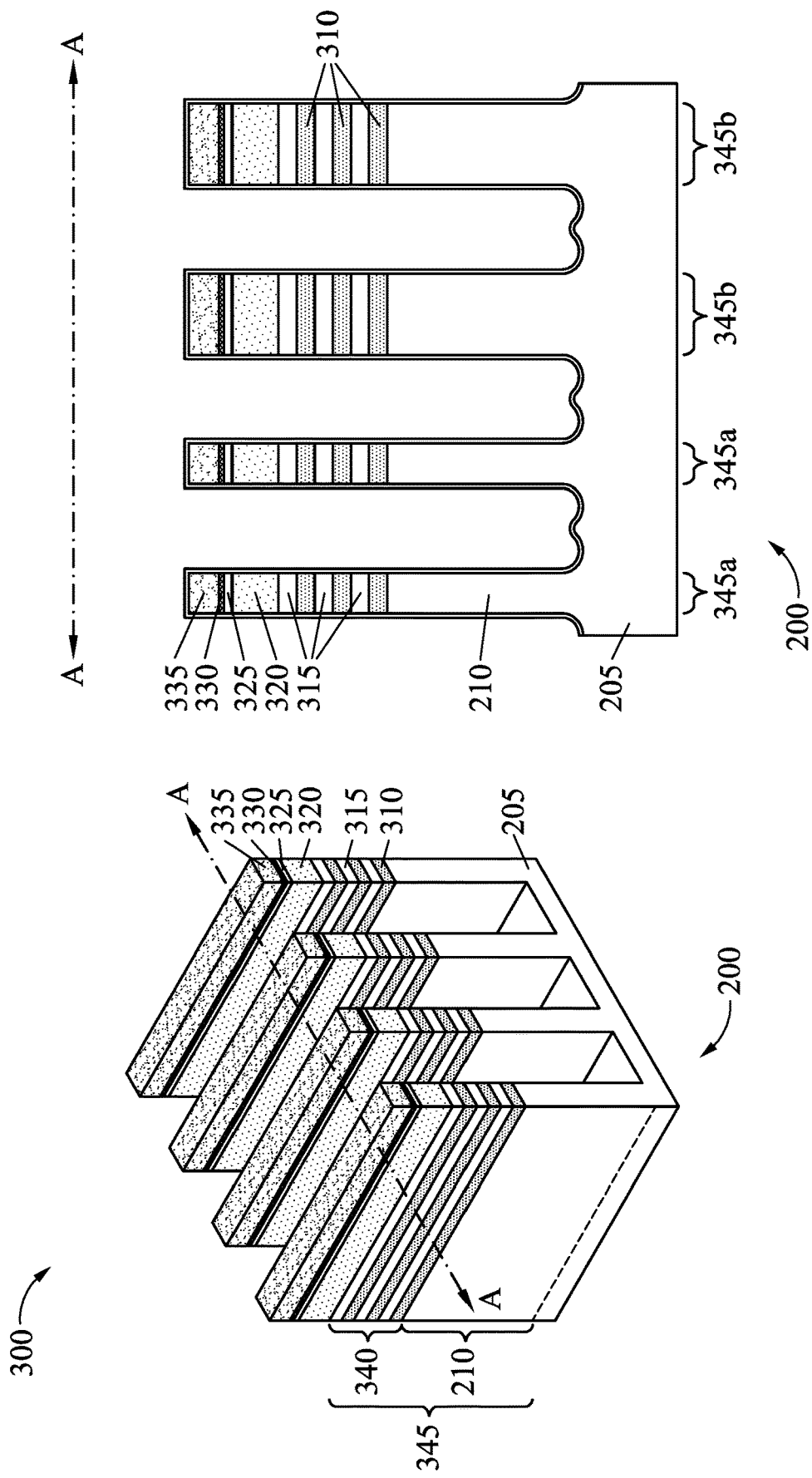

FIGS. 3A and 3B are diagrams of an example implementation 300 of a fin formation process described herein. The example implementation 300 includes an example of forming fin structures for the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 3A and 3B. Additionally, or alternatively, one or more additional semiconductor structures and/or semiconductor devices may be formed in a same layer of an electronic device that includes the semiconductor device 200.

FIG. 3A illustrates a perspective view of the semiconductor device 200 and a cross-sectional view along the line A-A in the perspective view. As shown in FIGS. 3A, processing of the semiconductor device 200 is performed in connection with the semiconductor substrate 205. A layer stack 305 is formed on the semiconductor substrate 205. The layer stack 305 may be referred to as a superlattice. In some implementations, one or more operations to form are performed in connection with the semiconductor substrate 205 prior to formation of the layer stack 305. For example, an anti-punch through (APT) implant operation may be performed. The APT implant operation may be performed in one or more regions of the semiconductor substrate 205 above which the nanostructure channels 220 are to be formed. The APT implant operation is performed, for example, to reduce and/or prevent punch-through or unwanted diffusion into the semiconductor substrate 205.

The layer stack 305 includes a plurality of alternating layers that are arranged in a direction that is approximately perpendicular to the semiconductor substrate 205. For example, the layer stack 305 includes vertically alternating layers of first layers 310 and second layers 315 above the semiconductor substrate 205. The quantity of the first layers 310 and the quantity of the second layers 315 illustrated in FIG. 3A are examples, and other quantities of the first layers 310 and the second layers 315 are within the scope of the present disclosure. In some implementations, the first layers 310 and the second layers 315 are formed to different thicknesses. For example, the second layers 315 may be formed to a thickness that is greater relative to a thickness of the first layers 310. In some implementations, the first layers 310 (or a subset thereof) are formed to a thickness in a range of approximately 4 nanometers to approximately 7 nanometers. In some implementations, the second layers 315 (or a subset thereof) are formed to a thickness in a range of approximately 8 nanometers to approximately 12 nanometers. However, other values for the thickness of the first layers 310 and for the thickness of the second layers 315 are within the scope of the present disclosure.

The first layers 310 include a first material composition, and the second layers 315 include a second material composition. In some implementations, the first material composition and the second material composition are the same material composition. In some implementations, the first material composition and the second material composition are different material compositions. As an example, the first layers 310 may include silicon germanium (SiGe) and the second layers 315 may include silicon (Si). In some implementations, the first material composition and the second material composition have different oxidation rates and/or etch selectivity.

As described herein, the second layers 315 may be processed to form the nanostructure channel 220 for subsequently-formed nanostructure transistors of the semiconductor device 200. The first layers 310 are sacrificial nanostructures that are eventually removed and serve to define a vertical distance between adjacent nanostructure channels 220 for a subsequently-formed gate structure 240 of the semiconductor device 200. Accordingly, the first layers 310 are referred to as sacrificial layers and the second layers 315 may be referred to as channel layers.

The deposition tool 102 deposits and/or grows the alternating layers of the layer stack 305 to include nanostructures (e.g., nanosheets) on the semiconductor substrate 205. For example, the deposition tool 102 grows the alternating layers by epitaxial growth. However, other processes may be used to form the alternating layers of the layer stack 305. Epitaxial growth of the alternating layers of the layer stack 305 may be performed by a molecular beam epitaxy (MBE) process, a metalorganic chemical vapor deposition (MOCVD) process, and/or another suitable epitaxial growth process. In some implementations, the epitaxially grown layers such as the second layers 315 include the same material as the material of the semiconductor substrate 205. In some implementations, the first layers 310 and/or the second layers 315 include a material that is different from the material of the semiconductor substrate 205. As described above, in some implementations, the first layers 310 include epitaxially grown silicon germanium (SiGe) layers and the second layers 315 include epitaxially grown silicon (Si) layers. Alternatively, the first layers 310 and/or the second layers 315 may include other materials such as germanium (Ge), a compound semiconductor material such as silicon carbide (SiC), gallium arsenide (GaAs), gallium phosphide (GaP), indium phosphide (InP), indium arsenide (IAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 310 and/or the material(s) of the second layers 315 may be chosen based on providing different oxidation properties, different etching selectivity properties, and/or other different properties.

As further shown in FIG. 3A, the deposition tool 102 may form one or more additional layers over and/or on the layer stack 305. For example, a hard mask (HM) layer 320 may be formed over and/or on the layer stack 305 (e.g., on the top-most second layer 315 of the layer stack 305). As another example, a capping layer 325 may be formed over and/or on the hard mask layer 320. As another example, another hard mask layer including an oxide layer 330 and a nitride layer 335 may be formed over and/or on the capping layer 325. The one or more hard mask (HM) layers 320, 325, and 330 may be used to form one or more structures of the semiconductor device 200. The oxide layer 330 may function as an adhesion layer between the layer stack 305 and the nitride layer 335, and may act as an etch stop layer for etching the nitride layer 335. The one or more hard mask layers 320, 325, and 330 may include silicon germanium (SiGe), a silicon nitride ($Si_xN_y$), a silicon oxide ($SiO_x$), and/or another material. The capping layer 325 may include silicon (Si) and/or another material. In some implementations, the capping layer 325 is formed of the same material as the semiconductor substrate 205. In some implementations, the one or more additional layers are thermally grown, deposited by CVD, PVD, ALD, and/or are formed using another deposition technique.

FIG. 3B illustrates a perspective view of the semiconductor device 200 and a cross-sectional view along the line A-A. As shown in FIG. 3B, the layer stack 305 and the semiconductor substrate 205 are etched to remove portions of the layer stack 305 and portions of the semiconductor substrate 205. The portions 340 of the layer stack 305, and mesa portions (also referred to as mesa regions 210), remaining after the etch operation are referred to a fin structures 345 above the semiconductor substrate 205 of the semiconductor device 200. A fin structure 345 includes a portion 340 of the layer stack 305 over and/or on a mesa region 210 formed in and/or above the semiconductor substrate 205. The fin structures 345 may be formed by any suitable semiconductor processing technique. For example, the deposition tool 102, the exposure tool 104, the developer tool 106, and/or the etch tool 108 may form the fin structures 345 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on the hard mask layer including the oxide layer 330 and the nitride layer 335, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 205 and portions the layer stack 305 in an etch operation such that the portions of the semiconductor substrate 205 and portions the layer stack 305 remain non-etched to form the fin structures 345. Unprotected portions of the substrate and unprotected portions of the layer stack 305 are etched (e.g., by the etch tool 108) to form trenches in the semiconductor substrate 205. The etch tool may etch the unprotected portions of the substrate and unprotected portions of the layer stack 305 using a dry etch technique (e.g., reactive ion etching), a wet etch technique, and/or a combination thereof.

In some implementations, another fin formation technique is used to form the fin structures 345. For example, a fin region may be defined (e.g., by mask or isolation regions) and, and the portions 340 may be epitaxially grown in the form of the fin structures 345. In some implementations, forming the fin structures 345 includes a trim process to decrease the width of the fin structures 345. The trim process may include wet and/or dry etching processes, among other examples.

As further shown in FIG. 3B, fin structures 345 may be formed for different types of nanostructure transistors for the semiconductor device 200. In particular, a first subset of fin structures 345a may be formed for p-type nanostructure transistors (e.g., p-type metal oxide semiconductor (PMOS) nanostructure transistors), and a second subset of fin structures 345b may be formed for n-type nanostructure transistors (e.g., n-type metal oxide semiconductor (NMOS) nanostructure transistors). The second subset of fin structures 345b may be doped with a p-type dopant (e.g., boron (B) and/or germanium (Ge), among other examples) and the first subset of fin structures 345a may be doped with an n-type dopant (e.g., phosphorous (P) and/or arsenic (As), among other examples). Additionally, or alternatively, p-type source/drain regions 225 may be subsequently formed for the p-type nanostructure transistors that include the first subset of fin structures 345a, and n-type source/drain regions 225 may be subsequently formed for the n-type nanostructure transistors that include the second subset of fin structures 345b.

The first subset of fin structures 345a (e.g., PMOS fin structures) and the second subset of fin structures 345b (e.g., NMOS fin structures) may be formed to include similar properties and/or different properties. For example, the first subset of fin structures 345a may be formed to a first height and the second subset of fin structures 345b may be formed to a second height, where the first height and the second height are different heights. As another example, the first subset of fin structures 345a may be formed to a first width and the second subset of fin structures 345b may be formed to a second width, where the first width and the second width are different widths. In the example shown in FIG. 3B, the second width of the second subset of fin structures 345b (e.g., for the NMOS nanostructure transistors) is greater relative to the first width of the first subset of fin structures 345a (e.g., for the PMOS nanostructure transistors). However, other examples are within the scope of the present disclosure.

As indicated above, FIGS. 3A and 3B are provided as an example. Other examples may differ from what is described with regard to FIGS. 3A and 3B. Example implementation 300 may include additional operations, fewer operations, different operations, and/or a different order of operations than those described in connection with FIGS. 3A and 3B.

Figure 4A:
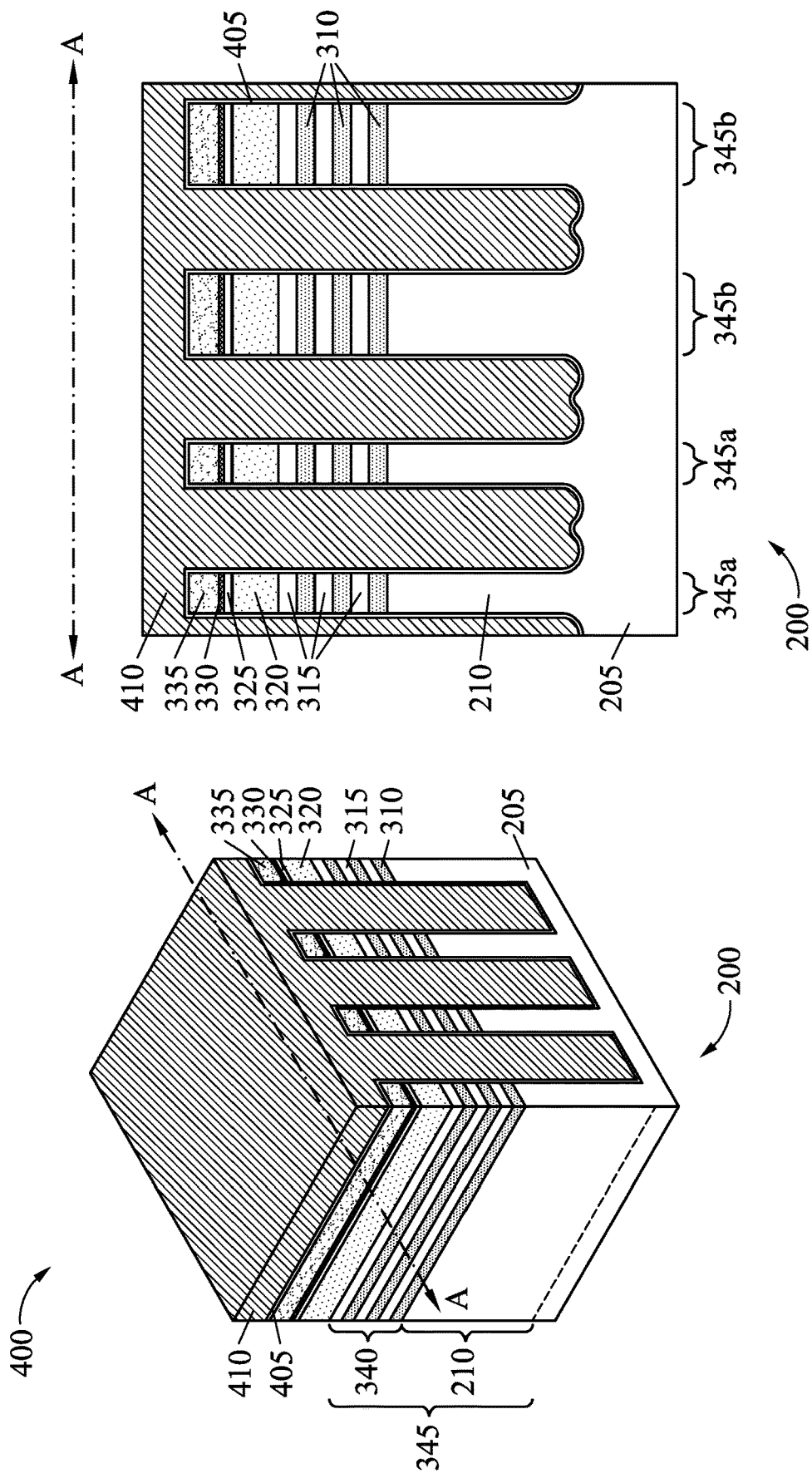
FIGS. 4A and 4B are diagrams of an example implementation of a shallow trench isolation (STI) process described herein.
Figure 4B:
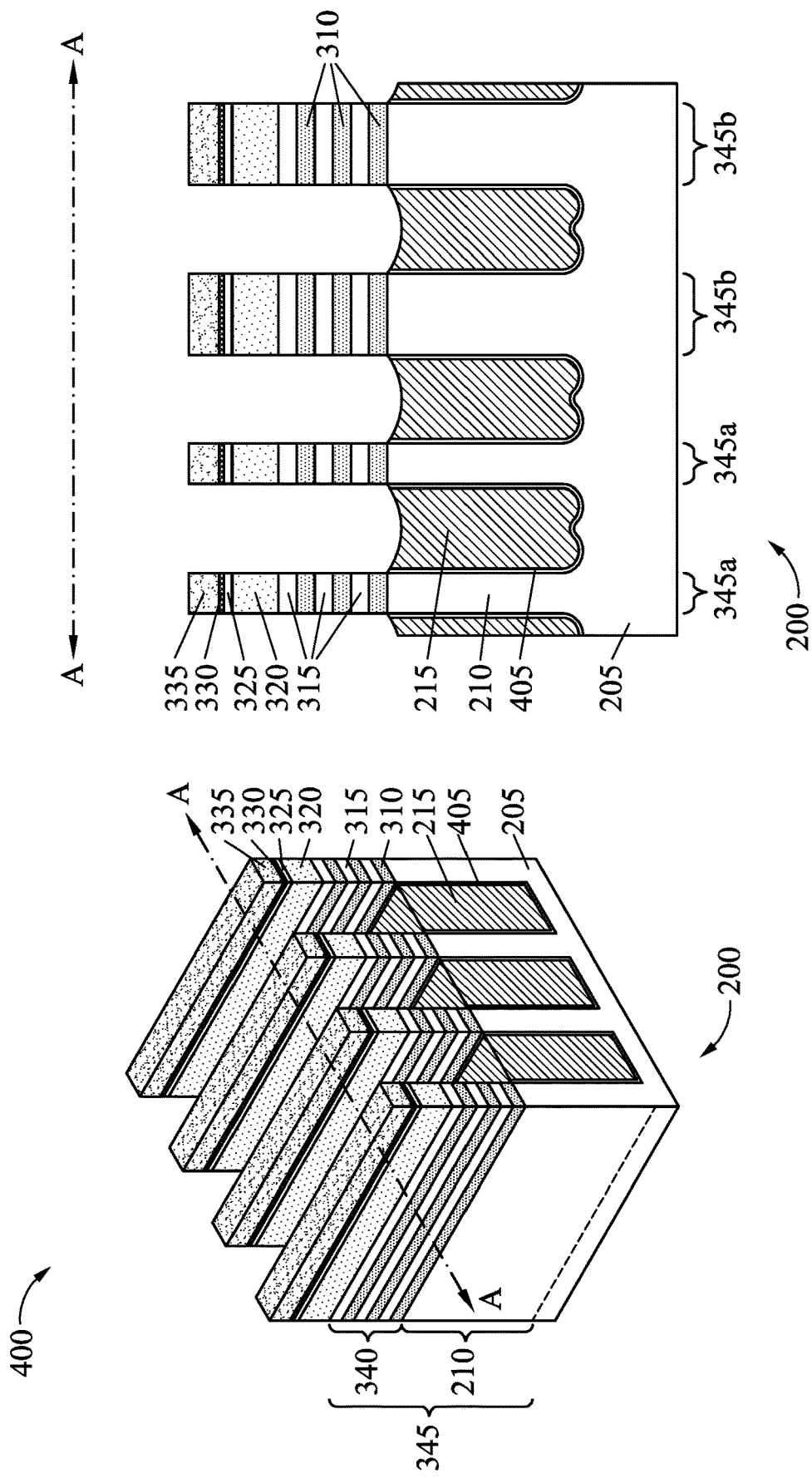

FIGS. 4A and 4B are diagrams of an example implementation 400 of an STI formation process described herein. The example implementation 400 includes an example of forming STI regions 215 between the fin structures 345 for the semiconductor device 200 or a portion thereof. The semiconductor device 200 may include one or more additional devices, structures, and/or layers not shown in FIGS. 4A and 4B. The semiconductor device 200 may include additional layers and/or dies formed on layers above and/or below the portion of the semiconductor device 200 shown in FIGS. 4A and 4B. Additionally, or alternatively, one or more additional semiconductor structures and/or semiconductor devices may be formed in a same layer of an electronic device that includes the semiconductor device 200. In some implementations, the operations described in connection with the example implementation 400 are performed after the processes described in connection with FIGS. 3A and 3B.

FIG. 4A illustrates a perspective view of the semiconductor device 200 and a cross-sectional view along the line A-A. As shown in FIG. 4A, a liner 405 and a dielectric layer 410 are formed above the semiconductor substrate 205 and interposing (e.g., in between) the fin structures 345. The deposition tool 102 may deposit the liner 405 and the dielectric layer 410 over the semiconductor substrate 205 and in the trenches between the fin structures 345. The deposition tool 102 may form the dielectric layer 410 such that a height of a top surface of the dielectric layer 410 and a height of a top surface of the nitride layer 335 are approximately a same height.

Alternatively, the deposition tool 102 may form the dielectric layer 410 such that the height of the top surface of the dielectric layer 410 is greater relative to the height of the top surface of the nitride layer 335, as shown in FIG. 4A. In this way, the trenches between the fin structures 345 are overfilled with the dielectric layer 410 to ensure the trenches are fully filled with the dielectric layer 410. Subsequently, the planarization tool 110 may perform a planarization or polishing operation (e.g., a CMP operation) to planarize the dielectric layer 410. The nitride layer 335 of the hard mask layer may function as a CMP stop layer in the operation. In other words, the planarization tool 110 planarizes the dielectric layer 410 until reaching the nitride layer 335 of the hard mask layer. Accordingly, a height of top surfaces of the dielectric layer 410 and a height of top surfaces of the nitride layer 335 are approximately equal after the operation.

The deposition tool 102 may deposit the liner 405 using a conformal deposition technique. The deposition tool 102 may deposit the dielectric layer using a CVD technique (e.g., a flowable CVD (FCVD) technique or another CVD technique), a PVD technique, an ALD technique, and/or another deposition technique. In some implementations, after deposition of the liner 405, the semiconductor device 200 is annealed, for example, to increase the quality of the liner 405.

The liner 405 and the dielectric layer 410 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 410 may include a multi-layer structure, for example, having one or more liner layers.

FIG. 4B illustrates a perspective view of the semiconductor device 200 and a cross-sectional view along the line A-A. As shown in FIG. 4B, an etch back operation is performed to remove portions of the liner 405 and portions of the dielectric layer 410 to form the STI regions 215. The etch tool 108 may etch the liner 405 and the dielectric layer 410 in the etch back operation to form the STI regions 215. The etch tool 108 etches the liner 405 and the dielectric layer 410 based on the hard mask layer (e.g., the hard mask layer including the oxide layer 330 and the nitride layer 335). The etch tool 108 etches the liner 405 and the dielectric layer 410 such that the height of the STI regions 215 are less than or approximately a same height as the bottom of the portions 340 of the layer stack 305. Accordingly, the portions 340 of the layer stack 305 extend above the STI regions 215. In some implementations, the liner 405 and the dielectric layer 410 are etched such that the heights of the STI regions 215 are less than heights of top surfaces of the mesa regions 210.

In some implementations, the etch tool 108 uses a plasma-based dry etch technique to etch the liner 405 and the dielectric layer 410. Ammonia (NH$_3$), hydrofluoric acid (HF), and/or another etchant may be used. The plasma-based dry etch technique may result in a reaction between the etchant(s) and the material of the liner 405 and the dielectric layer 410, including:

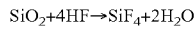

$$SiO_2+4HF \rightarrow SiF_4+2H_2O$$

where silicon dioxide (SiO$_2$) of the liner 405 and the dielectric layer 410 react with hydrofluoric acid to form byproducts including silicon tetrafluoride (SiF$_4$) and water (H$_2$O). The silicon tetrafluoride is further broken down by the hydrofluoric acid and ammonia to form an ammonium fluorosilicate ((NH$_4$)$_2$SiF$_6$) byproduct:

$$SiF_4+2HF+2NH_3 \rightarrow (NH_4)_2SiF_6$$

The ammonium fluorosilicate byproduct is removed from a processing chamber of the etch tool 108. After removal of the ammonium fluorosilicate, a post-process temperature in a range of approximately 200 degrees Celsius to approximately 250 degrees Celsius is used to sublimate the ammonium fluorosilicate into constituents of silicon tetrafluoride ammonia and hydrofluoric acid.

In some implementations, the etch tool 108 etches the liner 405 and the dielectric layer 410 such that a height of the STI regions 215 between the first subset of fin structures 345a (e.g., for the PMOS nanostructure transistors) is greater relative to a height of the STI regions 215 between the second subset of fin structures 345b (e.g., for the NMOS nanostructure transistors). This primarily occurs due to the greater width the fin structures 345b relative to the width of the fin structures 345a. Moreover, this results in a top surface of an STI region 215 between a fin structure 345a and a fin structure 345b being sloped or slanted (e.g., downward sloped from the fin structure 345a to the fin structure 345b, as shown in the example in FIG. 4A). The etchants used to etch the liner 405 and the dielectric layer 410 first experience physisorption (e.g., a physical bonding to the liner 405 and the dielectric layer 410) as a result of a Van der Waals force between the etchants and the surfaces of the liner 405 and the dielectric layer 410. The etchants become trapped by dipole movement force. The etchants then attach to dangling bonds of the liner 405 and the dielectric layer 410, and chemisorption begins. Here, the chemisorption of the etchant on the surface of the liner 405 and the dielectric layer 410 results in etching of the liner 405 and the dielectric layer 410. The greater width of the trenches between the second subset of fin structures 345a provides a greater surface area for chemisorption to occur, which results in a greater etch rate between the second subset of fin structures 345b. The greater etch rate results in the height of the STI regions 215 between the second subset of fin structures 345b being lesser relative to the height of the STI regions 215 between the first subset of fin structures 345a.

As indicated above, FIGS. 4A and 4B are provided as an example. Other examples may differ from what is described with regard to FIGS. 4A and 4B. Example implementation 400 may include additional operations, fewer operations, different operations, and/or a different order of operations than those described in connection with FIGS. 4A and 4B.

Figure 5A:
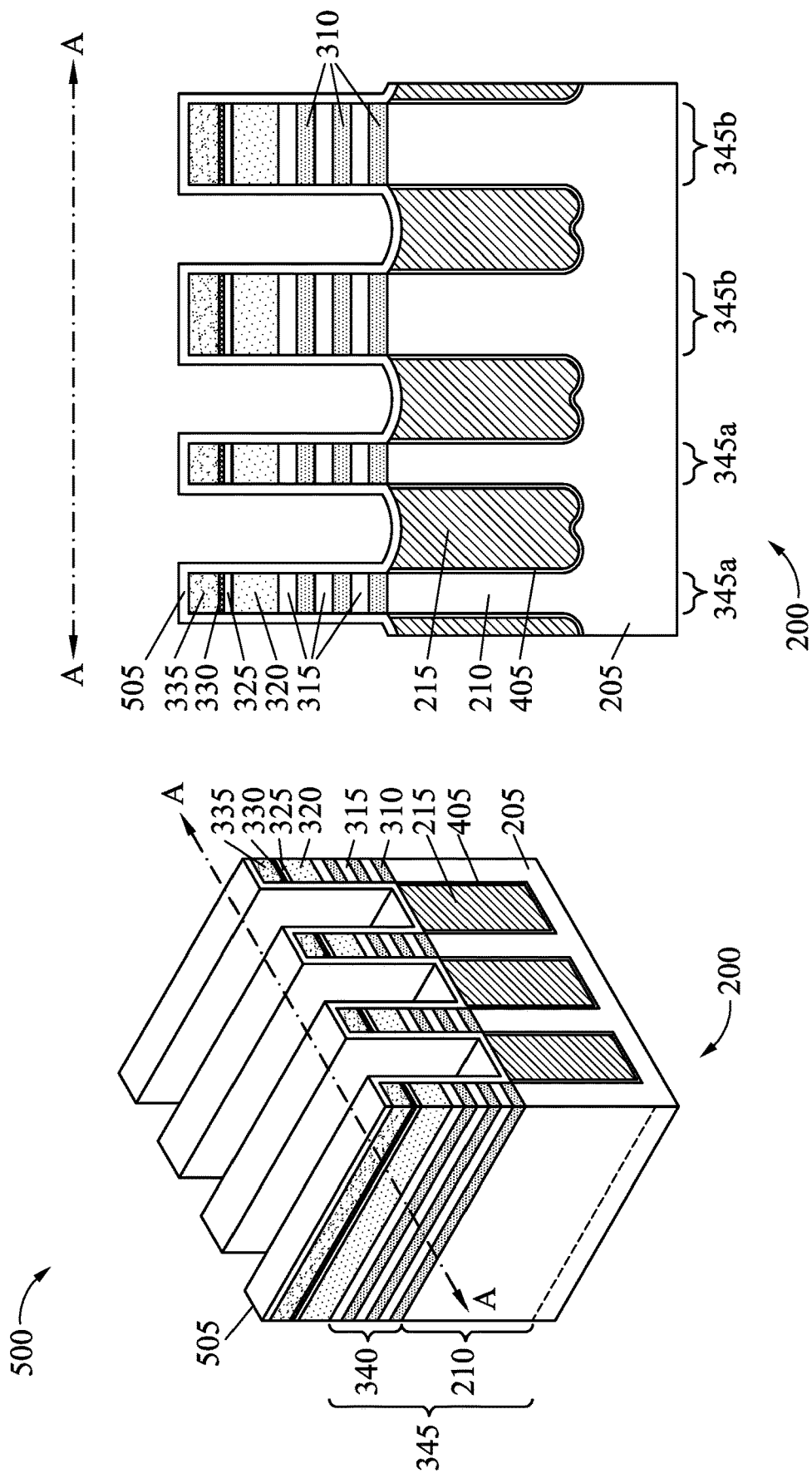
FIGS. 5A-5C are diagrams of an example implementation of a cladding sidewall formation process described herein.
Figure 5B:
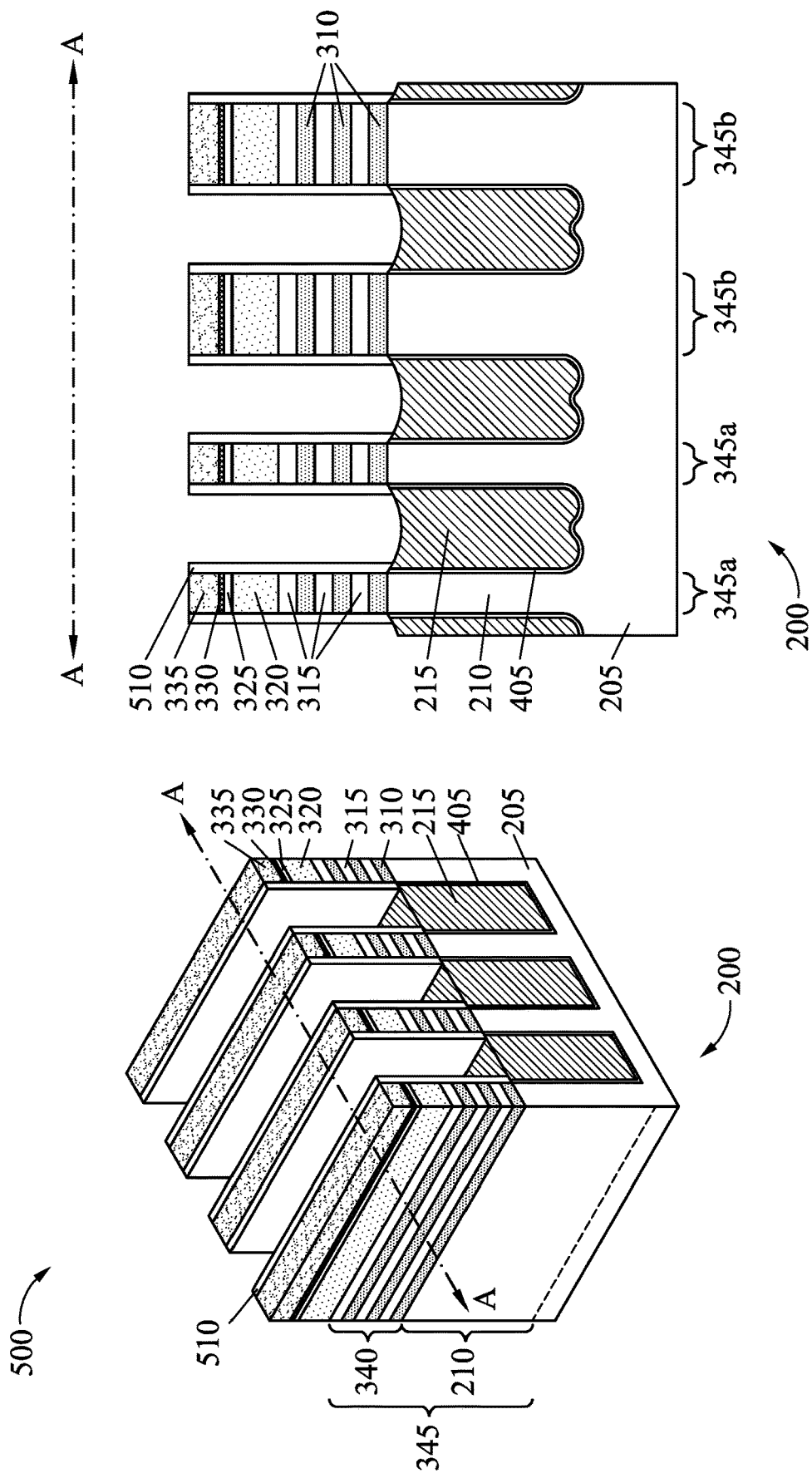
Figure 5C:
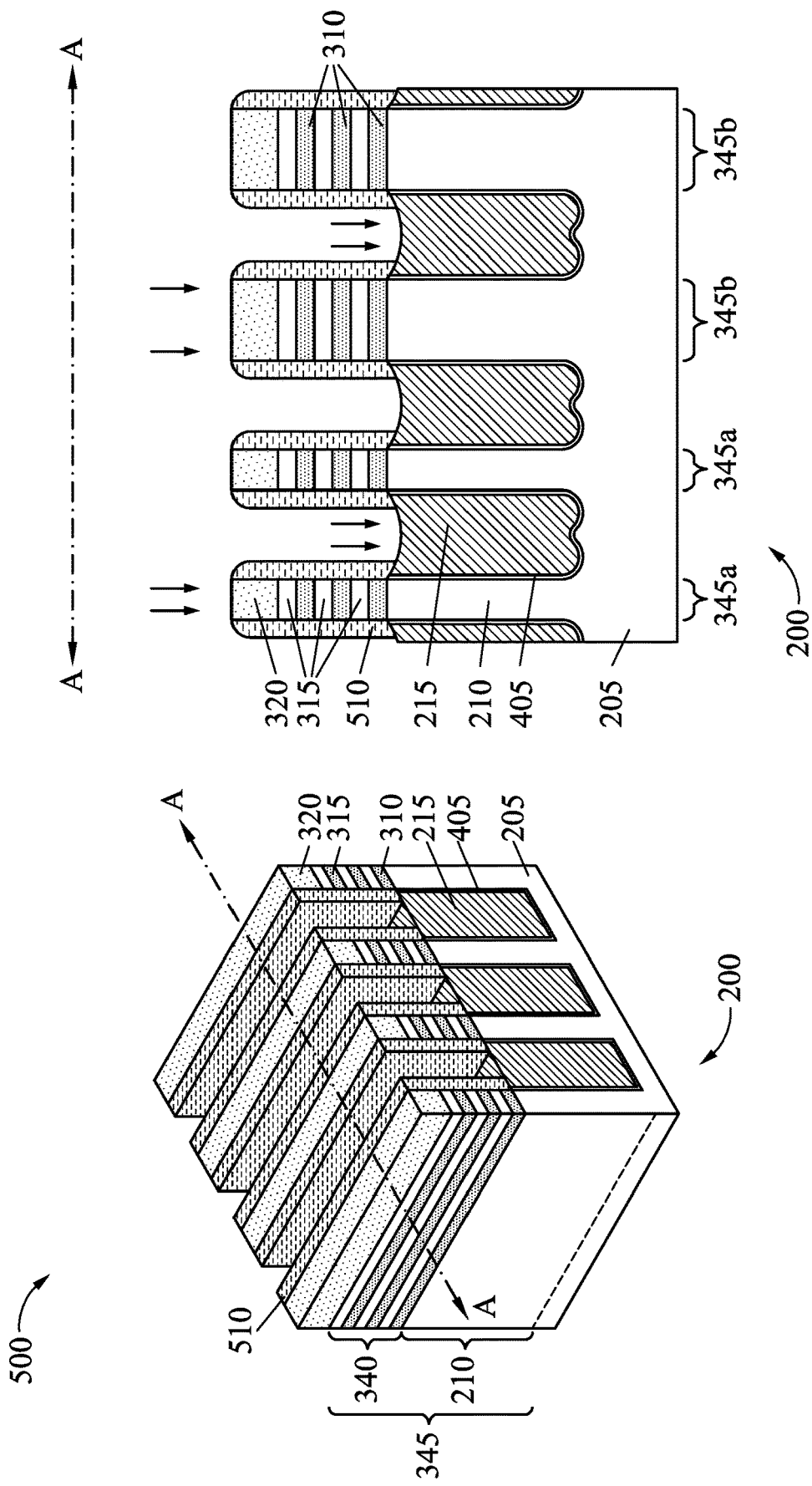

FIGS. 5A-5C are diagrams of an example implementation 500 of a cladding sidewall process described herein. The example implementation 500 includes an example of forming cladding sidewalls over sides of the portions 340 of the layer stacks 305 for the semiconductor device 200 or a portion thereof. The semiconductor device 200 may include one or more additional devices, structures, and/or layers not shown in FIGS. 5A-5C. The semiconductor device 200 may include additional layers and/or dies formed on layers above and/or below the portion of the semiconductor device 200 shown in FIGS. 5A-5C. Additionally, or alternatively, one or more additional semiconductor structures and/or semiconductor devices may be formed in a same layer of an electronic device that includes the semiconductor device 200. In some implementations, the operations described in connection with the example implementation 500 are performed after the processes described in connection with FIGS. 3A-4B.

FIG. 5A illustrates a perspective view of the semiconductor device 200 and a cross-sectional view along the line A-A. As shown in FIG. 5A, a cladding layer 505 is formed over the fin structures 345 (e.g., over the top surfaces and over the sidewalls of the fin structures 345) and over the STI regions 215 between the fin structures 345. The cladding layer 505 includes silicon germanium (SiGe) or another material. The cladding layer 505 may be formed of the same material as the first layers 310 to enable the cladding sidewalls (that are to be formed from the cladding layer 505) and the first layers 310 to be removed in the same etch operation (a nanostructure release operation) so that a replacement gate (e.g., a gate structure 240) may be formed in the areas occupied by the cladding sidewalls and the first layers 310. This enables the replacement gate to fully surround the nanostructure channels of the nanostructure transistors of the semiconductor device 200.

The deposition tool 102 may deposit the cladding layer 505. In some implementations, the deposition tool 102 deposits a seed layer (e.g., a silicon (Si) seed layer or another type of seed layer) over the fin structures 345 (e.g., over the top surfaces and over the sidewalls of the fin structures 345) and over the STI regions 215 between the fin structures 345. Then, the deposition tool 102 deposits silicon germanium on the seed layer to form the cladding layer 505. The seed layer promotes growth and adhesion of the cladding layer 505.

Deposition of the seed layer may include providing a silicon precursor to a processing chamber of the deposition tool 102 using a carrier gas such as nitrogen (N$_2$) or hydrogen (H$_2$), among other examples. In some implementations, a pre-clean operation is performed prior to deposition of the seed layer to reduce the formation of germanium oxide (GeO$_x$). The silicon precursor may include disilane (Si$_2$H$_6$) or another silicon precursor. The use of disilane may enable formation of a seed layer to a thickness that is in a range of approximately 0.5 nanometers to approximately 1.5 nanometers to provide sufficient cladding sidewall thickness while achieving a controllable and uniform thickness for the cladding layer 505. However, other ranges and values for the thickness of the seed layer are within the scope of the present disclosure.

Deposition of the seed layer may be performed at a temperature in a range of approximately 450 degrees Celsius to approximately 500 degrees Celsius (or at a temperature in another range), at a pressure in a range of approximately 30 torr to approximately 100 torr (or at a pressure in another range), and/or for a time duration in a range of approximately 100 seconds to approximately 300 seconds (or for a time duration in another range), among other examples.

Deposition of the silicon germanium of the cladding layer 505 may include forming the cladding layer 505 to include an amorphous texture to promote conformal deposition of the cladding layer 505. The silicon germanium may include a germanium content in a range of approximately 15% germanium to approximately 25% germanium. However, other values for the germanium content are within the scope of the present disclosure. Deposition of the cladding layer 505 may include providing a silicon precursor (e.g., disilane ($Si_2H_6$) or silicon tetrahydride ($SiH_4$), among other examples) and a germanium precursor (e.g., germanium tetrahydride ($GeH_4$) or another germanium precursor) to a processing chamber of the deposition tool 102 using a carrier gas such as nitrogen ($N_2$) or hydrogen ($H_2$), among other examples. Deposition of the cladding layer 505 may be performed at a temperature in a range of approximately 500 degrees Celsius to approximately 550 degrees Celsius (or at a temperature in another range) and/or at a pressure in a range of approximately 5 torr to approximately 20 torr (or at a pressure in another range).

FIG. 5B illustrates a perspective view of the semiconductor device 200 and a cross-sectional view along the line A-A. As shown in FIG. 5B, an etch back operation is performed to etch the cladding layer 505 to form cladding sidewalls 510. The etch tool 108 may etch the cladding layer 505 using a plasma-based dry etch technique or another etch technique. The etch tool 108 may perform the etch back operation to remove portions of the cladding layer 505 from the tops of the fin structures 345 and from the tops of the STI regions 215. Removal of the cladding layer 505 from the tops of the STI regions 215 between the fin structures 345 ensures that the cladding sidewalls 510 do not include a footing on the STI regions 215 between the fin structures 345. This ensures that the cladding sidewalls 510 do not include a footing under hybrid fin structures that are to be formed over the STI regions 215 between the fin structures 345.

In some implementations, the etch tool 108 uses a fluorine-based etchant to etch the cladding layer 505. The fluorine-based etchant may include sulfur hexafluoride ($SF_6$), fluoromethane ($CH_3F_3$), and/or another fluorine-based etchant. Other reactants and/or carriers such as methane ($CH_4$), hydrogen (H2), argon (Ar), and/or helium (He) may be used in the etch back operation. In some implementations, the etch back operation is performed using a plasma bias in a range of approximately 500 volts to approximately 2000 volts. However, other values for the plasma bias are within the scope of the present disclosure. In some implementations, removing portions of the cladding layer 505 from the tops of the STI regions 215 includes performing a highly directional (e.g., anisotropic) etch to selectively remove (e.g., selectively etch) the cladding layer 505 on the tops of the STI regions 215 between the fin structures 345.

In some implementations, the cladding sidewalls 510 include asymmetric properties (e.g., different lengths, depths, and/or angles). The asymmetric properties may provide increased depth of gate structures 240 for different types of nanostructure transistors (e.g., for p-type nanostructure transistors, for n-type nanostructure transistors) while reducing and/or minimizing footing of the cladding sidewalls 510 (and thus, reducing and/or minimizing footing of the gate structures 240 that are formed in the areas that are occupied by the cladding sidewalls 510 after removal of the cladding sidewalls 510) on the STI region 215 under hybrid fin structures of the nanostructure transistors of the semiconductor device 200. The reduced and/or minimized footing further reduces a likelihood of electrical shorting and/or current leakage.

FIG. 5C illustrates a perspective view of the semiconductor device 200 and a cross-sectional view along the line A-A. As shown in FIG. 5C, the hard mask layer (including the oxide layer 330 and the nitride layer 335) and the capping layer 325 are removed to expose the hard mask layer 320. In some implementations, the capping layer 325, the oxide layer 330, and the nitride layer 335 are removed using an etch operation (e.g., performed by the etch tool 108), a planarization technique (e.g., performed by the planarization tool 110), and/or another semiconductor processing technique.

As indicated above, FIGS. 5A-5C are provided as an example. Other examples may differ from what is described with regard to FIGS. 5A-5C. Example implementation 500 may include additional operations, fewer operations, different operations, and/or a different order of operations than those described in connection with FIGS. 5A-5C.

Figure 6A:
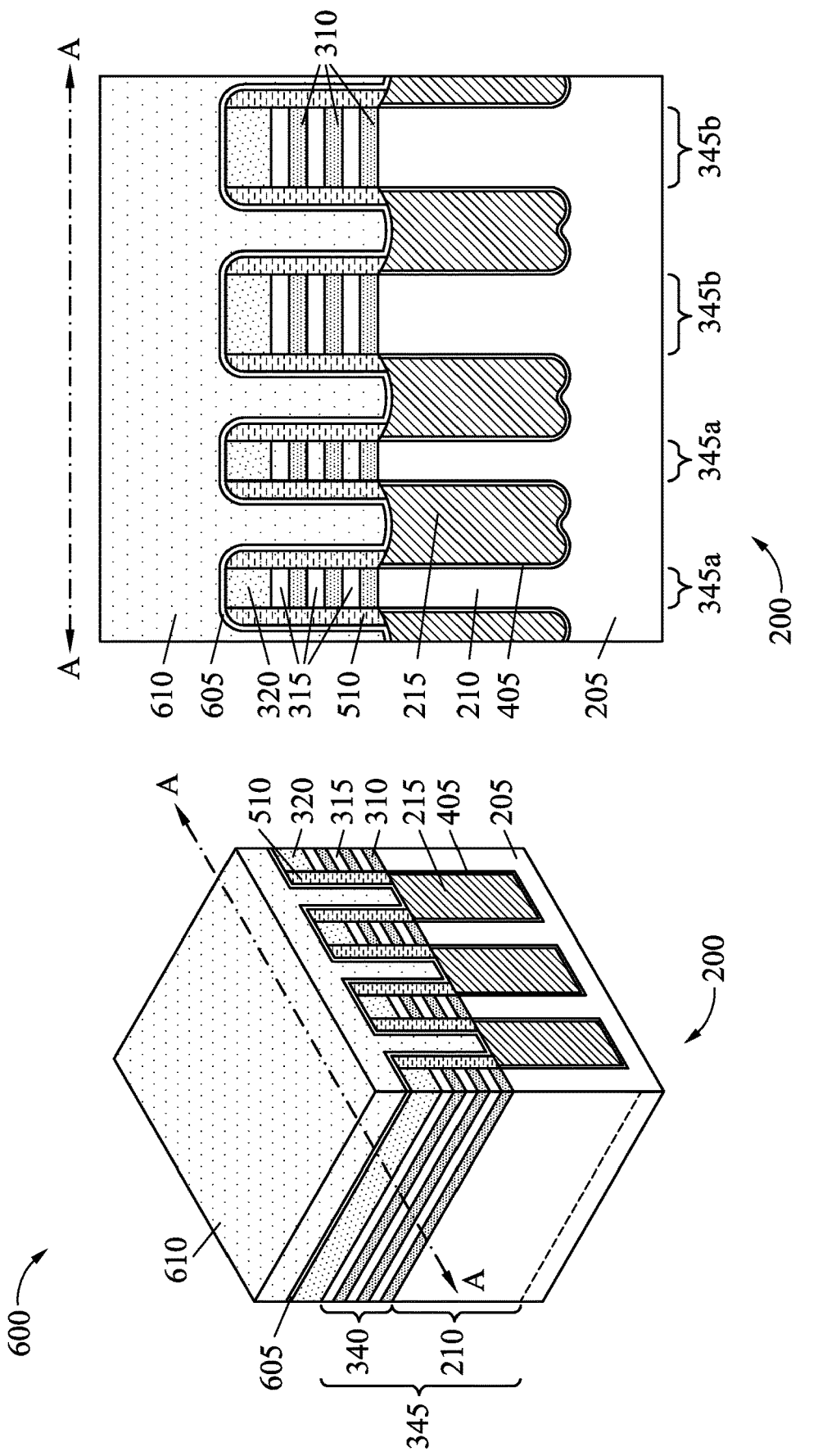
FIGS. 6A-6C are diagrams of an example implementation of a hybrid fin structure formation process described herein.
Figure 6B:
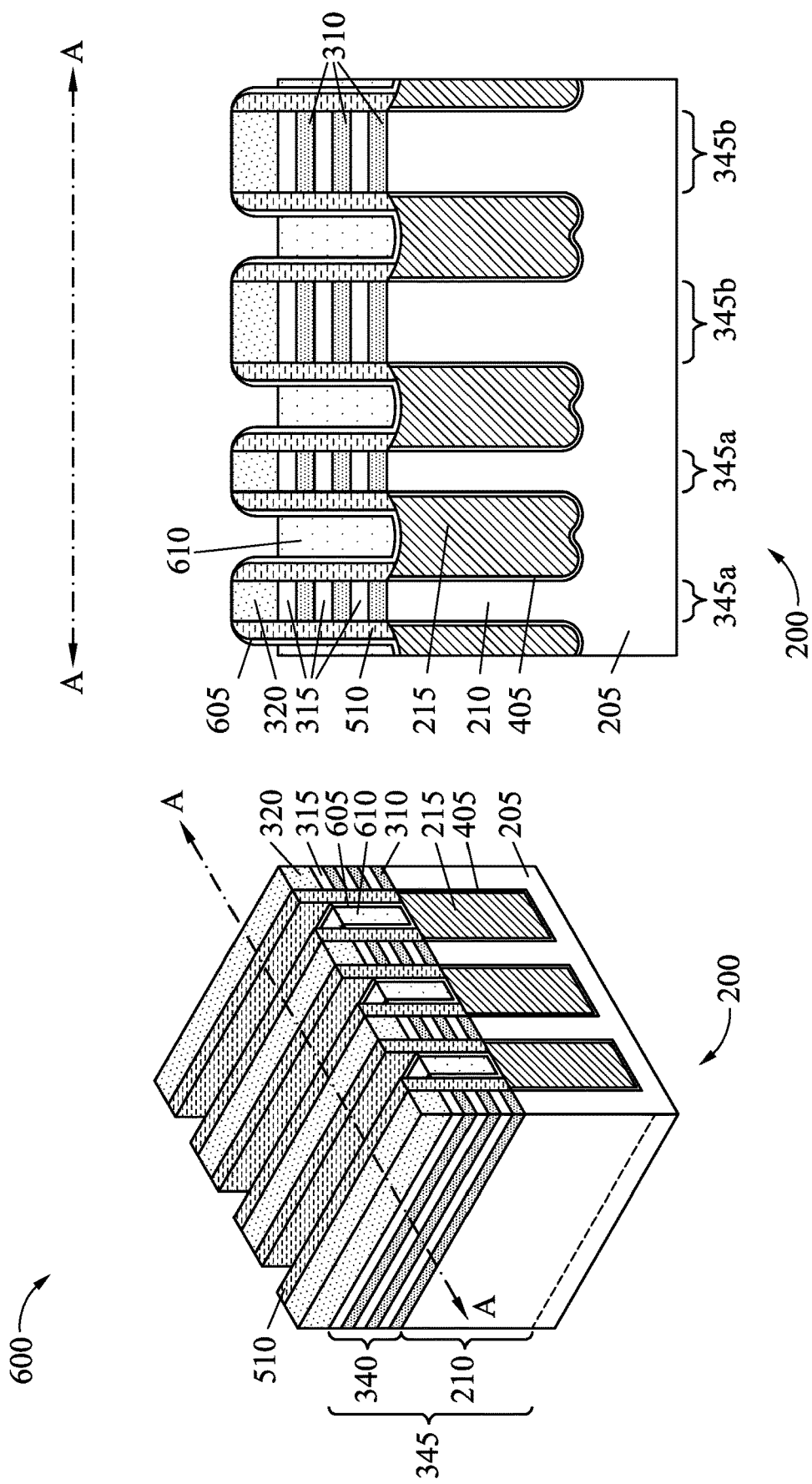
Figure 6C:
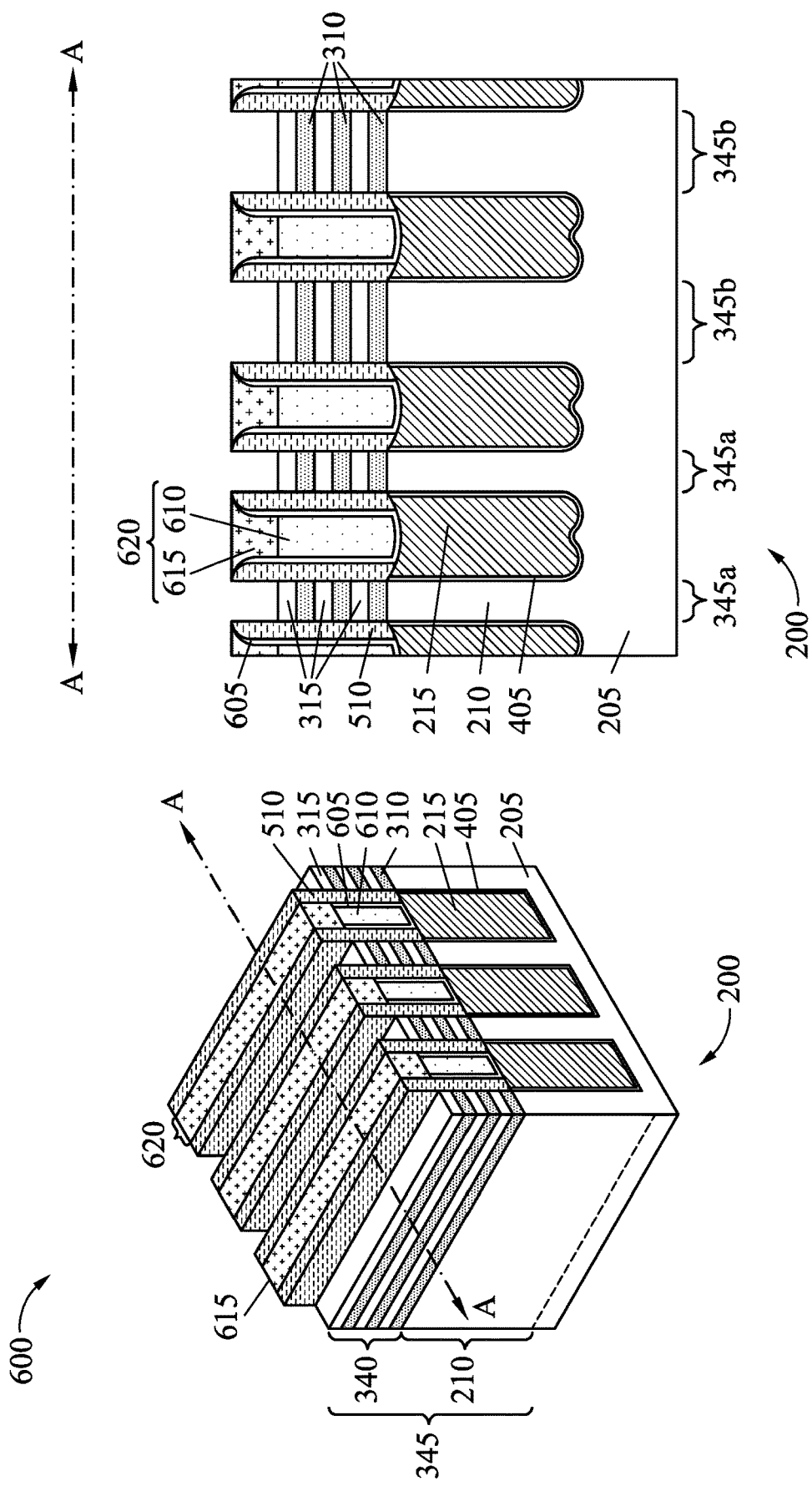

FIGS. 6A-6C are diagrams of an example implementation 600 of a hybrid fin structure process described herein. The example implementation 600 includes an example of forming hybrid fin structures between the fin structures 345 for the semiconductor device 200 or a portion thereof. The semiconductor device 200 may include one or more additional devices, structures, and/or layers not shown in FIGS. 6A-6C. The semiconductor device 200 may include additional layers and/or dies formed on layers above and/or below the portion of the semiconductor device 200 shown in FIGS. 6A-6C. Additionally, or alternatively, one or more additional semiconductor structures and/or semiconductor devices may be formed in a same layer of an electronic device that includes the semiconductor device 200. In some implementations, the operations described in connection with the example implementation 600 are performed after the processes described in connection with FIGS. 3A-5C.

FIG. 6A illustrates a perspective view of the semiconductor device 200 and a cross-sectional view along the line A-A. As shown in FIG. 6A, a liner 605 and a dielectric layer 610 are formed over the STI regions 215 interposing (e.g., in between) the fin structures 345, and over the fin structures 345. The deposition tool 102 may deposit the liner 605 and the dielectric layer 610. The deposition tool 102 may deposit the liner 605 using a conformal deposition technique. The deposition tool 102 may deposit the dielectric layer 610 using a CVD technique (e.g., a flowable CVD (FCVD) technique or another CVD technique), a PVD technique, an ALD technique, and/or another deposition technique. In some implementations, after deposition of the dielectric layer 610, the semiconductor device 200 is annealed, for example, to increase the quality of the dielectric layer 610.

The deposition tool 102 may form the dielectric layer 610 such that a height of a top surface of the dielectric layer 610 and a height of a top surface of the hard mask layer 320 are approximately a same height. Alternatively, the deposition tool 102 may form the dielectric layer 610 such that the height of the top surface of the dielectric layer 610 is greater relative to the height of the top surface of the hard mask layer 320, as shown in the example in FIG. 6A. In this way, the trenches between the fin structures 345 are overfilled with the dielectric layer 610 to ensure the trenches are fully filled with the dielectric layer 610. Subsequently, the planarization tool 110 may perform a planarization or polishing operation (e.g., a CMP operation) to planarize the dielectric layer 610.

The liner 605 and the dielectric layer 610 each includes a dielectric material such as a silicon oxide ($SiO_x$), a silicon nitride ($Si_xN_y$), a silicon oxynitride (SiON), a silicon carbon nitride (SiCN), fluoride-doped silicate glass (FSG), a low-k dielectric material, and/or another suitable insulating material. In some implementations, the dielectric layer 610 may include a multi-layer structure, for example, having one or more liner layers.

FIG. 6B illustrates a perspective view of the semiconductor device 200 and a cross-sectional view along the line A-A. As shown in FIG. 6B, an etch back operation is performed to remove portions of the dielectric layer 610. The etch tool 108 may etch the dielectric layer 610 in the etch back operation to reduce a height of a top surface of the dielectric layer 610. In particular, the etch tool 108 etches the dielectric layer 610 such that the height of portions of the dielectric layer 610 between the fin structures 345 is less than the height of the top surface of the hard mask layer 320. In some implementations, the etch tool 108 etches the dielectric layer 610 such that the height of portions of the dielectric layer 610 between the fin structures 345 is approximately equal to a height of top surfaces of the top-most of the second layers 315 of the portions 340.

FIG. 6C illustrates a perspective view of the semiconductor device 200 and a cross-sectional view along the line A-A. As shown in FIG. 6C, a high dielectric constant (high-k) layer 615 is deposited over the portions of the dielectric layer 610 between the fin structures 345. The deposition tool 102 may deposit a high-k material such as a hafnium oxide (HfO$_x$) and/or another high-k dielectric material to form the high-k layer 615 using a CVD technique, a PVD technique, an ALD technique, and/or another deposition technique. The combination of the portions of the dielectric layer 610 between the fin structures 345 and the high-k layer 615 between the fin structures 345 is referred to as a hybrid fin structure 620 (or dummy fin structure). In some implementations, the planarization tool 110 may perform a planarization operation to planarize the high-k layer 615 such that a height of a top surface of the high-k layer 615 and the height of the hard mask layer 320 are approximately equal.

Subsequently, and as shown in FIG. 6C, the hard mask layer 320 is removed. Removal of the hard mask layer 320 may include using an etch technique (e.g., a plasma etch technique, a wet chemical etch technique, and/or another type of etch technique) or another removal technique.

As indicated above, FIGS. 6A-6C are provided as an example. Other examples may differ from what is described with regard to FIGS. 6A-6C. Example implementation 600 may include additional operations, fewer operations, different operations, and/or a different order of operations than those described in connection with FIGS. 6A-6C.

Figure 7A:
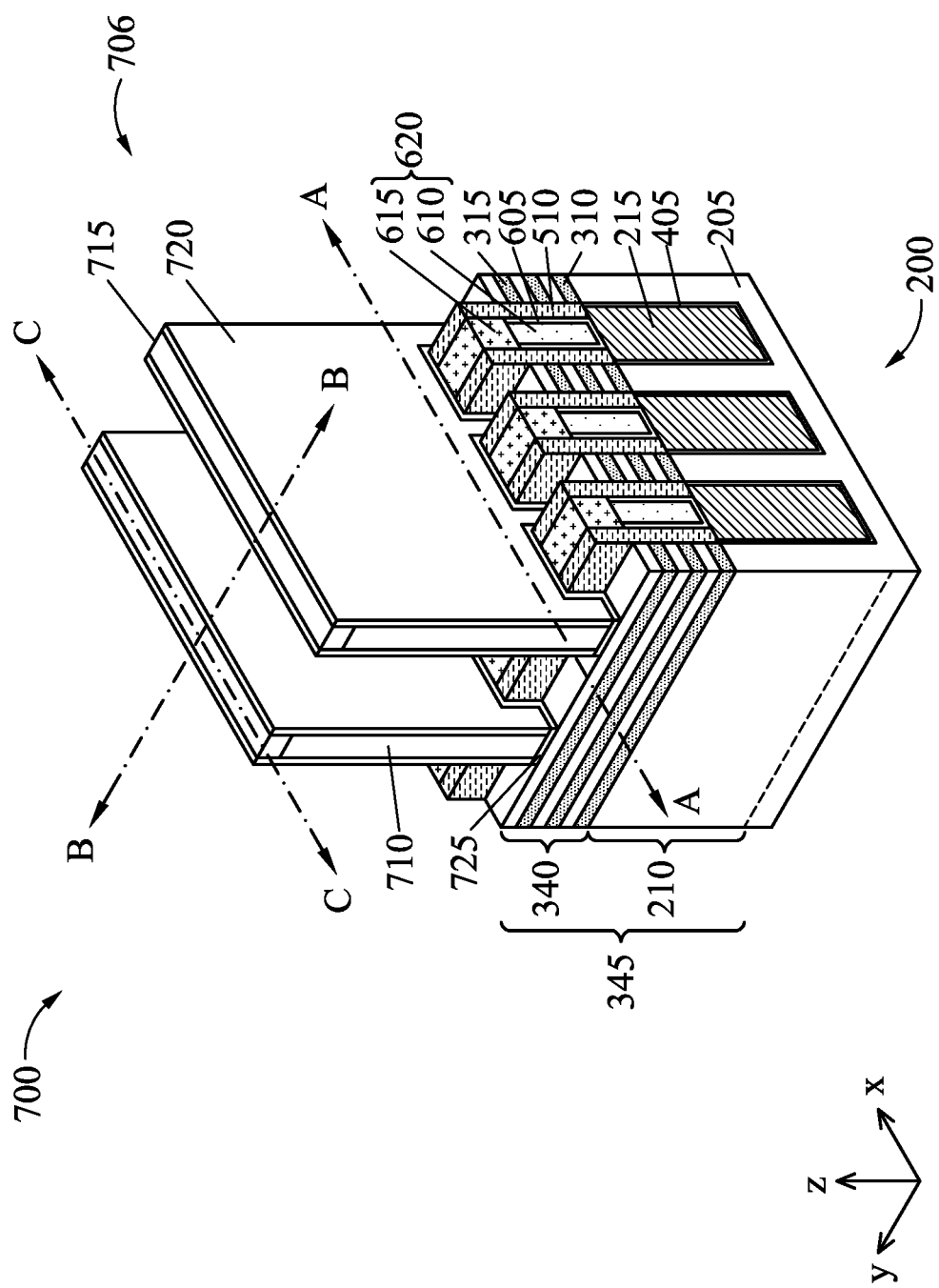
FIGS. 7A and 7B are diagrams of an example dummy gate structure formation process described herein.
Figure 7B:
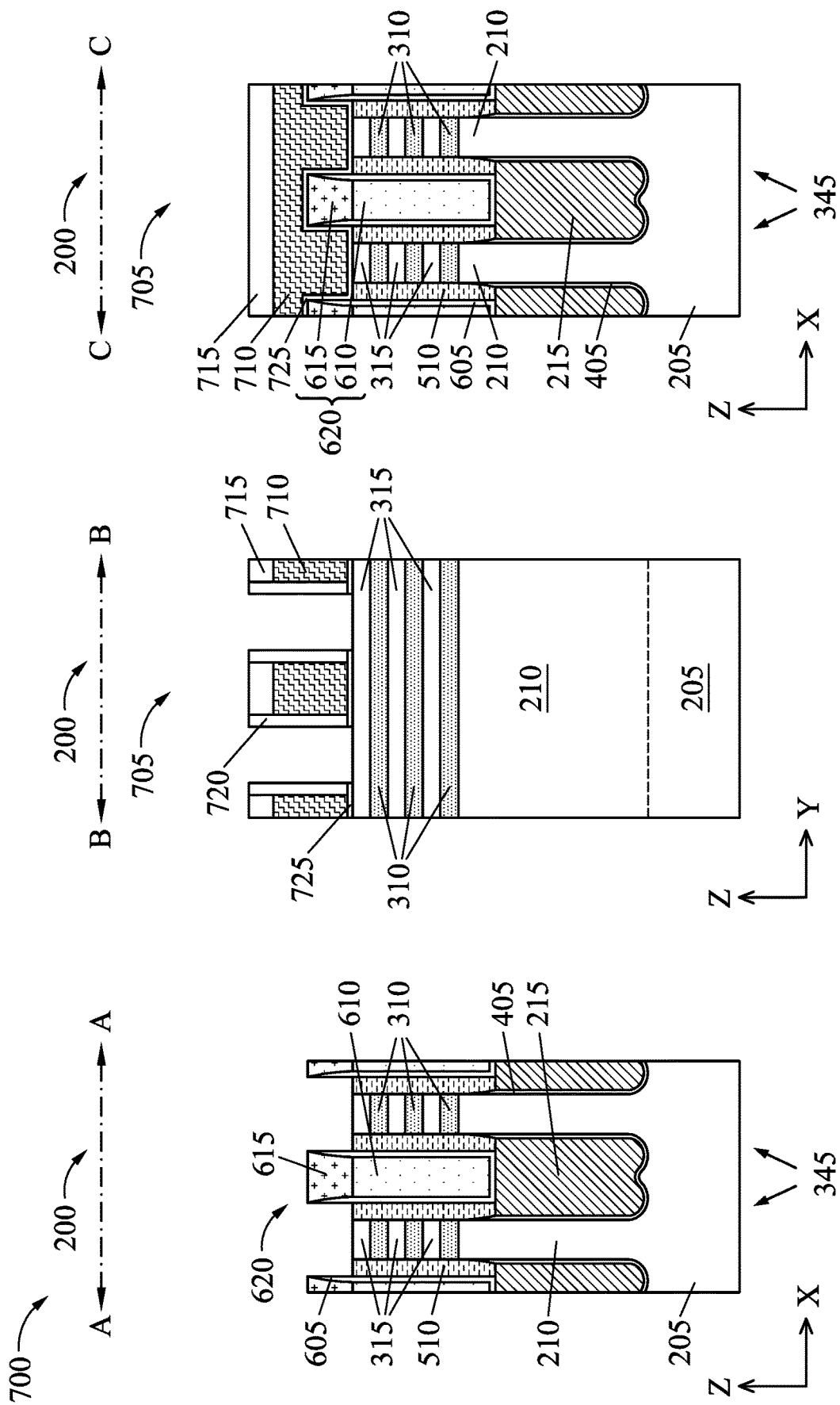

FIGS. 7A and 7B are diagrams of an example implementation 700 of a dummy gate formation process described herein. The example implementation 700 includes an example of forming dummy gate structures for the semiconductor device 200 or a portion thereof. The semiconductor device 200 may include one or more additional devices, structures, and/or layers not shown in FIGS. 7A and 7B. The semiconductor device 200 may include additional layers and/or dies formed on layers above and/or below the portion of the semiconductor device 200 shown in FIGS. 7A and 7B. Additionally, or alternatively, one or more additional semiconductor structures and/or semiconductor devices may be formed in a same layer of an electronic device that includes the semiconductor device 200. In some implementations, the operations described in connection with the example implementation 700 are performed after the processes described in connection with FIGS. 3A-6C.

FIG. 7A illustrates a perspective view of the semiconductor device 200. As shown in FIG. 7A, dummy gate structures 705 (also referred to as dummy gate stacks or temporary gate structures) are formed over the fin structures 345 and over the hybrid fin structures 620. The dummy gate structures 705 are sacrificial structures that are to be replaced by replacement gate structures or replacement gate stacks (e.g., the gate structures 240) at a subsequent processing stage for the semiconductor device 200. Portions of the fin structures 345 underlying the dummy gate structures 705 may be referred to as channel regions. The dummy gate structures 705 may also define source/drain (S/D) regions of the fin structures 345, such as the regions of the fin structures 345 adjacent and on opposing sides of the channel regions.

A dummy gate structure 705 may include a gate electrode layer 710, a hard mask layer 715 over and/or on the gate electrode layer 710, and spacer layers 720 on opposing sides of the gate electrode layer 710 and on opposing sides of the hard mask layer 715. The dummy gate structures 705 may be formed on a gate dielectric layer 725 between the top-most second layer 315 and the dummy gate structures 705, and between the hybrid fin structures 620 and the dummy gate structures 705. The gate electrode layer 710 includes polycrystalline silicon (polysilicon or PO) or another material. The hard mask layer 715 includes one or more layers such as an oxide layer (e.g., a pad oxide layer that may include silicon dioxide (SiO$_2$) or another material) and a nitride layer (e.g., a pad nitride layer that may include a silicon nitride such as Si$_3$N$_4$ or another material) formed over the oxide layer. The spacer layers 720 include a silicon oxycarbide (SiOC), a nitrogen free SiOC, or another suitable material. The gate dielectric layer 725 may include a silicon oxide (e.g., SiO$_x$ such as SiO$_2$), a silicon nitride (e.g., Si$_x$N$_y$ such as Si$_3$N$_4$), a high-K dielectric material and/or another suitable material.

The layers of the dummy gate structures 705 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 725 is conformally deposited on the semiconductor device 200 and then selectively removed from portions of the semiconductor device 200 (e.g., the source/drain areas). The gate electrode layer 710 is then deposited onto the remaining portions of the gate dielectric layer 725. The hard mask layers 715 are then deposited onto the gate electrode layers 710. The spacer layers 720 may be conformally deposited in a similar manner as the gate dielectric layer 725 and etched back such that the spacer layers 720 remain on the sidewalls of the dummy gate structures 705. In some implementations, the spacer layers 720 include a plurality of types of spacer layers. For example, the spacer layers 720 may include a seal spacer layer that is formed on the sidewalls of the dummy gate structures 705 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer. In some implementations, the gate dielectric layer 725 is omitted from the dummy gate structure formation process and is instead formed in the replacement gate process.

FIG. 7A further illustrates reference cross-sections that are used in subsequent figures described herein. Cross-section A-A is in an x-z plane (referred to as a y-cut) across the fin structures 345 and the hybrid fin structures 620 in source/drain areas of the semiconductor device 200. Cross-section B-B is in a y-z plane (referred to as an x-cut) perpendicular to the cross-section A-A, and is across the dummy gate structures 705 in the source/drain areas of the semiconductor device 200. Cross-section C-C is in the x-z plane parallel to the cross-section A-A and perpendicular to the cross-section B-B, and is along a dummy gate structures 705. Subsequent figures refer to these reference cross-sections for clarity. In some figures, some reference numbers of components or features illustrated therein may be omitted to avoid obscuring other components or features for ease of depicting the figures.

FIG. 7B includes cross-sectional views along the cross-sectional planes A-A, B-B, and C-C of FIG. 7A. As shown in the cross-sectional planes B-B and C-C in FIG. 7B, the dummy gate structures 705 are formed above the fin structures 345. As shown in the cross-sectional plane C-C in FIG. 7B, portions of the gate dielectric layer 725 and portions of the gate electrode layers 710 are formed in recesses above the fin structures 345 that are formed as a result of the removal of the hard mask layer 320.

As indicated above, FIGS. 7A and 7B are provided as an example. Other examples may differ from what is described with regard to FIGS. 7A and 7B. Example implementation 700 may include additional operations, fewer operations, different operations, and/or a different order of operations than those described in connection with FIGS. 7A and 7B.

FIGS. 8A-8D are diagrams of an example implementation 800 of a source/drain recess formation process and an inner spacer formation process described herein. The example implementation 800 includes an example of forming source/drain recesses and the inner spacers 245 for the semiconductor device 200. FIGS. 8A-8D are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 800 are performed after the processes described in connection with FIGS. 3A-7B.

Figure 8A:
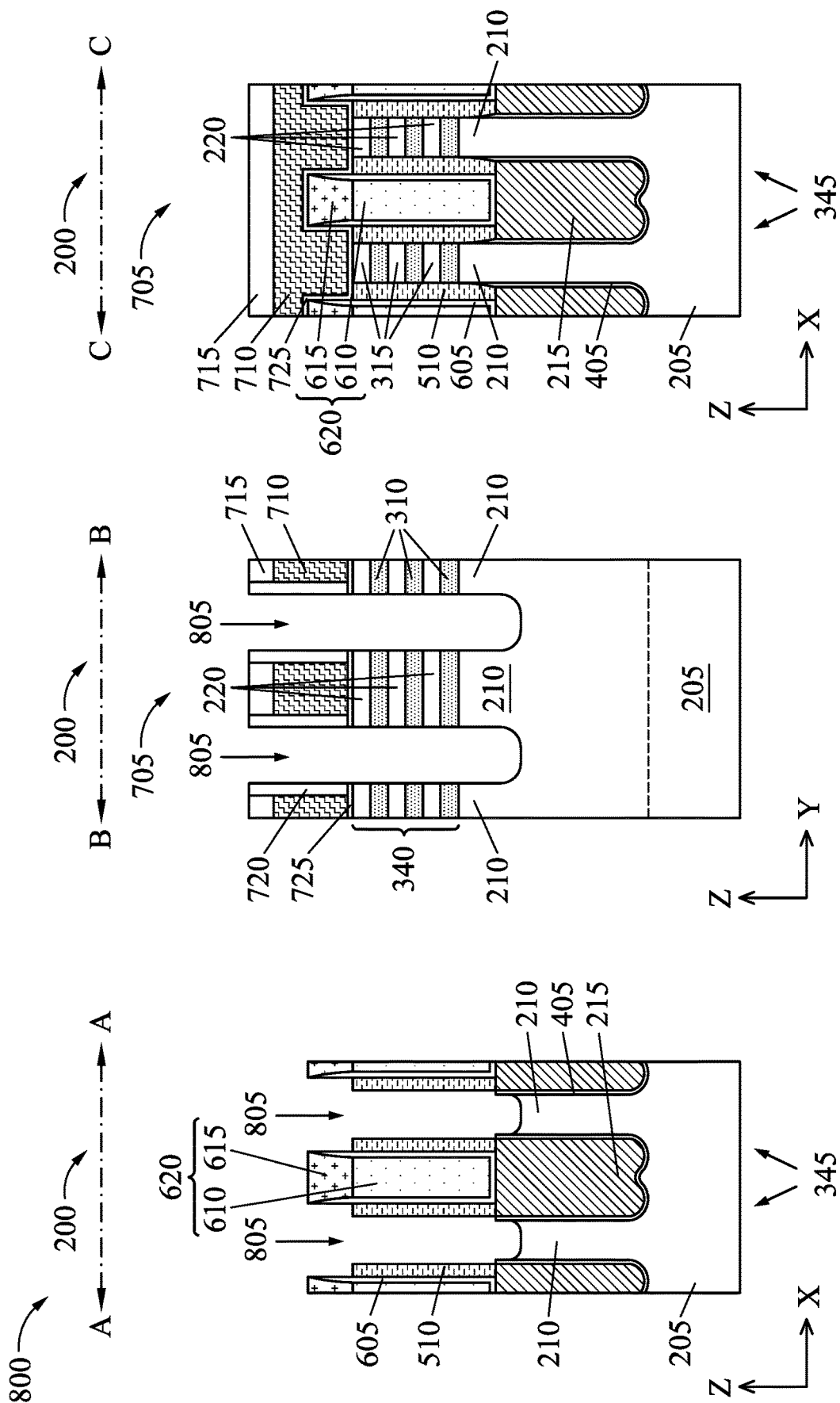
FIGS. 8A-8D are diagrams of example implementations of a source/drain recess formation process and an inner spacer formation process described herein.

As shown in the cross-sectional plane A-A and cross-sectional plane B-B in FIG. 8A, source/drain recesses 805 are formed in the portions 340 of the fin structure 345 in an etch operation. The source/drain recesses 805 are formed to provide spaces in which source/drain regions 225 are to be formed on opposing sides of the dummy gate structures 705. The etch operation may be performed by the etch tool 108 and may be referred to a strained source/drain (SSD) etch operation. In some implementations, the etch operation includes a plasma etch technique, a wet chemical etch technique, and/or another type of etch technique.

The source/drain recesses 805 also extend into a portion of the mesa regions 210 of the fin structure 345. This results in the formation of a plurality of mesa regions 210 in each fin structure 345, where sidewalls of the portions of each source/drain recess 805 below the portions 340 correspond to sidewalls of mesa regions 210. The source/drain recesses 805 may penetrate into a well portion (e.g., a p-well, an n-well) of the fin structure 345. In implementations in which the semiconductor substrate 205 includes a silicon (Si) material having a (100) orientation, (111) faces are formed at bottoms of the source/drain recesses 805, resulting in formation of a V-shape or a triangular shape cross section at the bottoms of the source/drain recesses 805. In some implementations, a wet etching using tetramethylammonium hydroxide (TMAH) and/or a chemical dry etching using hydrochloric acid (HCl) are employed to form the V-shape profile. However, the cross section at the bottoms of the source/drain recesses 805 may include other shapes, such as round or semi-circular, among other examples.

As shown in the cross-sectional plane B-B and the cross-sectional plane C-C in FIG. 8A, portions of the first layers 310 and portions of the second layers 315 of the layer stack 305 remain under the dummy gate structures 705 after the etch operation to form the source/drain recesses 805. The portions of the second layers 315 under the dummy gate structures 705 form the nanostructure channels 220 of the nanostructure transistors of the semiconductor device 200. The nanostructure channels 220 extend between adjacent source/drain recesses 805 and between adjacent hybrid fin structures 620.

Figure 8B:
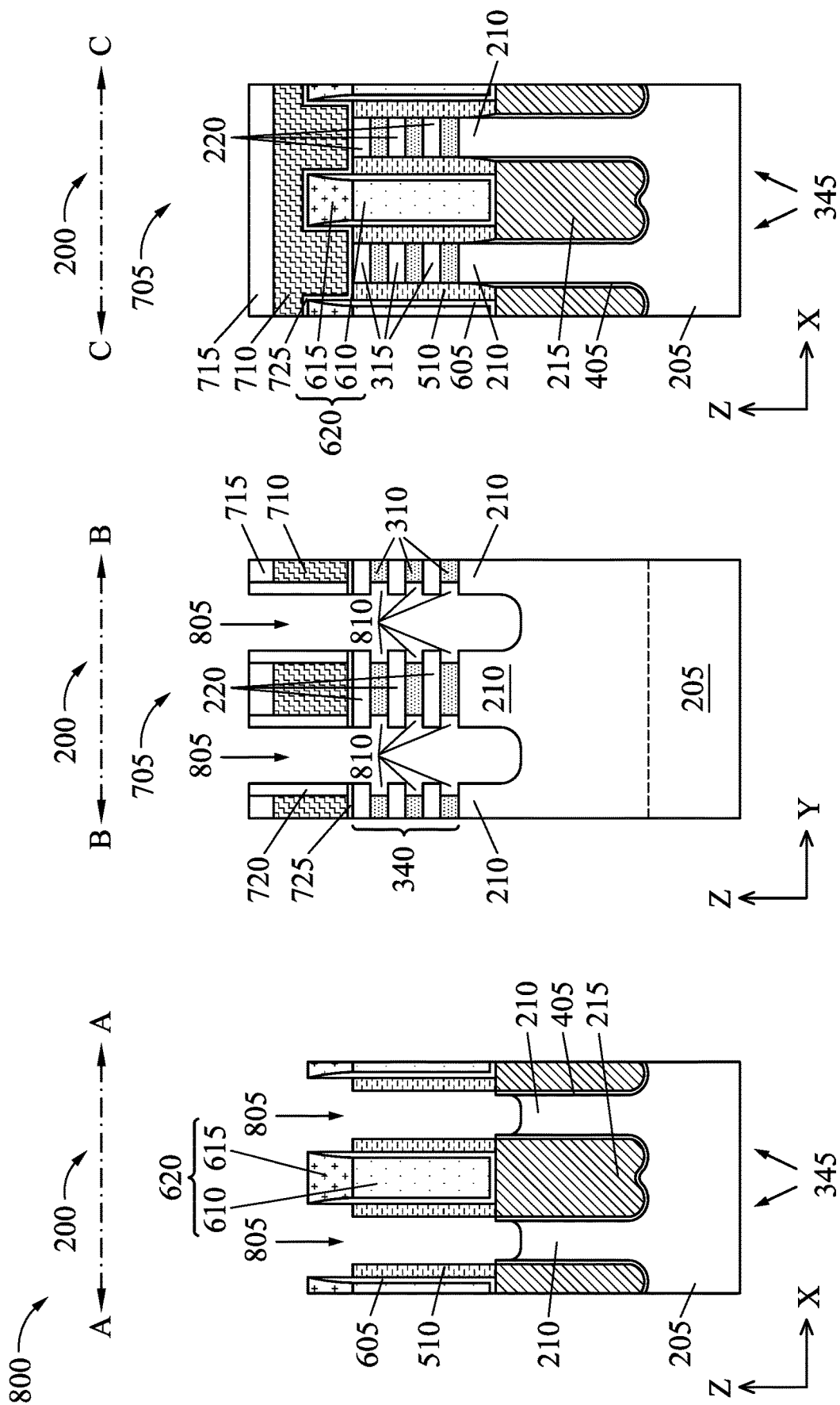

As shown in the cross-sectional plane B-B in FIG. 8B, the first layers 310 are laterally etched (e.g., in a direction that is approximately parallel to a length of the first layers 310) in an etch operation, thereby forming cavities 810 between portions of the nanostructure channels 220. In particular, the etch tool 108 laterally etches ends of the first layers 310 under the dummy gate structures 705 through the source/drain recesses 805 to form the cavities 810 between ends of the nanostructure channels 220. In implementations where the first layers 310 are silicon germanium (SiGe) and the second layers 315 are silicon (Si), the etch tool 108 may selectively etch the first layers 310 using a wet etchant such as, a mixed solution including hydrogen peroxide ($H_2O_2$), acetic acid ($CH_3COOH$), and/or hydrogen fluoride (HF), followed by cleaning with water ($H_2O$). The mixed solution and the water may be provided into the source/drain recesses 805 to etch the first layers 310 from the source/drain recesses 805. In some embodiments, the etching by the mixed solution and cleaning by water is repeated approximately 10 to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure.

The cavities 810 may be formed to an approximately curved shape, an approximately triangular shape, an approximately square shape, or to another shape. In some implementations, the depth of one or more of the cavities 810 (e.g., the dimension of the cavities extending into the first layers 310 from the source/drain recesses 805) is in a range of approximately 0.5 nanometers to about 5 nanometers. In some implementations, the depth of one or more of the cavities 810 is in a range of approximately 1 nanometer to approximately 3 nanometers. However, other values for the depth of the cavities 810 are within the scope of the present disclosure. In some implementations, the etch tool 108 forms the cavities 810 to a length (e.g., the dimension of the cavities extending from a nanostructure channel 220 below a first layer 310 to another nanostructure channel 220 above the first layer 310) such that the cavities 810 partially extend into the sides of the nanostructure channels 220 (e.g., such that the width or length of the cavities 810 are greater than the thickness of the first layers 310). In this way, the inner spacers that are to be formed in the cavities 810 may extend into a portion of the ends of the nanostructure channels 220. In some implementations, forming the cavities 810 results in thinning of the cladding sidewalls 510 in the source/drain recesses 805.

Figure 8C:
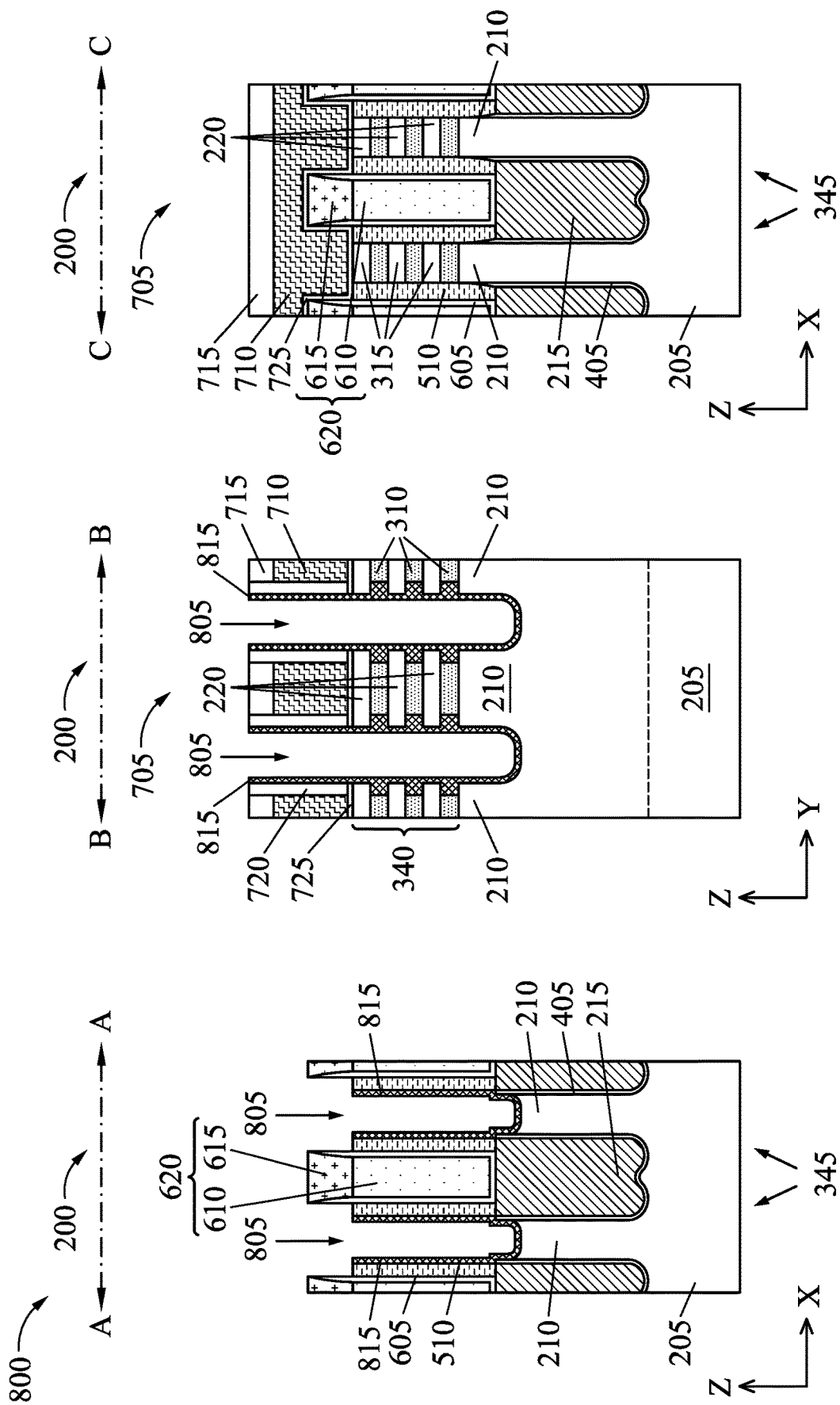

As shown in the cross-sectional plane A-A and in the cross-sectional plane B-B in FIG. 8C, an insulating layer 815 is conformally deposited along the bottom and along the sidewalls of the source/drain recesses 805. The insulating layer 815 further extends along the spacer layer 720. The deposition tool 102 may deposit the insulating layer 815 using a CVD technique, a PVD technique, and ALD technique, and/or another deposition technique. The insulating layer 815 includes a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material. The insulating layer 815 may include a material that is different from the material of spacer layers 720.

The deposition tool 102 forms the insulating layer 815 to a thickness sufficient to fill in the cavities 810 between the nanostructure channels 220 with the insulating layer 815. For example, the insulating layer 815 may be formed to a thickness in a range of approximately 1 nanometer to approximately 10 nanometers. As another example, the insulating layer 815 is formed to a thickness in a range of approximately 2 nanometers to approximately 5 nanometers. However, other values for the thickness of the insulating layer 815 are within the scope of the present disclosure.

Figure 8D:
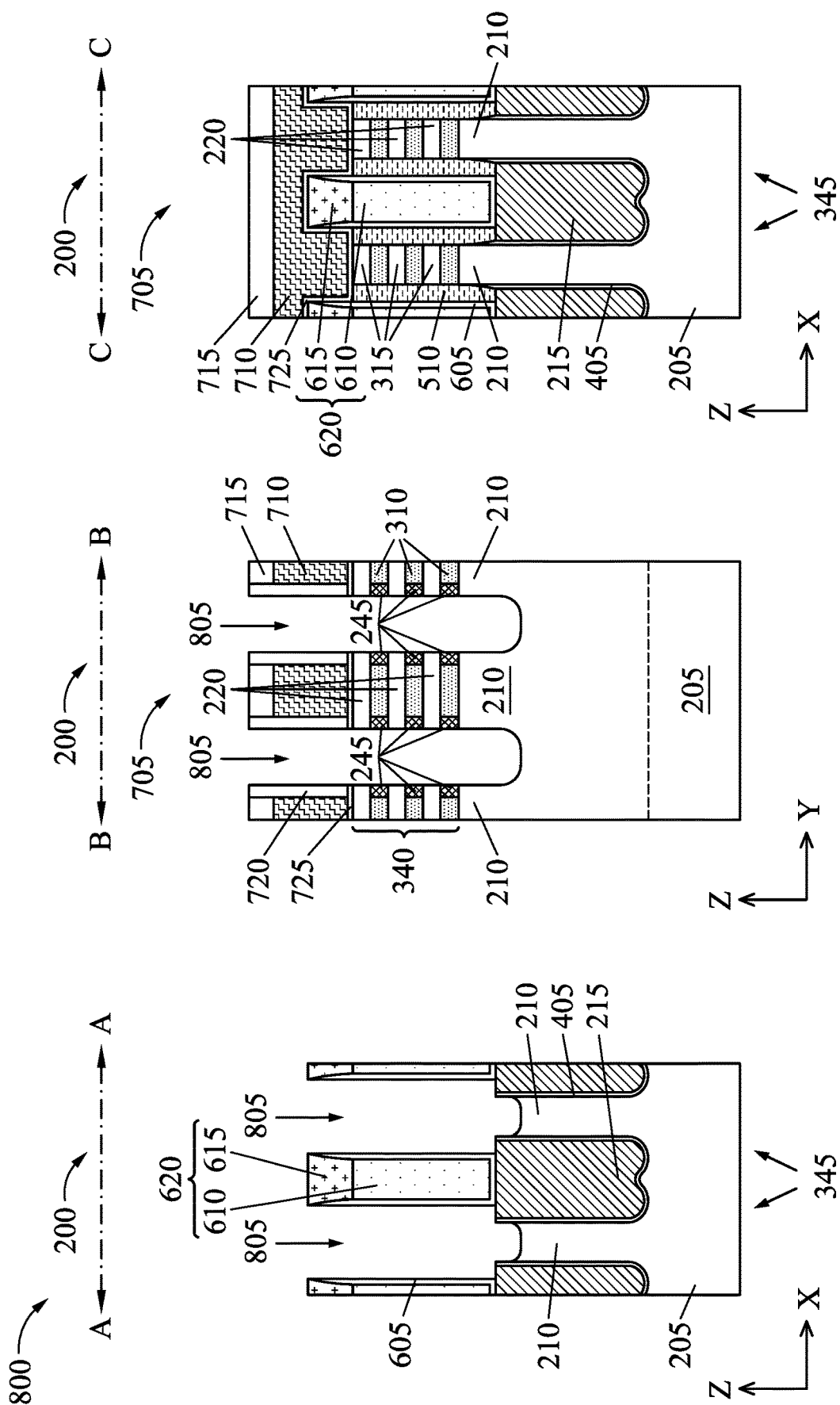

As shown in the cross-sectional plane A-A and in the cross sectional plane B-B in FIG. 8D, the insulating layer 815 is partially removed such that remaining portions of the insulating layer 815 correspond to the inner spacers 245 in the cavities 810. The etch tool 108 may perform an etch operation to partially remove the insulating layer 815. As further shown in the cross-sectional plane A-A in FIG. 8D, the cladding sidewalls 510 may also be removed from the source/drain recesses 805 in the etch operation to partially remove the insulating layer 815.

In some implementations, the etch operation may result in the surfaces of the inner spacers 245 facing the source/drain recesses 805 being curved or recessed. The depth of the recesses in the inner spacers 245 may be in a range of approximately 0.2 nanometers to approximately 3 nanometers. As another example, the depth of the recesses in the inner spacers 245 may be in a range of approximately 0.5 nanometers to approximately 2 nanometers. As another example, the depth of the recesses in the inner spacers 245 may be in a range of less than approximately 0.5 nanometers. In some implementations, the surfaces of the inner spacers 245 facing the source/drain recesses 805 are approximately flat such that the surfaces of the inner spacers 245 and the surfaces of the ends of the nanostructure channels 220 are approximately even and flush.

As indicated above, FIGS. 8A-8D are provided as examples. Other examples may differ from what is described with regard to FIGS. 8A-8D. Example implementation 800 may include additional operations, fewer operations, different operations, and/or a different order of operations than those described in connection with FIGS. 8A-8D.

FIGS. 9A-9F are diagrams of an example implementation of a source/drain region formation process described herein. The example implementation includes an example of trimming the nanostructure channels 220 (e.g., forming recesses in the second layers 315). The example implementation 900 further includes an example of forming the source/drain regions 225 in the source/drain recesses 805 for the semiconductor device 200 after trimming the nanostructure channels 220. FIGS. 9A-9F are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 900 are performed after the processes described in connection with FIGS. 3A-8D.

Figure 9A:
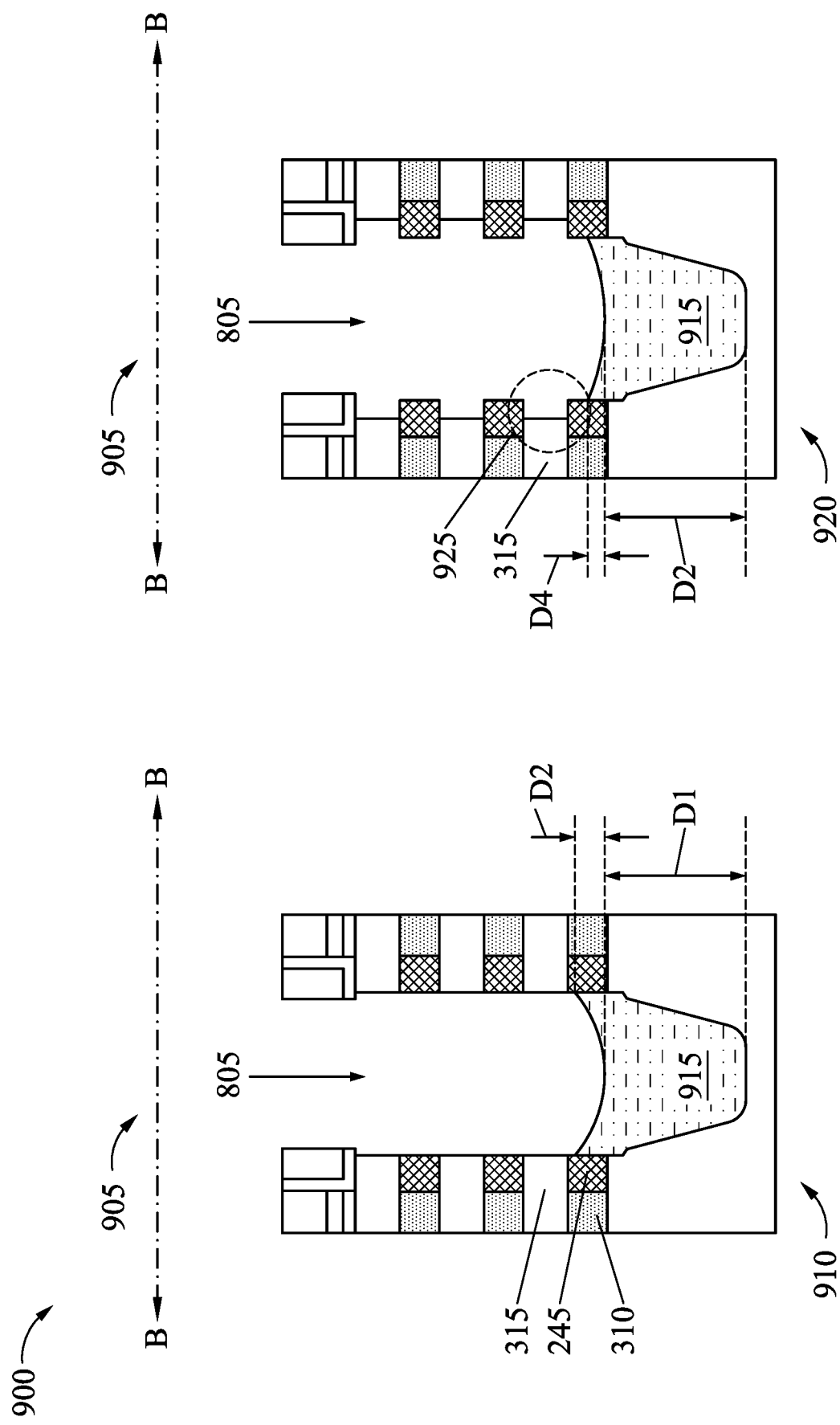
FIGS. 9A-9F are diagrams of an example implementation of a source/drain region formation process described herein.

FIG. 9A shows cross-sectional views B-B of an example portion of a region 905 of the semiconductor device 250 including the source/drain recesses 805 (e.g., recesses for formation of the source/drain regions 225). The left example 910 of FIG. 9A shows the portion of the region 905 after deposition of an epitaxial layer 915 within the source/drain recess 805. In some implementations, the epitaxial layer 915 (e.g., an "L0" layer) corresponds to the buffer region 230.

The deposition tool 102 deposits the epitaxial layer 915 to include one or more dimensional properties. As an example, and after deposition, a thickness D1 of the epitaxial layer 915 may be included in a range of approximately 10 nanometers to approximately 50 nanometers. Additionally, or alternatively, a height D2 (e.g., a "raise height") of the epitaxial layer 915 above a bottom surface of a bottom-most layer of the first layers 310 may be included in a range of approximately 3 nanometers to approximately 5 nanometers. However, other values and ranges for the thickness D1 and the height D2 are within the scope of the present disclosure.

The epitaxial layer 915 (e.g., the buffer region 230) may include different materials. For example, the epitaxial layer 915 may include a silicon (Si) material. Additionally, or alternatively, the epitaxial layer 915 may include a silicon germanium (e.g., SiGe) material. In a case where the epitaxial layer 915 includes the silicon germanium material, a content of the germanium in the epitaxial layer 915 may be included in a range of approximately 5% to approximately 20%. However, other materials, and/or other values and ranges for the content of the germanium in the epitaxial layer 915, are within the scope of the present disclosure.

The right example 920 of FIG. 9A shows the portion of the region 905 after an etching operation. As an example, the etch tool 108 may perform the etching operation to remove (e.g., trim) a portion of the epitaxial layer 915. The etching operation may change one or more dimensional properties of the epitaxial layer 915. For example, and as a result of the etching operation, a thickness D3 of the epitaxial layer 915 may be reduced (e.g., reduced relative to D1) to be included in a range of approximately 8 nanometers to approximately 40 nanometers. If the thickness D3 (post-etching) is less than approximately 8 nanometers, a sizing of the epitaxial layer 915 (e.g., the buffer region 230) may be inadequate to prevent leakage in the nanostructure transistor. If the thickness is greater than approximately 40 nanometers, a volume of subsequently formed epitaxial layers within the source/drain recess 805 may be reduced to increase a parasitic resistance within the nanostructure transistor. However, other values and ranges for the thickness D3 of the epitaxial layer 915 (post-etching) are within the scope of the present disclosure.

Additionally, or alternatively, height D4 (e.g., the raise height after etching) of the epitaxial layer 915 may be reduced (e.g., reduced relative to D3) to be included in a range of approximately 1 nanometer to approximately 3 nanometers. However, other values and ranges for the height D4 of the epitaxial layer 915 (post-etching) are within the scope of the present disclosure.

As further shown in the right example 920 of FIG. 9A, the etching operation forms concave-shaped regions 925 in ends of the second layers 315 (e.g., in ends of the channel layers). The etch tool 108 may perform the etching operation using a recipe including a particular flow profile (e.g., cyclic flow profile) and/or concentration of etchants, among other examples. The recipe may be configured such that the etchants are in contact with surfaces at or near lower regions of the source/drain recess 805 for a longer time duration than surfaces at or near upper regions of the source/drain recess 805, which may result in a variation in dimensions (e.g., depths) of the concave-shaped regions 925 (e.g., a depth of a concave-shaped region near the top of the source/drain recess 805 may be lesser relative to a depth of another concave-shaped region near the bottom of the source/drain recess 805).

In some implementations, the concave-shaped regions 925 reduce a likelihood of non-merge issues of subsequently-formed epitaxial layers of the source/drain regions 225. For example, voids within the subsequently-formed epitaxial layers may be reduced or eliminated. Furthermore, the concave-shaped regions 925 may reduce a length of nanostructure channels to decrease a channel resistance ($R_{ch}$) of the nanostructure transistor. Additionally, or alternatively, a volume of the epitaxial materials within the source/drain regions 225 may be increased to decrease the parasitic resistance ($R_p$) of the nanostructure transistor.

In some implementations, and after the etching operation, a cleaning operation may be performed to remove residual etchants and/or etched materials. As an example, a cleaning tool may dispense a cleaning solution into the source/drain recess 805 to remove residual etchants, residual particulates etched from the epitaxial layer 915, and/or residual particulates etched from the ends of the second layers 315.

Figure 9B:
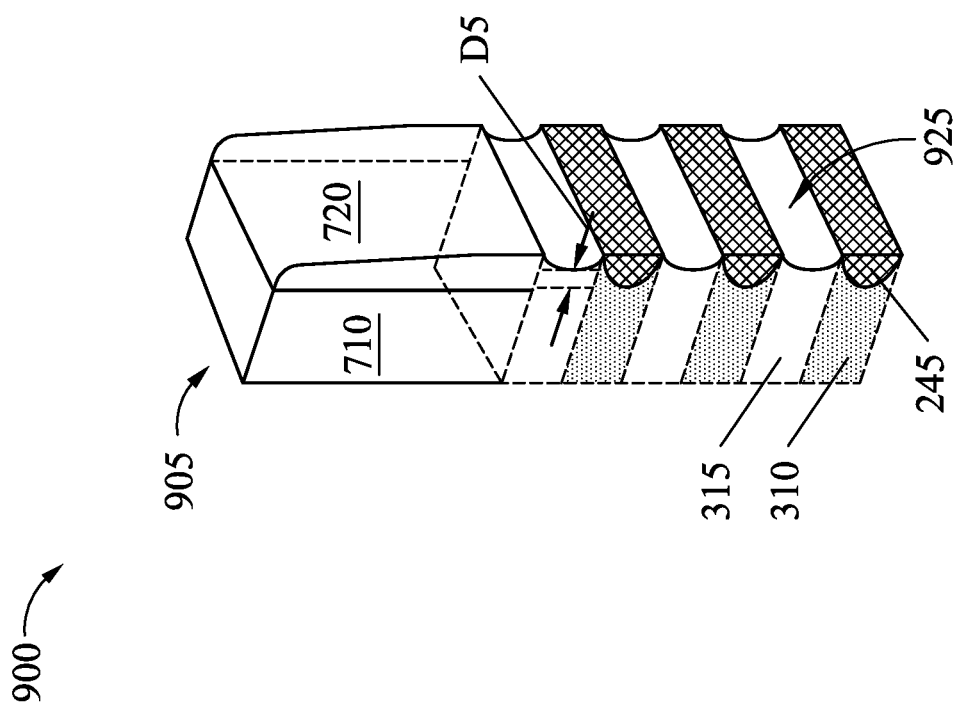

FIG. 9B shows an isometric view of an example portion of the region 905, including the gate electrode layer 710 and the spacer layers 720. As shown in FIG. 9B, the ends of the first layers 310 (e.g., the sacrificial layers) include the inner spacers 245, and the ends of the second layers 315 (e.g., the channel layers) include the concave-shaped regions 925. In some implementations, a distance D5 from an apex of the concave-shaped regions 925 to an edge of the gate electrode layer 710 may correspond to a proximity of the source/drain regions 225 (e.g., subsequently formed) to portions of the gate structures 240 (e.g., also subsequently formed). The proximity may relate to one or more performance characteristics of the nanostructure transistor including the concave-shaped regions 925 (e.g., channel resistances ($R_{ch}$) and/or short channel effects (SCE), among other examples). Reducing the distance D5 (e.g., the proximity) through use of the concave-shaped regions may improve such performance characteristics of the nanostructure transistor.

Figure 9C:
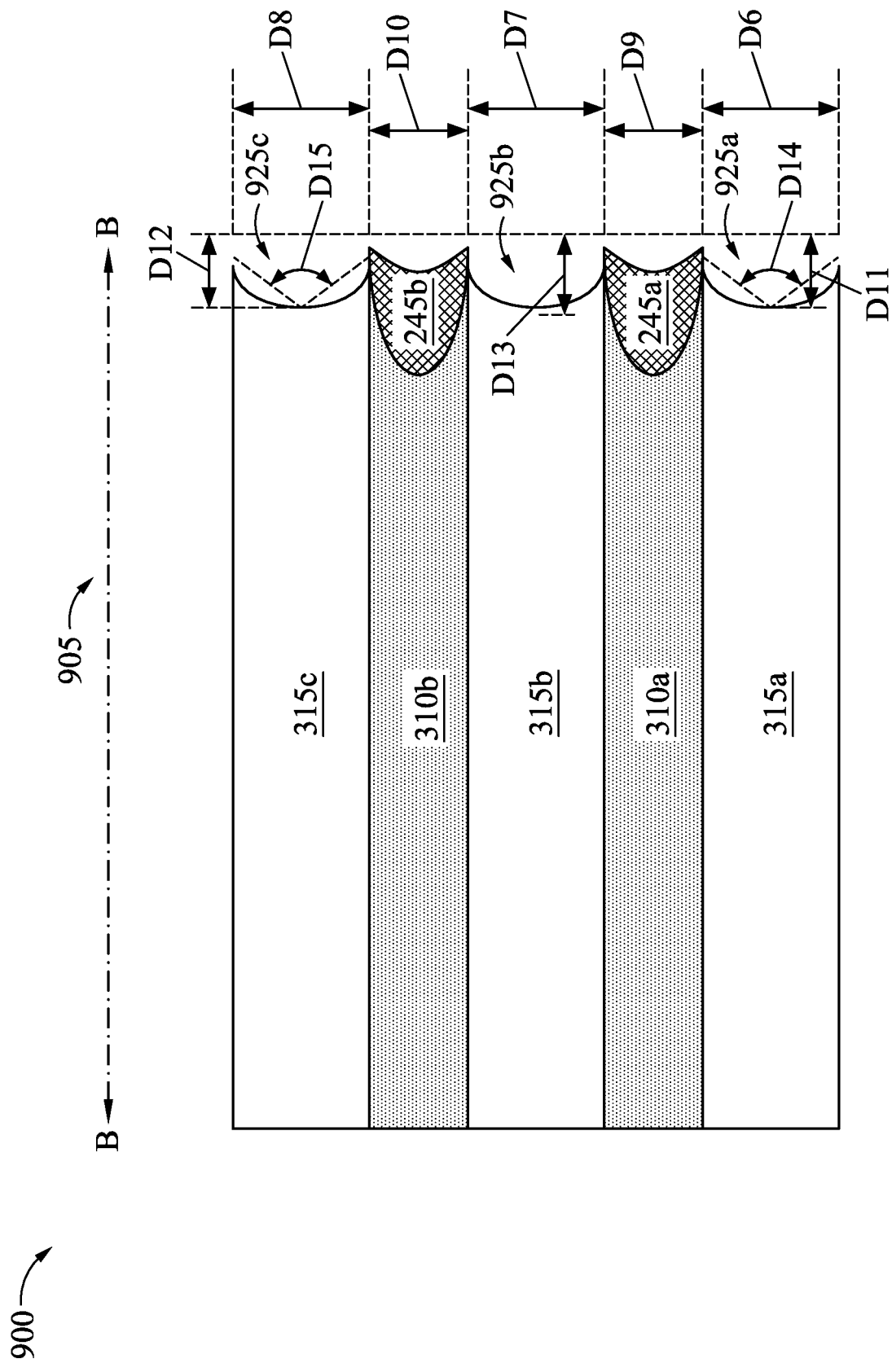

FIG. 9C shows a cross sectional view B-B of an example portion of the region 905. FIG. 9C includes the second layers 315*a*-315*c* alternating with the first layers 310*a* and 310*b*. FIG. 9C further includes the concave-shaped regions 925*a*-925*c*, and the inner spacers 245*a* and 245*b*. As shown in FIG. 9C, the portion of the region 905 may include one or more dimensional properties and/or dimensional relationships.

For example, thicknesses of the second layers 315*a*-315*c* may differ. For example, a thickness D6 of the second layer 315*a* may be lesser relative to a thickness D7 of the second layer 315*b*, where the difference is included in a range of approximately 0.2 nanometers to approximately 1.0 nanometer. Additionally, or alternatively, a thickness D7 of the second layer 315*b* may be lesser relative to a thickness D8 of the second layer 315*c*, where the difference is in a range of approximately 0.2 nanometers to approximately 1.5 nanometers. However, other values and ranges for differences in the thicknesses D6, D7, and D8 are within the scope of the present disclosure.

Additionally, or alternatively, a ratio of a thickness of the first layers 310*a* and 310*b* to the second layers 315*a*-315*c* may vary. For example, a ratio of a thickness D9 of the first layer 310*a* (and/or a thickness D10 of the first layer 310*b*) to a thickness D6 of the second layer 315*a* (and/or a thickness D7 of the second layer 315*b*, and/or a thickness of D8 of the second layer 315*c*) may be included in a range of approximately 1 to approximately 2. If the ratio is less than approximately 1, a charge collection for operation of the channels (e.g., channels formed from the second layers 315*a*-315*c*) within the nanostructure transistor may be reduced. If the ratio is greater than approximately 2, available area for gate formation (e.g., after removal of the first layers 310*a* and 310*b*) may be reduced to cause defects in formation of the gate structure. However, other values and ranges for ratios of the thicknesses D9, D10 to the thicknesses D6, D7, and D8 are within the scope of the present disclosure.

Additionally, or alternatively, depths of the concave-shaped regions 925*a*-925*c* may differ. For example, a depth D11 of the concave-shaped region 925*a* may be greater relative to a depth D12 of the concave-shaped region 925*c*, where the difference is included in a range of approximately 0.5 nanometers to approximately 1.5 nanometers (e.g., as shown in FIG. 9C, the concave-shaped region 925*a*, a first concave-shaped region, is below the concave-shaped region 925*c*, a second concave-shaped region). Additionally, or alternatively, a depth D13 of the concave-shaped region 925*b* may be greater relative to the depth D12 of the concave-shaped region 925*c*, where the difference is included in a range of approximately 0.5 nanometers to approximately 1.0 nanometer. However, other values and ranges for differences in the depths D11, D12, and D13 are within the scope of the present disclosure.

Angles associated with the concave-shaped regions 925 (e.g., the angle D14 defining the concave-shaped region 925*a*, the angle D15 defining the concave-shaped region 925*c*, among other examples) may be included in range of approximately 120 degrees to approximately 160 degrees. If an angle associated with one or more of the concave-shaped regions 925*a*-925*c* is less than approximately 120 degrees, void defects may develop in epitaxial layers of subsequently formed source/drain regions (e.g., the source/drain regions 225). If the angle is greater than approximately 160 degrees, an increase in a volume of the epitaxial layers in the subsequently formed source/drain regions may not increase, thereby failing to reduce parasitic resistance within the nanostructure transistor.

Additionally, or alternatively, the angles associated with the concave-shaped regions 925 may vary. As an example, the angle D14 may be lesser relative to the angle D15, where the difference is included in a range of approximately 5 degrees to approximately 15 degrees. However, other values and ranges for the angles defining the concave-shaped regions 925, and differences between the angles, are within the scope of the present disclosure.

Figure 9D:
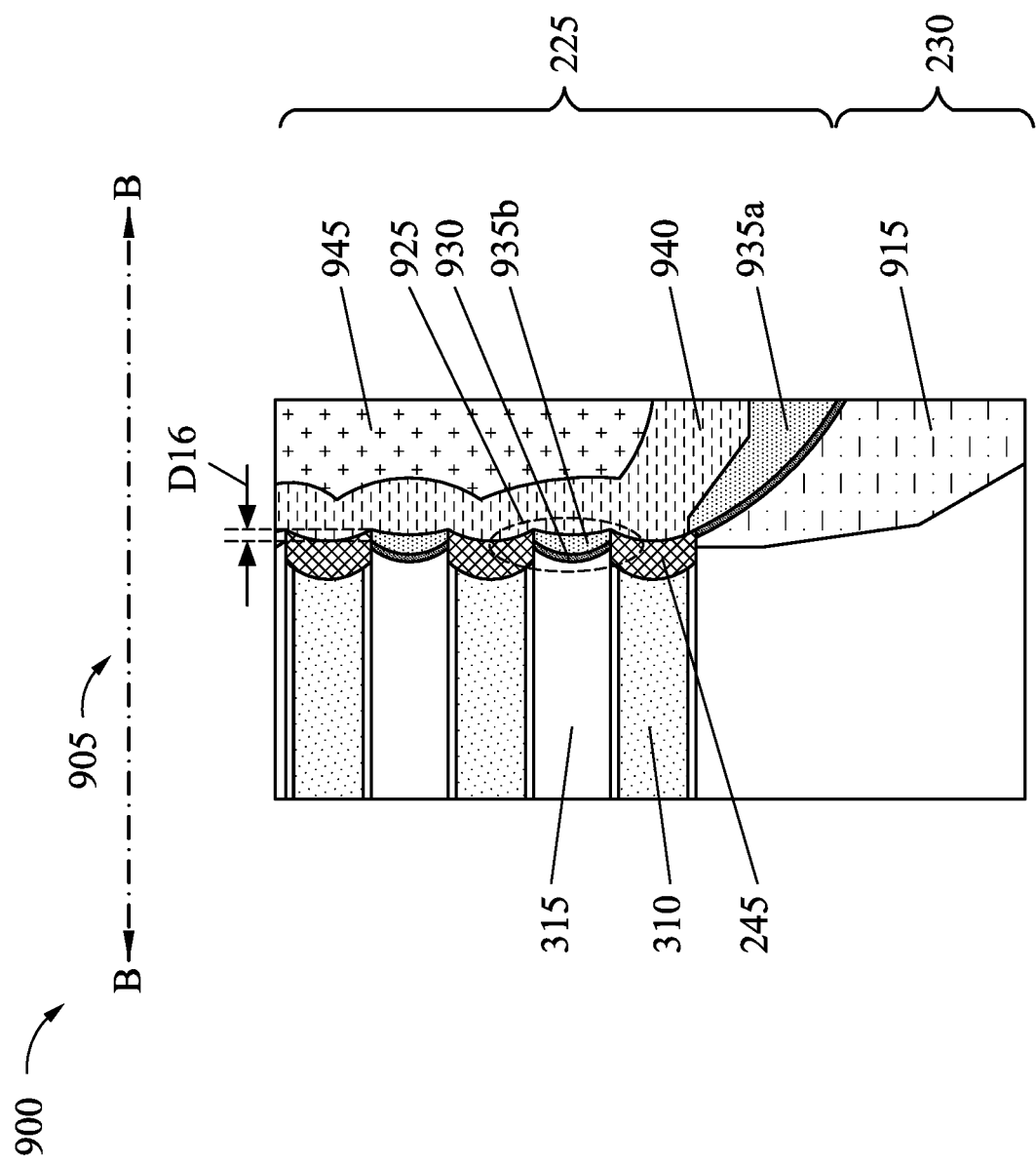

FIG. 9D shows cross-sectional views B-B of an example portion of the region 905, after formation of the source/drain regions 225. Formation of the source/drain regions 225 may include depositing, using a CVD technique, an ALD technique, a PVD technique, and/or another deposition technique, a seed layer 930, followed by depositing an epitaxial layer 935 over the seed layer 930. The seed layer 930 (e.g., a silicon boron seed layer, among other examples) may promote growth (e.g., deposition) of the epitaxial layer 935 within the concave-shaped regions 925.

The epitaxial layer 935 (e.g., a first epitaxial layer of the source/drain regions 225, which may be referred to as an "L1-1" layer) may include portions 935a over the buffer region 230 (e.g., over the epitaxial layer 915 within the buffer region) and convex-shaped portions 935b within the concave-shaped regions 925 at the ends of the second layers 315 (e.g., at the ends of the plurality of channel layers). The epitaxial layer 935 may include, as an example, a silicon material doped with boron (e.g., SiB). In such a case, the doping concentration of boron may be in a range of approximately $1 \times 10^{20}$ atoms per cubic centimeter to approximately $8 \times 10^{20}$ atoms per cubic centimeter. However, other combinations of materials, dopants, and ranges for the doping concentration for epitaxial layer 935 are within the scope of the present disclosure.

In some implementations, and as shown, a thickness D16 of the convex-shaped portions 935b may be included in a range of approximately 2 nanometers to approximately 5 nanometers. If the thickness D16 is less than approximately 2 nanometers, the convex-shaped portions 935b may be ineffective in shielding dopants of the source/drain regions 225 from the second layers 315 (e.g., the channel layers). If the thickness D16 is greater than approximately 5 nanometers, a volume of epitaxial materials within the source/drain regions 225 may not increase (and fail to reduce parasitic resistance of the nanostructure transistor). However, other values and ranges for the thickness D16 are within the scope of the present disclosure.

FIG. 9D further shows an epitaxial layer 940 (e.g., a second epitaxial layer of the source/drain regions 225, which may be referred to as an "L1-2" layer) over the epitaxial layer 935. The epitaxial layer 940 may include a thickness that is in a range of approximately 5 nanometers to approximately 15 nanometers, among other examples. Furthermore, the epitaxial layer 940 may include a silicon germanium material doped with boron (e.g., SiGeB). In such a case, the germanium (Ge) concentration in the epitaxial layer 940 may be in a range of approximately 10% germanium to approximately 30% germanium. The doping concentration of boron may be in a range of approximately $1 \times 10^{20}$ atoms per cubic centimeter to approximately $5 \times 10^{20}$ atoms per cubic centimeter. However, other combinations of thicknesses, materials, dopants, and ranges for the doping concentration for epitaxial layer 940 are within the scope of the present disclosure.

FIG. 9D further shows an epitaxial layer 945 (e.g., a third epitaxial layer of the source/drain regions 225, which may be referred to as an "L2" layer) over the epitaxial layer 940. The epitaxial layer 945 may include a thickness that is in a range of approximately 10 nanometers to approximately 40 nanometers, among other examples. Furthermore, the epitaxial layer 945 may include a silicon germanium material doped with boron (e.g., SiGeB). In such a case, the germanium (Ge) concentration in the epitaxial layer 945 may be in a range of approximately 30% germanium to approximately 55% germanium. The doping concentration of boron may be in a range of approximately $5 \times 10^{20}$ atoms per cubic centimeter to approximately $3 \times 10^{21}$ atoms per cubic centimeter. However, other combinations of thicknesses, materials, dopants, and ranges for the doping concentration for the epitaxial layer 945 are within the scope of the present disclosure.

Figure 9E:
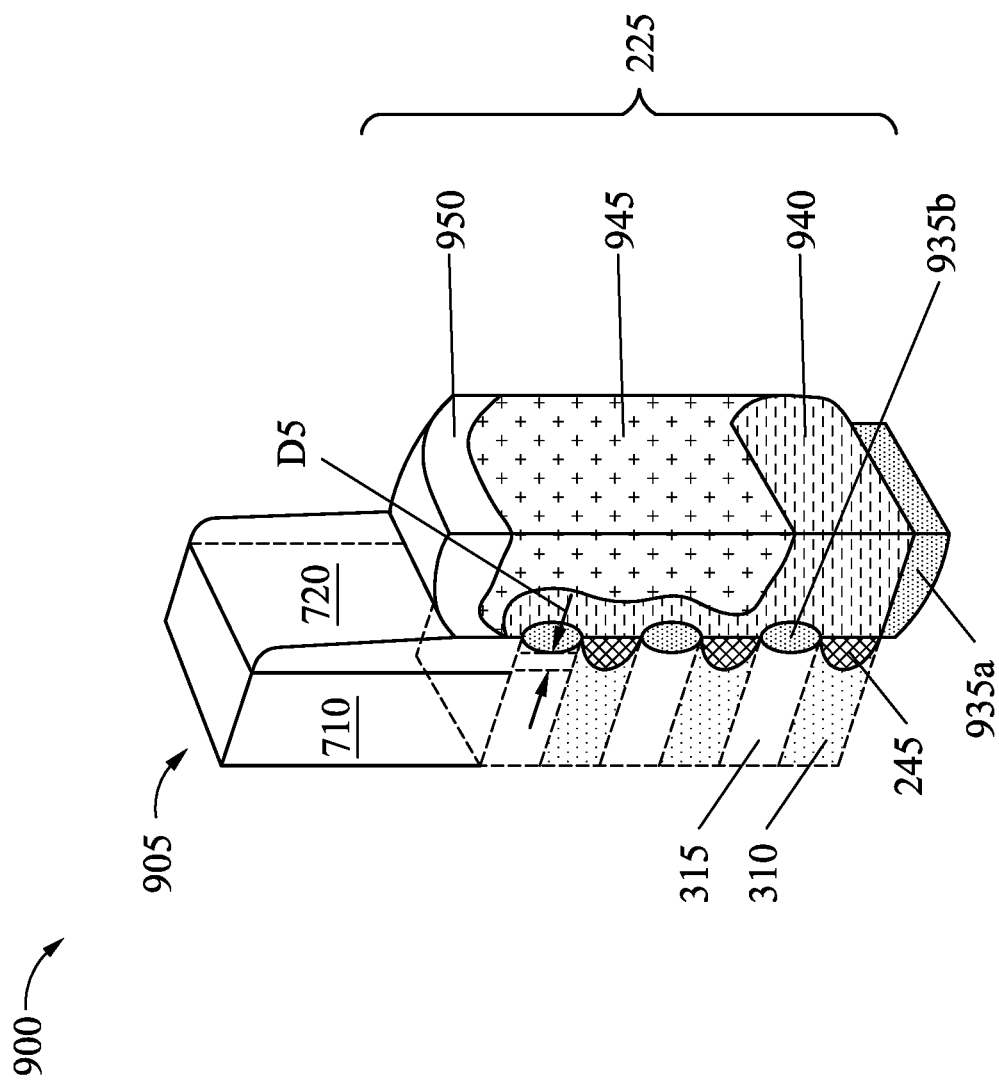

FIG. 9E shows an isometric view of an example portion of the region 905 after formation of the source/drain regions 225, including the gate electrode layer 710 and the spacer layers 720. The source/drain regions 225 includes the epitaxial layer 935 (e.g., a first epitaxial layer including the portions 935a and the convex-shaped portions 935b), the epitaxial layer 940 (e.g., a second epitaxial layer), and the epitaxial layer 945 (e.g., a third epitaxial layer).

Also, FIG. 9E shows a capping layer 950 that has been deposited over the epitaxial layer 945. The capping layer 950 may protect the epitaxial layer 945 during subsequent formation of a metal contact structure. The capping layer 950 may include a thickness that is in a range of approximately 5 nanometers to approximately 15 nanometers. In some implementations, the capping layer 950 includes a silicon germanium material doped with boron (e.g., SiGeB). In such a case, the germanium (Ge) concentration in the capping layer 950 may be in a range of approximately 15% germanium to approximately 40% germanium. The doping concentration of boron may be in a range of approximately $1 \times 10^{21}$ atoms per cubic centimeter to approximately $2 \times 10^{21}$ atoms per cubic centimeter. However, other combinations of thicknesses, materials, dopants, and ranges for the doping concentration for the capping layer 950 are within the scope of the present disclosure. As shown in FIG. 9E, the ends of the first layers 310 (e.g., the sacrificial layers) include the inner spacers 245, and the convex-shaped portions 935b are within the concave-shaped regions 925 at the ends of the second layers 315 (e.g., the channel layers).

After formation of the source/drain regions 225, the distance D5 (e.g., the proximity of the source/drain regions 225 to the gate structures 240, subsequently formed) may be included in a range of approximately 3 nanometers to approximately 6 nanometers. A distance D5 of less than approximately 3 nanometers may correspond to the concave-shaped regions 925 being over-etched, and portions of the gate structures 240 may extrude into channel layers of the nanostructure transistor (e.g., the second layers 315). A distance D5 of greater than approximately 6 nanometers may correspond to the concave-shaped regions 925 being under-etched, and the concave-shaped regions 925 may have insufficient surface area for a seed layer (e.g., the seed layer 930) to promote growth of the epitaxial layer 935 (and voids in the epitaxial layer 935 may be introduced). Furthermore, a channel resistance ($R_{ch}$) may increase to decrease a performance of the nanostructure transistor. However, other values and ranges for the distance D5 (e.g., the proximity) are within the scope of the present disclosure.

Figure 9F:
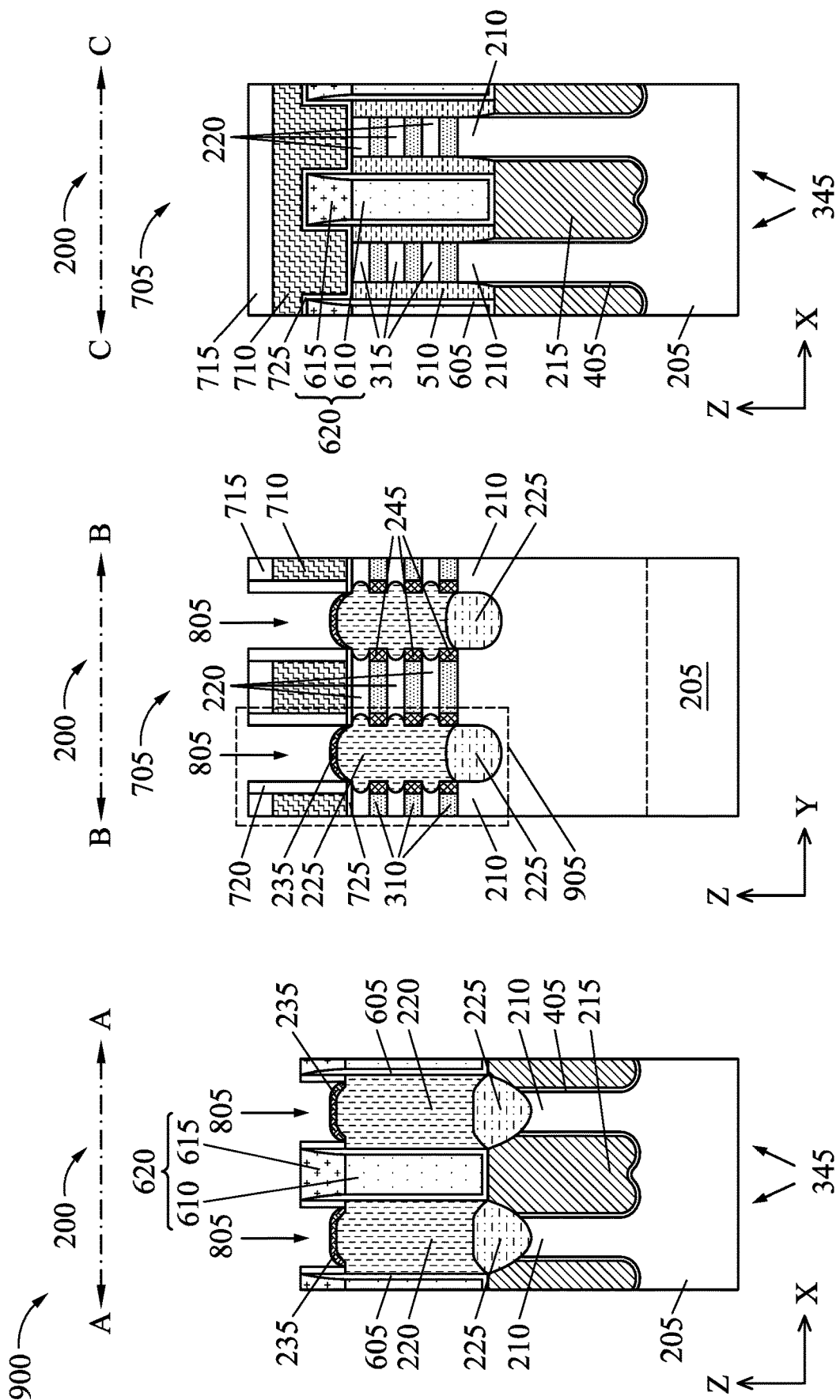

As shown in the cross-sectional plane A-A and the cross-sectional plane B-B in FIG. 9F, the source/drain recesses 805 are filled with one or more layers to form the source/drain regions 225 in the source/drain recesses 805. The region 905 including the source/drain regions 225 further shows source/drain regions 225 extending into the trimmed regions of the nanostructure channels 220 (e.g., the second layers 315).

The number and arrangement of devices shown in FIGS. 9A-9F are provided as one or more examples. In practice, there may be additional materials, different materials, differently arranged materials, different doping concentrations, or different dimensional properties than those shown in FIGS. 9A-9F.

FIGS. 10A-10D are diagrams of an example implementation 1000 of a replacement gate (RPG) process described herein. The example implementation 1000 includes an example of a replacement gate process for replacing the dummy gate structures 705 with the gate structures 240 (e.g., the replacement gate structures) of the semiconductor device

200. FIGS. 10A-10D are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 1000 are performed after the operations described in connection with FIGS. 3A-9F.

Figure 10A:
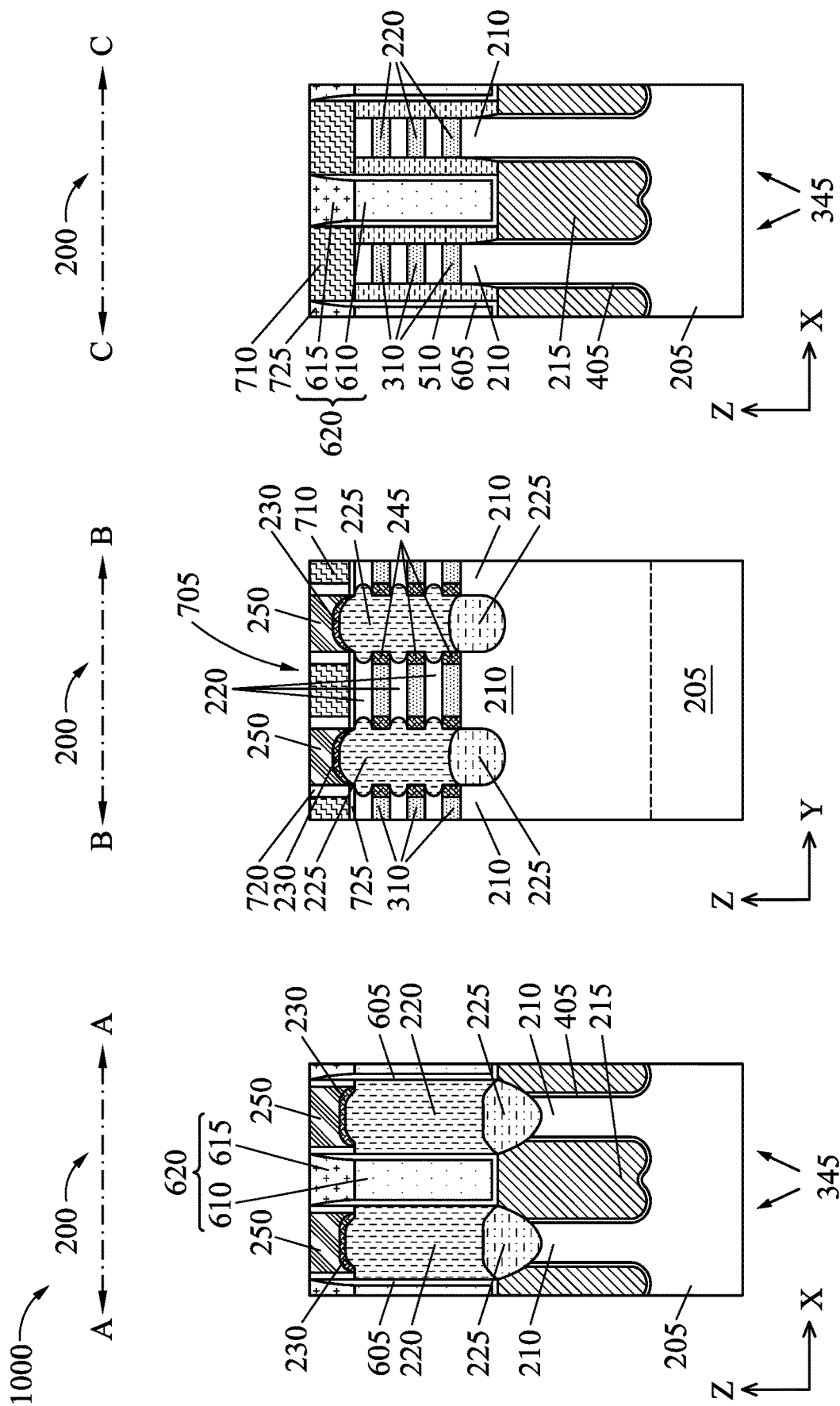
FIGS. 10A-10D are diagrams of an example implementation of a replacement gate process described herein.

As shown in the cross-sectional plane A-A and the cross-sectional plane B-B in FIG. 10A, the dielectric layer 250 is formed over the source/drain regions 225. The dielectric layer 250 fills in areas between the dummy gate structures 705, between the hybrid fin structures 620, and over the source/drain regions 225. The dielectric layer 250 is formed to reduce the likelihood of and/or prevent damage to the source/drain regions 225 during the replacement gate process. The dielectric layer 250 may be referred to as an interlayer dielectric (ILD) zero (ILD0) layer or another ILD layer.

In some implementations, a contact etch stop layer (CESL) is conformally deposited (e.g., by the deposition tool 102) over the source/drain regions 225, over the dummy gate structures 705, and on the spacer layers 720 prior to formation of the dielectric layer 250. The dielectric layer 250 is then formed on the CESL. The CESL may provide a mechanism to stop an etch process when forming contacts or vias for the source/drain regions 225. The CESL may be formed of a dielectric material having a different etch selectivity from adjacent layers or components. The CESL may include or may be a nitrogen containing material, a silicon containing material, and/or a carbon containing material. Furthermore, the CESL may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL may be deposited using a deposition process, such as ALD, CVD, or another deposition technique.

Figure 10B:
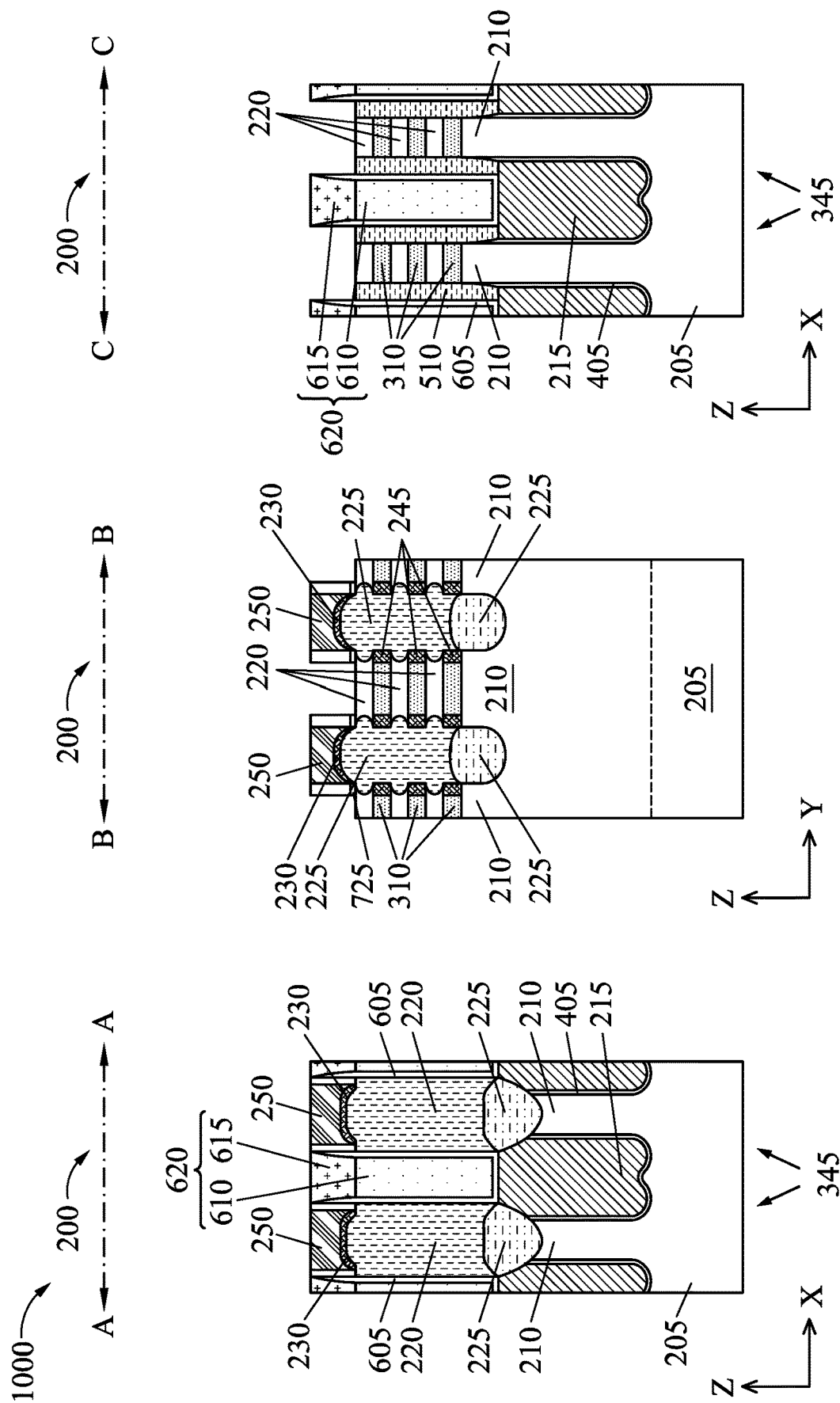

As shown in the cross-sectional plane B-B and the cross-sectional plane C-C in FIG. 10B, the replacement gate operation is performed (e.g., by one or more of the semiconductor processing tools 102-112) to remove the dummy gate structures 705 from the semiconductor device 200. The removal of the dummy gate structures 705 leaves behind openings (or recesses) between the dielectric layer 250 over the source/drain regions 225, and between the hybrid fin structures 620. The dummy gate structures 705 may be removed in one or more etch operations. Such etch operations may include a plasma etch technique, a wet chemical etch technique, and/or another type of etch technique.

Figure 10C:
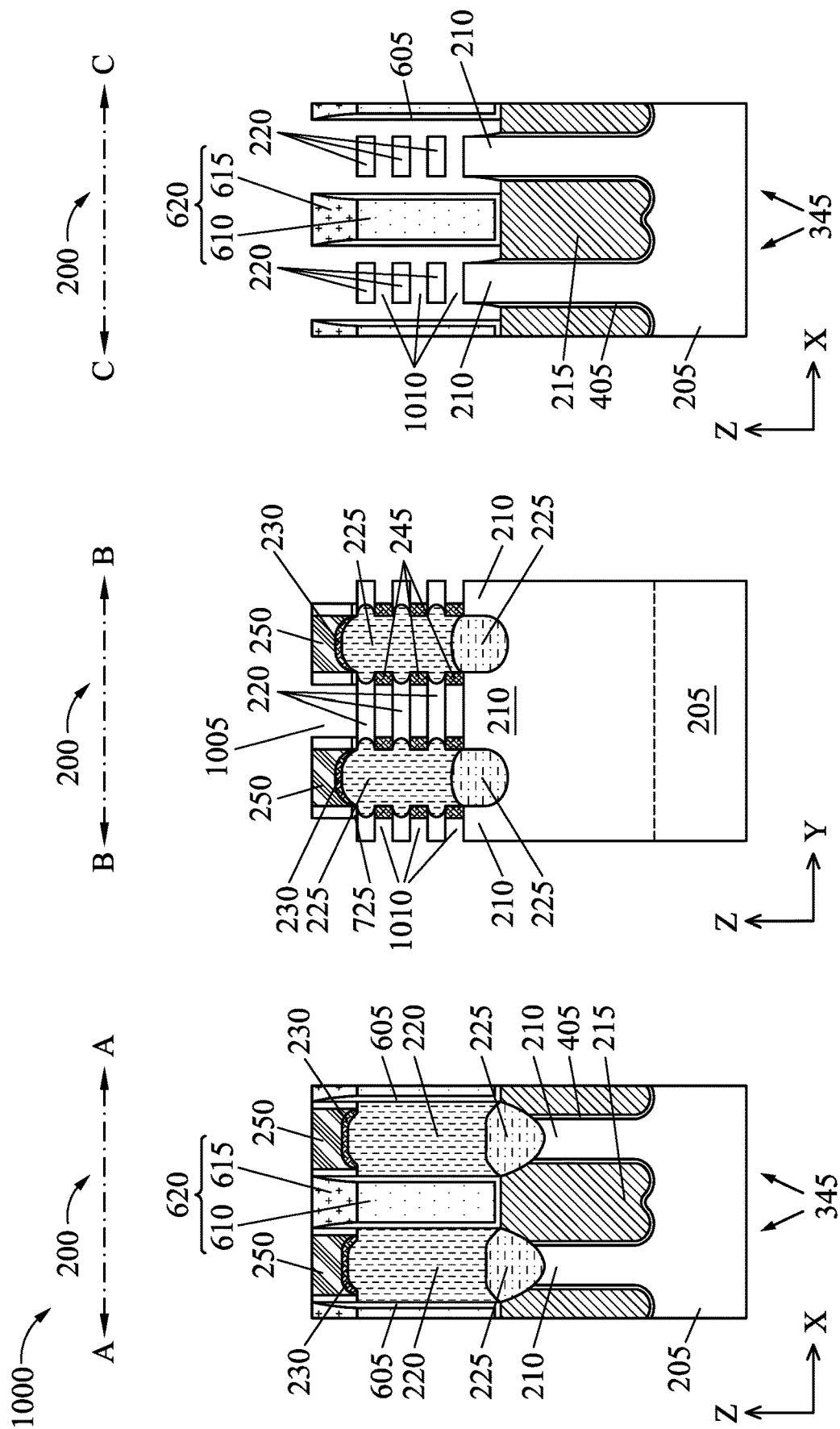

As shown in the cross-sectional plane B-B and the cross-sectional plane C-C in FIG. 10C, a nanostructure release operation (e.g., an SiGe release operation) is performed to remove the first layers 310 (e.g., the silicon germanium layers). This results in openings 1005 between the nanostructures channels 220 (e.g., the areas around the nanostructure channels 220). The nanostructure release operation may include the etch tool 108 performing an etch operation to remove the first layer 310 based on a difference in etch selectivity between the material of the first layers 310 and the material of the nanostructure channels 220, and between the material of the first layers 310 and the material of the inner spacers 245. The inner spacers 245 may function as etch stop layers in the etch operation to protect the source/drain regions 225 from being etched. As further shown in FIG. 10C, the cladding sidewalls 510 are removed in the nanostructure release operation. This provides access to the areas around the nanostructure channels 220, which enables replacement gate structures (e.g., the gate structures 240) to be formed fully around the nanostructure channels 220.

Figure 10D:
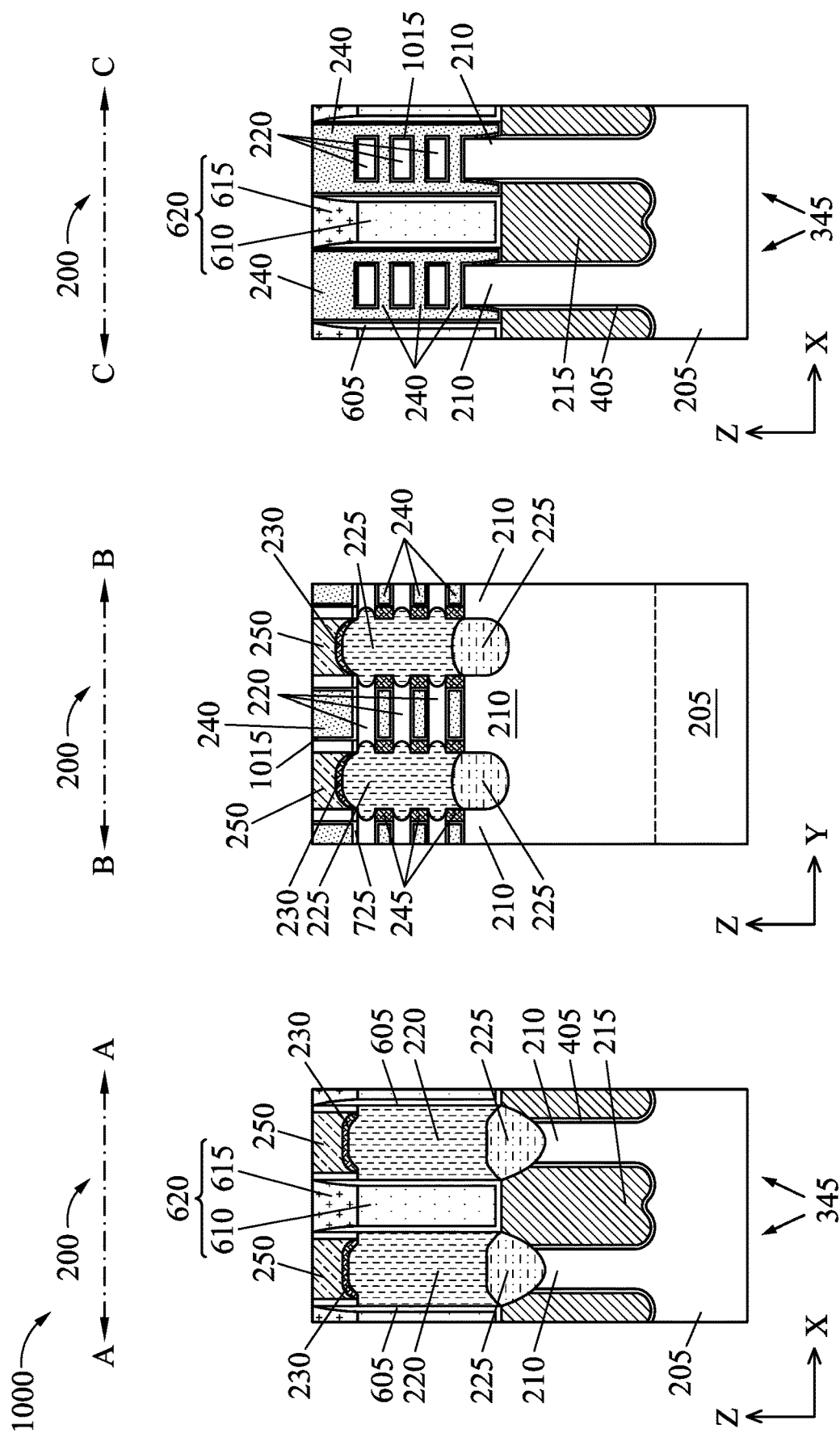

As shown in the cross-sectional plan B-B and the cross-sectional plane C-C in FIG. 10D, the replacement gate operation continues where deposition tool 102 and/or the plating tool 112 forms the gate structures (e.g., replacement gate structures) 240 in the openings 1005 between the source/drain regions 225 and between the hybrid fin structures 620. In particular, the gate structures 240 fill the areas between and around the nanostructure channels 220 that were previously occupied by the first layers 310 and the cladding sidewalls 510 such that the gate structures 240 fully wrap around the nanostructure channels 220 and surround the nanostructure channels 220. The gate structures 240 may include metal gate structures. A conformal high-k dielectric liner 1010 may be deposited onto the nanostructure channels 220 and on sidewalls prior to formation of the gate structures 240. The gate structures 240 may include additional layers such as an interfacial layer, a work function tuning layer, and/or a metal electrode structure, among other examples. As described in connection with FIGS. 11A and 11B, techniques to form a portion 1020 including the nanostructure channels 220 and the gate structures 240 may vary based on a type of device (e.g., a PMOS type device and an NMOS type of device, among other examples).

As further shown in the cross-sectional plane C-C in FIG. 10D, the removal of the cladding layer 505 from the tops of the STI regions 215 to prevent the cladding sidewall layers from including footings under the hybrid fin structures 620 between adjacent fin structures 345 enables the gate structures 240 to be formed such that the gate structure 240 does not include a footing under the hybrid fin structures 620. In other words, since the gate structures 240 are formed in the areas that were previously occupied by the cladding sidewalls, the absence of a footing under the hybrid fin structures 620 for the cladding sidewalls also results in an absence of a footing under the hybrid fin structures 620 for the gate structures 240. This reduces and/or prevents shorting between the gate structures 240 and the source/drain regions 225 under the hybrid fin structures 620.

As indicated above, the number and arrangement of operations to form and devices shown in FIGS. 10A-10D are provided as one or more examples. In practice, there may be additional operations to form and devices, fewer operations to form and devices, different operations to form and devices, or differently arranged operations to form and devices than those shown in FIGS. 10A-10D.

Figure 11A:
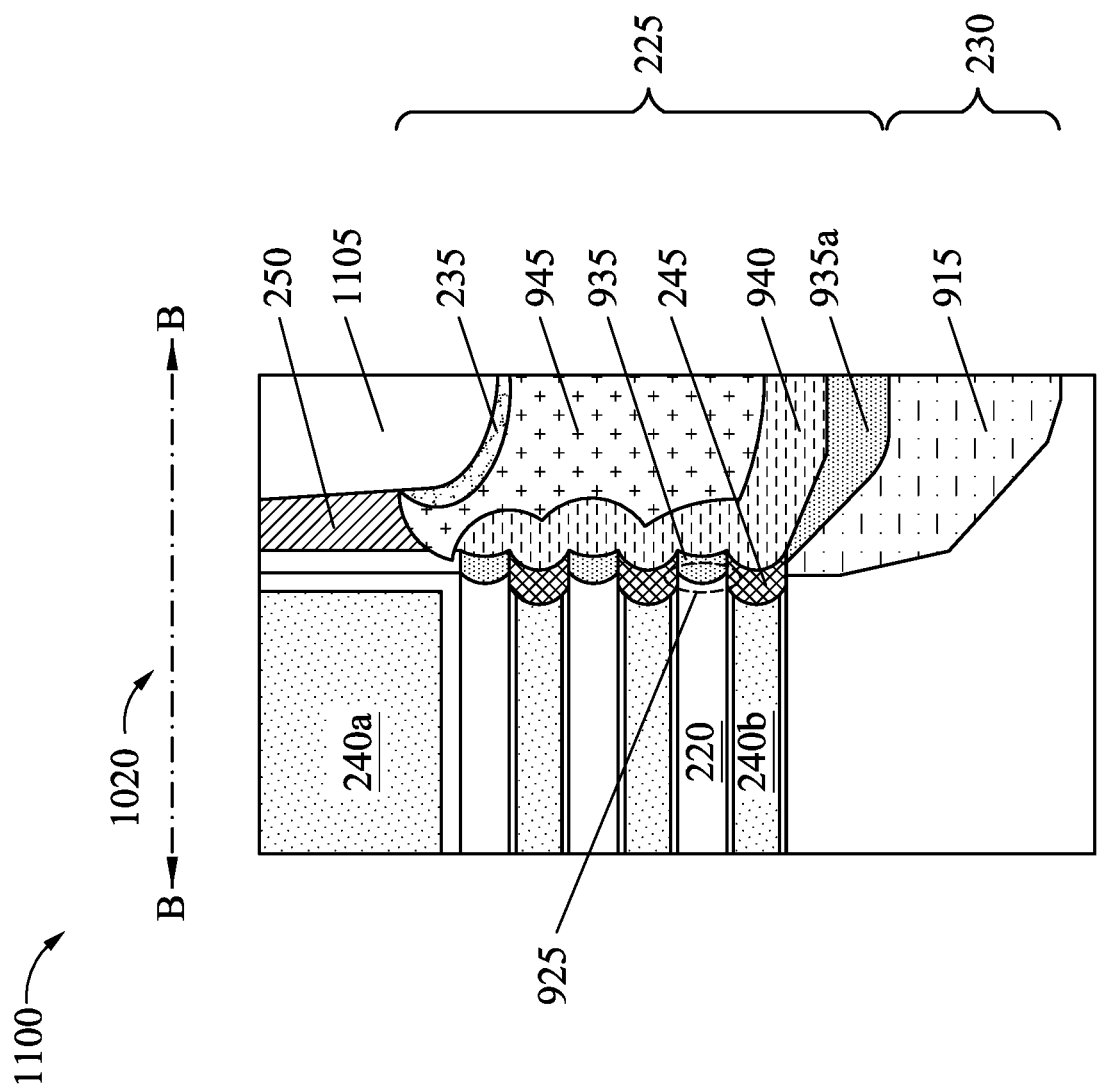
FIGS. 11A and 11B are diagrams of an example nanostructure transistor described herein.
Figure 11B:
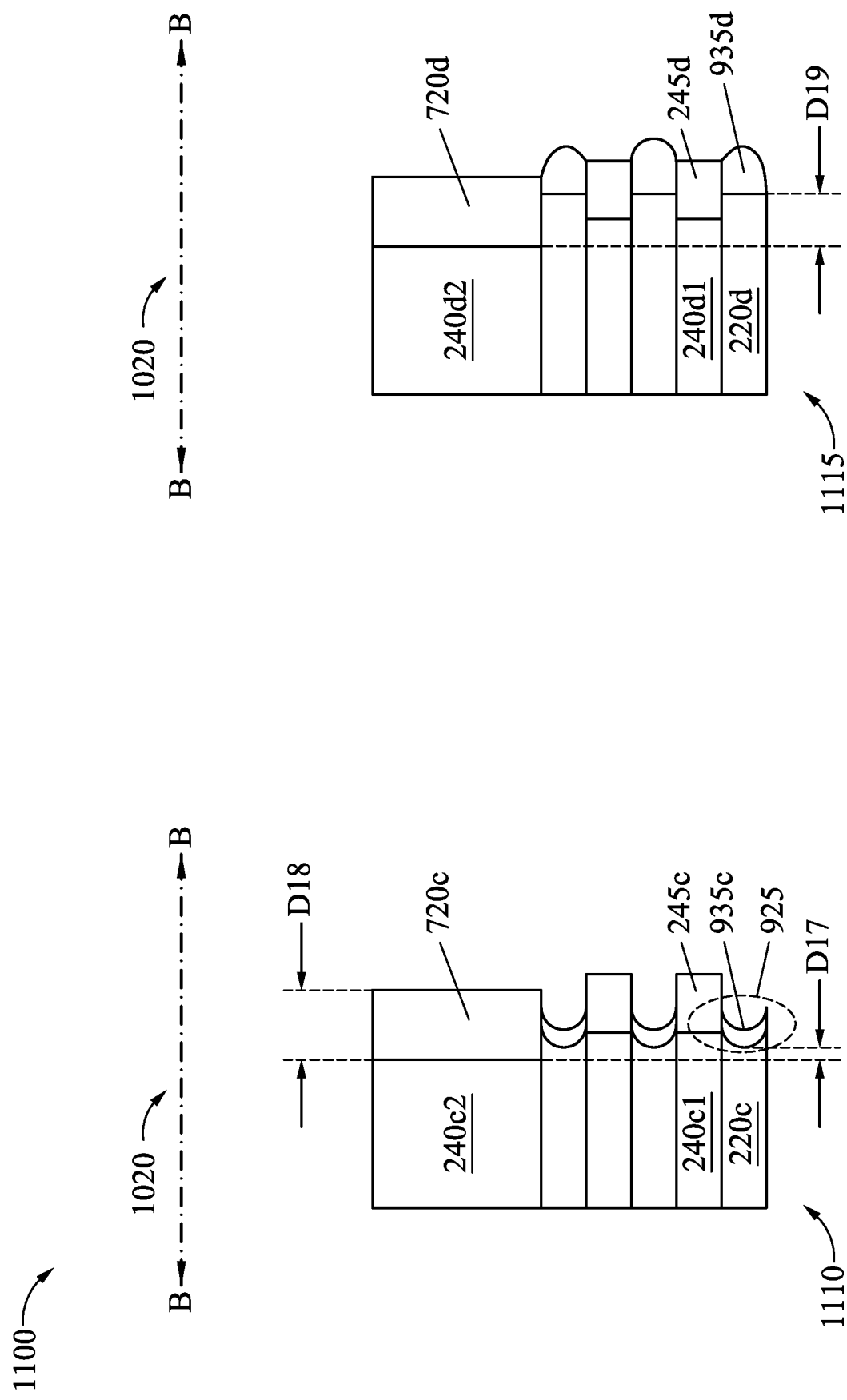

FIGS. 11A and 11B are diagrams of the example nanostructure transistor described herein. FIGS. 11A and 11B are illustrated from the perspective of the cross-sectional plane B-B in FIG. 7A. In some implementations, the example nanostructure transistor is formed after operations described in connection with FIGS. 3A-10D.

As shown in FIG. 11A, the portion 1020 of the nanostructure transistor includes the nanostructure channels 220 over the mesa region 210 (e.g., the mesa region 210 of the fin structure 345 over the semiconductor substrate 205). The nanostructure channels 220 (e.g., formed through replacement of the second layers 315 during the RPG process) include the concave-shaped regions 925. FIG. 11A further shows portions 240a and 240b of the gate structure 240. The inner spacers 245 are at ends of the portions 240b.

As shown in FIG. 11A, the buffer region 230 includes the epitaxial layer 915. The source/drain region 225 includes the epitaxial layer 935, including the portion 935a and the convex-shaped portions 935b that extend into the concave-shaped regions 925. The source/drain region 225 further includes the epitaxial layer 940 and the epitaxial layer 945.

The capping layer 235 is over the source/drain region 225. A source/drain contact 1105 (referred to as an MD) is formed to the source/drain region 225 through the ILD layer 250. To form the source/drain contact 1105, a recess is formed through the dielectric layer 250 and to the source/drain region 225. In some implementations, the recess is formed in a portion of the source/drain region 225 such that the source/drain contact 1105 extends into a portion of the source/drain region 225.

FIG. 11B compares examples of the portion 1020 for different types of nanostructure transistors. Example 1110 at the left of FIG. 11B corresponds to a PMOS nanostructure transistor and example 1115 at the right of FIG. 11B corresponds to an NMOS nanostructure. In some implementations, example 1110 is formed along a first axis that is perpendicular to the semiconductor substrate 205 and example 1115 is formed along a second axis that is perpendicular to the semiconductor substrate 205.

As shown, example 1110 includes a plurality of nanostructure channels 220c alternating with portions 240c1 of the gate structure 240 (e.g., the portion 240c2 of the gate structure is also shown). Inner spacers 245c are at ends of the portions 240c1.

Example 1110, which may be formed using operations described in connection with FIGS. 9C-9F, includes the convex-shaped portions 935c that extend into the concave-shaped regions 925. A proximity D17 of the example 1110 (e.g., a distance from the source/drain region 225 to the gate structure 240 of the final semiconductor device 200), based on dimensional properties of the convex-shaped portions 935c and/or the concave-shaped regions 925, may be included in a range of approximately 3 nanometers to approximately 6 nanometers. However, other values and ranges for the proximity are within the scope of the present disclosure.

The example 1110 further shows the spacer layer 720c. During formation of the nanostructure transistor, a width D18 of the spacer layer 720c may be increased by up to 20% to increase the proximity D17.

As shown, example 1115 includes a plurality of nanostructure channels 220d alternating with portions 240d1 of the gate structure 240 (e.g., the portion 240d2 of the gate structure is also shown). Inner spacers 245d are at ends of the portions 240d1.

A source/drain recess (e.g., the source drain recess 805) of example 1115 may have been masked by a photoresist material during formation of the concave-shaped regions 925 of example 1110. As such, the concave-shaped regions 925 are not formed in the ends of the nanostructure channels 220d. Additionally, convex-shaped portions 935d extend from the ends of the nanostructure channels 220d. A proximity D19 of the example 1115 (e.g., a distance from the source/drain region 225 to the gate structure 240 of the final semiconductor device 200), based on the absence of the concave-shaped regions 925, may be greater relative to the proximity D17 of example 1110. For example, the proximity D19 may be included in a range of approximately 5 nanometers to approximately 9 nanometers. However, other values and ranges for the proximity D19 are within the scope of the present disclosure.

As indicated above, the operations and devices shown in FIGS. 11A and 11B are provided as one or more examples. In practice, there may be additional operations to perform and devices to form, fewer operations to perform and devices to form, different operations to perform and devices to form, or differently arranged operations to perform and devices to form than those shown in FIGS. 11A and 11B.

Figure 12:
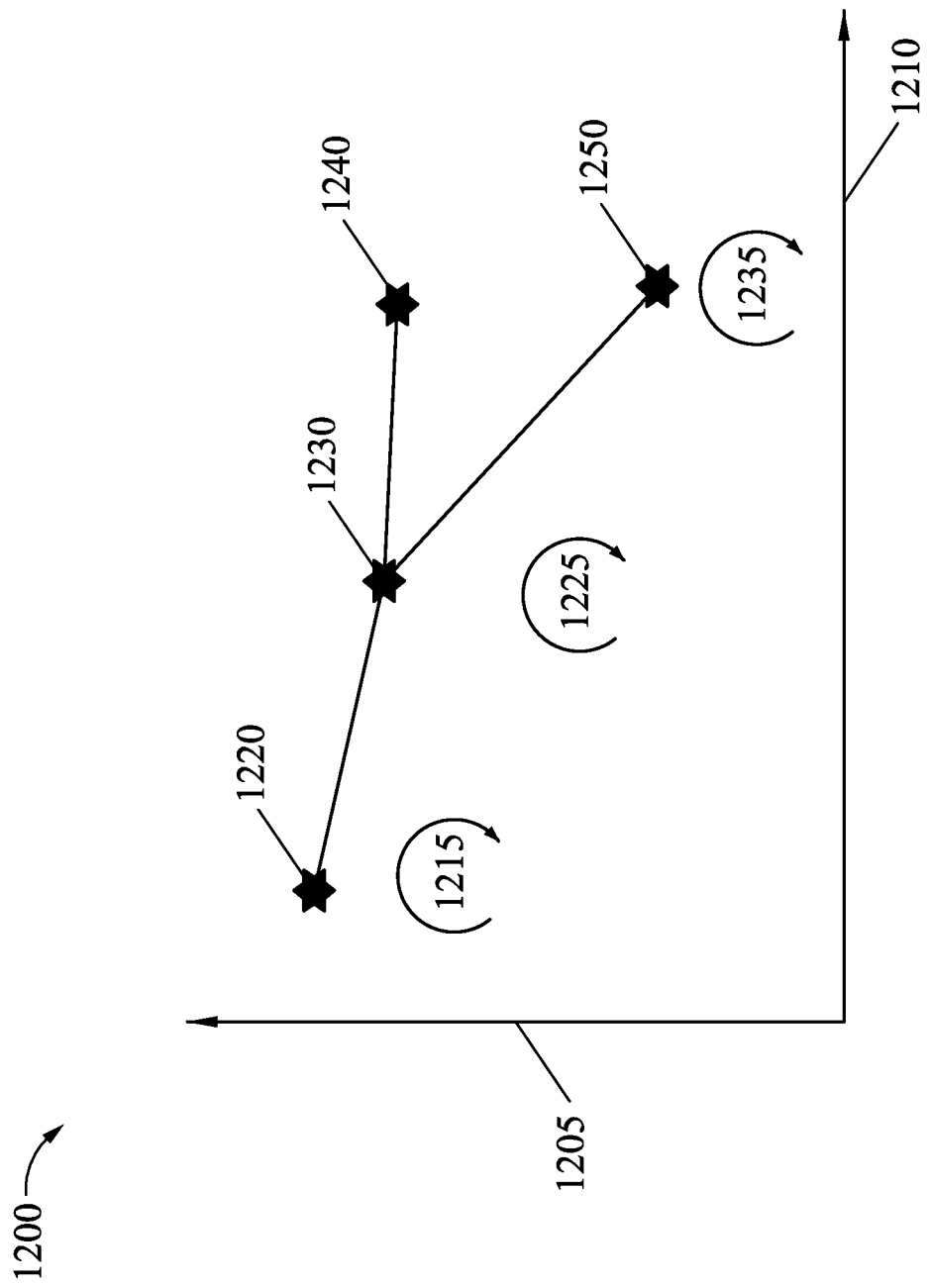
FIG. 12 is a diagram comparing formation of example nanostructure transistors described herein.

FIG. 12 is a diagram 1200 comparing formation of example nanostructure transistors described herein. The diagram 1200 compares a proximity 1205 during stages 1210 of formation of the nanostructure transistors. In some implementations, the nanostructure transistors correspond to the nanostructure transistors represented by example 1110 (e.g., a PMOS nanostructure transistor) and example 1115 (e.g., an NMOS nanostructure transistor) of FIG. 11B.

Stage 1215 may correspond to a "pre-recess" stage of formation (e.g., prior to formation of the source/drain recess 805, and after deposition of the spacer layers 720). At stage 1215, a PMOS nanostructure transistor (e.g., corresponding to the example 1110) and an NMOS nanostructure transistor (e.g., corresponding to the example 1115) may both have a same proximity 1220 (e.g., approximately 8 nanometers to approximately 10 nanometers, among other examples).

Stage 1225 may correspond to a "post-inner spacer" stage of formation (e.g., after formation of the inner spacers 245). At stage 1225, and due an etching operation associated with the inner spacers 245, the PMOS nanostructure transistor and the NMOS nanostructure transistor may both have a same, reduced proximity 1230 (e.g., approximately 5 nanometers to approximately 9 nanometers, among other examples).

Stage 1235 may correspond to a "post trimming" stage of formation (e.g., after trimming of the second layers 315 included in the PMOS nanostructure transistor). At stage 1235, and due to the second layers 315 included in the PMOS nanostructure transistor being etched (and the second layers 315 included in the NMOS nanostructure transistor being masked), a difference in proximities may emerge. As shown at stage 1235, the proximity 1240 for the NMOS nanostructure transistor may remain relatively unchanged. However, the proximity 1250 for the PMOS nanostructure transistor may be reduced further (e.g., reduced to approximately 3 nanometers to approximately 6 nanometers, among other examples).

As indicated above, the operations and devices shown in FIG. 12 are provided as one or more examples. In practice, there may be additional operations to perform and devices to form, fewer operations to perform and devices to form, different operations to perform and devices to form, or differently arranged operations to perform and devices to form than those shown in FIG. 12.

Figure 13:
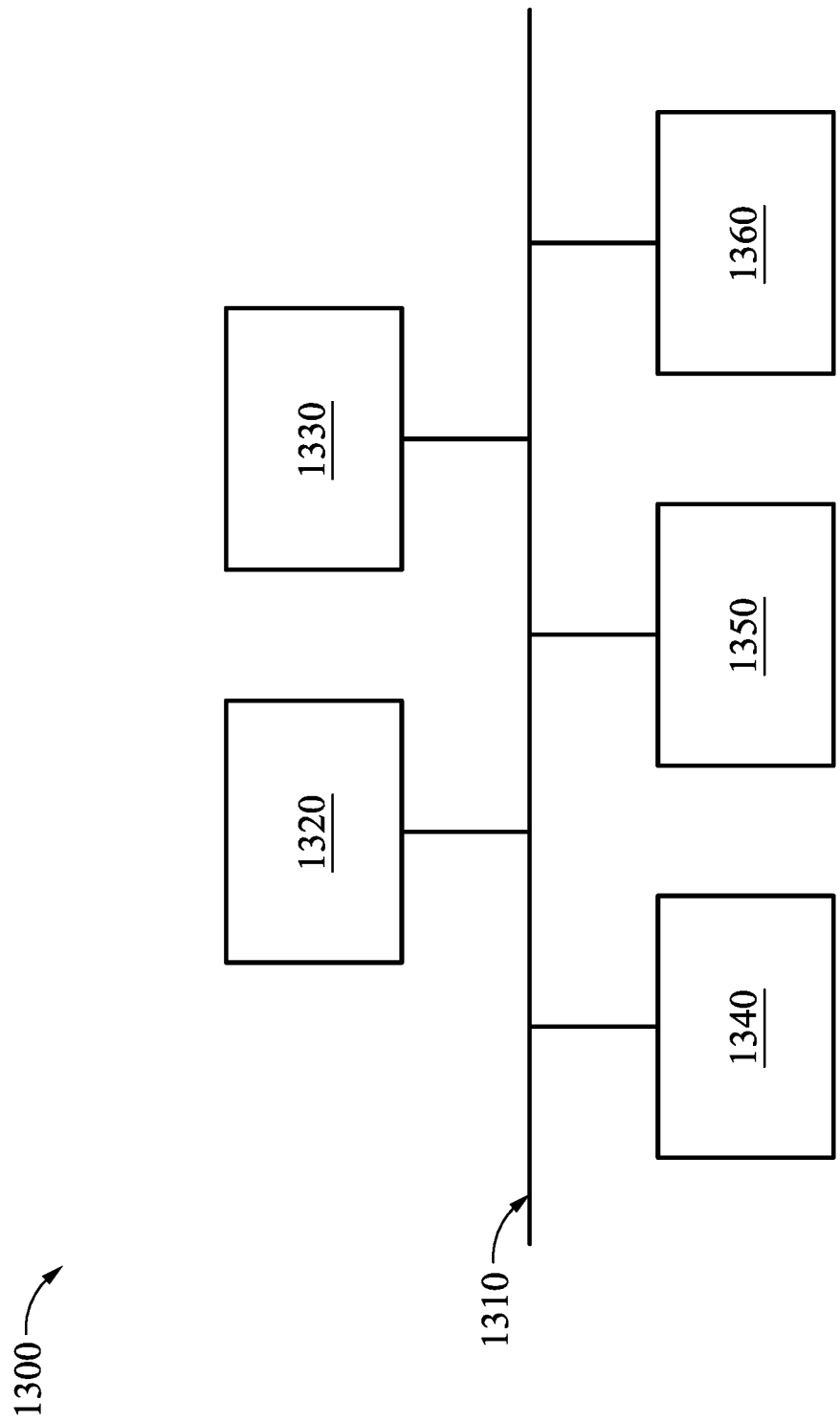
FIG. 13 is a diagram of example components of one or more devices described herein.

FIG. 13 is a diagram of example components of one or more devices 1300 described herein. In some implementations, one or more of the semiconductor processing devices 102-112 and/or the wafer/die transport tool 114 may include one or more devices 1300 and/or one or more components of device 1300. As shown in FIG. 13, device 1300 may include a bus 1310, a processor 1320, a memory 1330, an input component 1340, an output component 1350, and a communication component 1360.

Bus 1310 includes one or more components that enable wired and/or wireless communication among the components of device 1300. Bus 1310 may couple together two or more components of FIG. 13, such as via operative coupling, communicative coupling, electronic coupling, and/or electric coupling. Processor 1320 includes a central processing unit, a graphics processing unit, a microprocessor, a controller, a microcontroller, a digital signal processor, a field-programmable gate array, an application-specific integrated circuit, and/or another type of processing component. Processor 1320 is implemented in hardware, firmware, or a combination of hardware and software. In some implementations, processor 1320 includes one or more processors capable of being programmed to perform one or more operations or processes described elsewhere herein.

Memory 1330 includes volatile and/or nonvolatile memory. For example, memory 1330 may include random access memory (RAM), read only memory (ROM), a hard disk drive, and/or another type of memory (e.g., a flash memory, a magnetic memory, and/or an optical memory). Memory 1330 may include internal memory (e.g., RAM, ROM, or a hard disk drive) and/or removable memory (e.g., removable via a universal serial bus connection). Memory 1330 may be a non-transitory computer-readable medium. Memory 1330 stores information, instructions, and/or software (e.g., one or more software applications) related to the operation of device 1300. In some implementations, memory 1330 includes one or more memories that are coupled to one or more processors (e.g., processor 1320), such as via bus 1310.

Input component 1340 enables device 1300 to receive input, such as user input and/or sensed input. For example, input component 1340 may include a touch screen, a keyboard, a keypad, a mouse, a button, a microphone, a switch, a sensor, a global positioning system sensor, an accelerometer, a gyroscope, and/or an actuator. Output component 1350 enables device 1300 to provide output, such as via a display, a speaker, and/or a light-emitting diode. Communication component 1360 enables device 1300 to communicate with other devices via a wired connection and/or a wireless connection. For example, communication component 1360 may include a receiver, a transmitter, a transceiver, a modem, a network interface card, and/or an antenna.

Device 1300 may perform one or more operations or processes described herein. For example, a non-transitory computer-readable medium (e.g., memory 1330) may store a set of instructions (e.g., one or more instructions or code) for execution by processor 1320. Processor 1320 may execute the set of instructions to perform one or more operations or processes described herein. In some implementations, execution of the set of instructions, by one or more processors 1320, causes the one or more processors 1320 and/or the device 1300 to perform one or more operations or processes described herein. In some implementations, hardwired circuitry is used instead of or in combination with the instructions to perform one or more operations or processes described herein. Additionally, or alternatively, processor 1320 may be configured to perform one or more operations or processes described herein. Thus, implementations described herein are not limited to any specific combination of hardware circuitry and software.

The number and arrangement of components shown in FIG. 13 are provided as an example. Device 1300 may include additional components, fewer components, different components, or differently arranged components than those shown in FIG. 13. Additionally, or alternatively, a set of components (e.g., one or more components) of device 1300 may perform one or more functions described as being performed by another set of components of device 1300.

Figure 14:
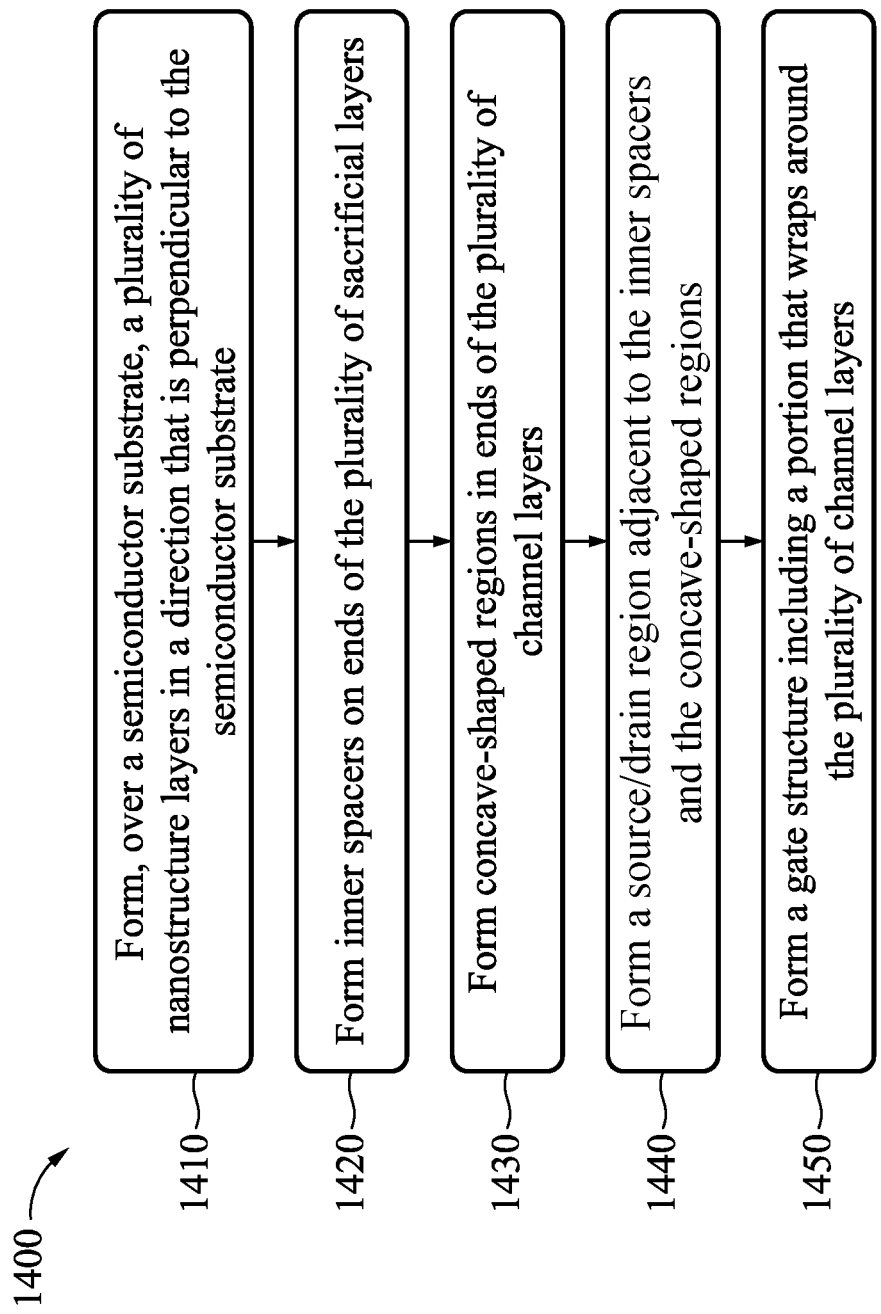
FIGS. 14 and 15 are flowcharts of example processes associated with forming a semiconductor device described herein.

FIG. 14 is a flowchart of an example process 1400 associated with semiconductor device and methods of formation. In some implementations, one or more process blocks of FIG. 14 are performed by a combination of one or more semiconductor processing tools (e.g., a combination of one or more of the semiconductor processing tools 102-112). Additionally, or alternatively, one or more process blocks of FIG. 14 may be performed by one or more components of device 1300, such as processor 1320, memory 1330, input component 1340, output component 1350, and/or communication component 1360.

As shown in FIG. 14, process 1400 may include forming, over a semiconductor substrate, a plurality of nanostructure layers in a direction that is perpendicular to the semiconductor substrate. (block 1410). For example, one or more of the semiconductor processing tools 102-112, such as the deposition tool 102, may perform a sequence of one or more operations, over a semiconductor substrate 205, to form a plurality of nanostructure layers in a direction that is perpendicular to the semiconductor substrate, as described above. In some implementations, the plurality of nanostructure layers includes a plurality of sacrificial layers (e.g., the first layers 310) alternating with a plurality of channel layers (e.g., the second layers 315).

As further shown in FIG. 14, process 1400 may include forming inner spacers on ends of the plurality of sacrificial layers (block 1420). For example, one or more of the semiconductor processing tools 102-112, such as the deposition tool 102, may perform a sequence of one or more operations to form inner spacers 245 on ends of the plurality of sacrificial layers, as described above.

As further shown in FIG. 14, process 1400 may include forming concave-shaped regions in ends of the plurality of channel layers (block 1430). For example, one or more the semiconductor processing tools 102-112, such as the etch tool 108, may perform a sequence of one or more operations to form concave-shaped regions 925 in ends of the plurality of channel layers, as described above.

As further shown in FIG. 14, process 1400 may include forming a source/drain region adjacent to the inner spacers and the concave-shaped regions (block 1440). For example, one or more the semiconductor processing tools 102-112, such as the deposition tool 102, may perform a sequence of one or more operations to form a source/drain region 225 adjacent to the inner spacers 245 and the concave-shaped regions 925. In some implementations, forming the source/drain region 225 includes forming convex-shaped portions 935*b* of an epitaxial layer 935 of the source/drain region 225 within the concave-shaped regions 925 at the ends of the plurality of channel layers.

As further shown in FIG. 14, process 1400 may include forming a gate structure including a portion that wraps around the plurality of channel layers (block 1450). For example, one or more of the semiconductor processing tools 102-112, such as the deposition tool 102, the exposure tool 104, the developer tool 106, and the etch tool 108, may perform a sequence of one or more operations to form a gate structure 240 including a portion that wraps around the plurality of channel layers, as described above.

Process 1400 may include additional implementations, such as any single implementation or any combination of implementations described below and/or in connection with one or more other processes described elsewhere herein.

In a first implementation, process 1400 includes forming a buffer region 230 adjacent to the inner spacers 245 prior to forming the concave-shaped regions 925 in the ends of the plurality of channel layers.

In a second implementation, alone or in combination with the first implementation, forming the concave-shaped regions 925 in the ends of the plurality of channel layers includes using an etching operation. In some implementations, the etching operation removes a portion of the buffer region 230.

In a third implementation, alone or in combination with one or more of the first and second implementations, the etching operation includes a cyclic flow of an etchant to cause the concave-shaped regions 925a-925c to have different depths D11, D12, D13 in the ends of the channel layers.

In a fourth implementation, alone or in combination with one or more of the first through third implementations, process 1400 includes forming a seed layer 930 on surfaces of the concave-shaped regions prior to forming the source/drain region.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

Figure 15:
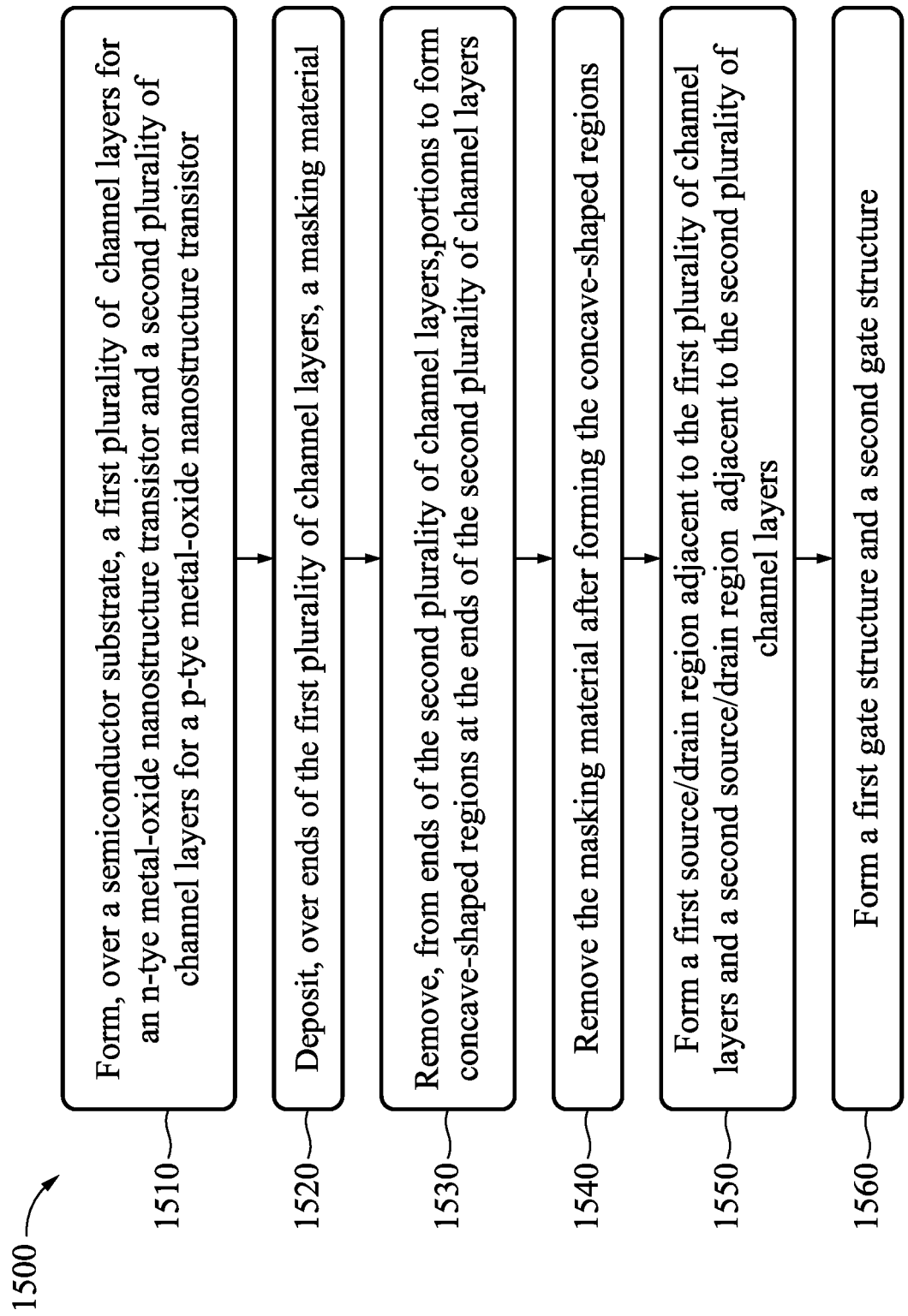

FIG. 15 is a flowchart of an example process 1500 associated with semiconductor device and methods of formation. In some implementations, one or more process blocks of FIG. 15 are performed by a combination of one or more semiconductor processing tools (e.g., a combination of one or more of the semiconductor processing tools 102-112). Additionally, or alternatively, one or more process blocks of FIG. 15 may be performed by one or more components of device 1300, such as processor 1320, memory 1330, input component 1340, output component 1350, and/or communication component 1360.

As shown in FIG. 15, process 1500 may include forming, over a semiconductor substrate, a first plurality of channel layers for an n-type metal-oxide nanostructure transistor and a second plurality of channel layers for a p-type metal-oxide nanostructure transistor (block 1510). For example, one or more of the semiconductor processing tools 102-112, such as the deposition tool 102, may form, over a semiconductor substrate 205, a first plurality of channel layers (e.g., a first plurality of the second layers 315) for an n-type metal-oxide nanostructure transistor and a second plurality of channel layers (e.g., a second plurality of the second layers 315) for a p-type metal-oxide nanostructure transistor, as described above. In some implementations, forming the first plurality of channel layers includes forming the first plurality of channel layers along a first axis that is perpendicular to the semiconductor substrate 205, and forming the second plurality of channel layers includes forming the second plurality of channel layers along a second axis that is perpendicular to the semiconductor substrate 205.

As further shown in FIG. 15, process 1500 may include depositing, over ends of the first plurality of channel layers, a masking material (block 1520). For example, one or more of the semiconductor processing tools 102-112, such as the deposition tool 102 (e.g., a spin coating version of the deposition tool 102) and the exposure tool 104, may perform a sequence of one or more operations to deposit, over ends of the first plurality of channel layers, a masking material (e.g., a photoresist material), as described above.

As further shown in FIG. 15, process 1500 may include removing, from ends of the second plurality of channel layers, portions to form concave-shaped regions at the ends of the second plurality of channel layers (block 1530). For example, one or more of the semiconductor processing tools 102-112, such as the etch tool 108, may perform a sequence of one or more operations to remove, from ends of the second plurality of channel layers, portions to form concave-shaped regions 925a-925c at the ends of the second plurality of channel layers, as described above.

As further shown in FIG. 15, process 1500 may include removing the masking material after forming the concave-shaped regions (block 1540). For example, one or more of the semiconductor processing tools 102-112, such as the etch tool 108 (e.g., a plasma-based asher), may perform a sequence of one or more operations to remove the masking material after forming the concave-shaped regions, as described above.

As further shown in FIG. 15, process 1500 may include forming a first source/drain region adjacent to the first plurality of channel layers and a second source/drain region adjacent to the second plurality of channel layers (block 1550). For example, one or more of the semiconductor processing tools 102-112, such as the deposition tool 102, may perform a sequence of one or more operations to form a first source/drain region 225 adjacent to the first plurality of channel layers and a second source/drain region 225 adjacent to the second plurality of channel layers, as described above. In some implementations, forming the first source/drain region 225 comprises forming a first portion 935d of an epitaxial layer over the ends of the first plurality of channel layers. In some implementations, forming the second source/drain region comprises forming a second portion 935c of the epitaxial layer within the concave-shaped regions at the ends of the second plurality of channel layers.

As further shown in FIG. 15, process 1500 may include forming a first gate structure and a second gate structure (block 1560). For example, one or more of the semiconductor processing tools 102-112, such as the deposition tool 102, the exposure tool 104, the developer tool 106, and the etch tool 108, may perform a sequence of one or more operations form a first gate structure and a second gate structure, as described above. In some implementations, forming the first gate structure comprises forming a portion that wraps around the first plurality of channel layers. In some implementations, forming the second gate structure comprises forming a portion that wraps around the second plurality of channel layers.

Process 1500 may include additional implementations, such as any single implementation or any combination of implementations described below and/or in connection with one or more other processes described elsewhere herein.

In a first implementation, process 1500 includes performing a cleaning operation after removing the masking material and prior to forming the first source/drain region 225 and the second source/drain region 225.

Although FIG. 15 shows example blocks of process 1500, in some implementations, process 1500 includes additional blocks, fewer blocks, different blocks, or differently arranged blocks than those depicted in FIG. 15. Additionally, or alternatively, two or more of the blocks of process 1500 may be performed in parallel.

Some implementations described herein provide a nanostructure transistor and methods of formation. The nanostructure transistor includes concave-shaped regions at ends of a plurality of channel layers. The nanostructure transistor further includes convex-shaped portions of an epitaxial material, included as part of a source/drain region of the nanostructure transistor, that extend into the concave-shaped regions. Masking, etching, and cleaning operations, performed after deposition of a buffer layer, may form the concave-shaped regions.

In this way, a performance of the nanostructure transistor is improved. For example, a length of channels of the nanostructure transistor may be reduced to decrease the channel resistance ($R_{ch}$) of the nanostructure transistor. Additionally, or alternatively, a volume of epitaxial materials within the source/drain region may be increased to decrease the parasitic resistance ($R_p$) of the nanostructure transistor. Such decreases in $R_{ch}$ and/or $R_p$ may increase a drive current of the nanostructure transistor. The concave-shaped ends of the channel layers may also reduce a likelihood of non-merge issues to improve a yield of semiconductor devices including the nanostructure channel transistor.

As described in greater detail above, some implementations described herein provide a semiconductor device. The semiconductor device includes a plurality of channel layers over a semiconductor substrate, where the plurality of channel layers are arranged in a direction that is perpendicular to the semiconductor substrate, and where the plurality of channel layers include concave-shaped regions at ends of the plurality of channel layers. The semiconductor device includes a gate structure wrapping around each of the plurality of channel layers. The semiconductor device includes a source/drain region adjacent to the plurality of channel layers and the gate structure.

As described in greater detail above, some implementations described herein provide a method. The method includes forming, over a semiconductor substrate, a plurality of nanostructure layers in a direction that is perpendicular to the semiconductor substrate, where the plurality of nanostructure layers includes a plurality of sacrificial layers alternating with a plurality of channel layers. The method includes forming inner spacers on ends of the plurality of sacrificial layers. The method includes forming concave-shaped regions in ends of the plurality of channel layers. The method includes forming a source/drain region adjacent to the inner spacers and the concave-shaped regions, where forming the source/drain region includes forming convex-shaped portions of an epitaxial layer of the source/drain region within the concave-shaped regions at the ends of the plurality of channel layers. The method includes forming a gate structure including a portion that wraps around the plurality of channel layers.

As described in greater detail above, some implementations described herein provide a method. The method includes forming, over a semiconductor substrate, a first plurality of channel layers for an n-type metal-oxide nanostructure transistor and a second plurality of channel layers for a p-type metal-oxide nanostructure transistor, where forming the first plurality of channel layers includes forming the first plurality of channel layers along a first axis that is perpendicular to the semiconductor substrate, and where forming the second plurality of channel layers includes forming the second plurality of channel layers along a second axis that is perpendicular to the semiconductor substrate. The method includes depositing, over ends of the first plurality of channel layers, a masking material. The method includes removing, from ends of the second plurality of channel layers, portions to form concave-shaped regions at the ends of the second plurality of channel layers. The method includes removing the masking material after forming the concave-shaped regions. The method includes forming a first source/drain region adjacent to the first plurality of channel layers and a second source/drain region adjacent to the second plurality of channel layers, where forming the first source/drain region includes forming a first portion of an epitaxial layer over the ends of the first plurality of channel layers, and where forming the second source/drain region includes forming a second portion of the epitaxial layer within the concave-shaped regions at the ends of the second plurality of channel layers. The method includes forming a first gate structure and a second gate structure, where forming the first gate structure includes forming a portion that wraps around the first plurality of channel layers, and where forming the second gate structure includes forming a portion that wraps around the second plurality of channel layers.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of channel layers over a semiconductor substrate,
      wherein the plurality of channel layers are arranged in a direction that is perpendicular to the semiconductor substrate, and
      wherein the plurality of channel layers comprise concave-shaped regions at ends of the plurality of channel layers;
   a gate structure wrapping around each of the plurality of channel layers;
   a source/drain region, adjacent to the plurality of channel layers and the gate structure, comprising convex-shaped portions extending into the concave-shaped regions; and
   a seed layer between the concave-shaped regions and the convex-shaped portions.

2. The semiconductor device of claim 1, wherein the source/drain region comprises:
   a layer of an epitaxial material comprising the convex-shaped portions.

3. The semiconductor device of claim 1, wherein a thickness of the convex-shaped portions is included in a range of approximately 2 nanometers to approximately 5 nanometers.

4. The semiconductor device of claim 2, wherein the layer of epitaxial layer material corresponds to a first layer of a first epitaxial material, and
   wherein the source/drain region further comprises a second layer of a second epitaxial material over the first layer of the first epitaxial material, and
   wherein the source/drain region further comprises a third layer of a third epitaxial material over the second layer of the second epitaxial material.

5. The semiconductor device of claim 1, wherein a proximity of the gate structure of the semiconductor device to the source/drain region is included in a range of approximately 3 nanometers to approximately 6 nanometers.

6. The semiconductor device of claim 1, further comprising:
   a buffer region below the source/drain region,
      wherein the buffer region comprises a layer of a silicon material or a silicon germanium material.

7. The semiconductor device of claim 6, wherein a thickness of the layer of the silicon material or the silicon germanium material is included in a range of approximately 8 nanometers to approximately 40 nanometers.

8. The semiconductor device of claim 1, further comprising:
   inner spacers at ends of portions of the gate structure.

9. The semiconductor device of claim 8, wherein a ratio of a thickness of one or more of the concave-shaped regions to a thickness of one or more of the inner spacers is included in a range of approximately 1 to approximately 2.

10. The semiconductor device of claim 1, wherein the semiconductor device corresponds to a logic device or a static random access memory device.

11. The semiconductor device of claim 1, wherein an angle associated with one or more of the concave-shaped regions is included in range of approximately 120 degrees to approximately 160 degrees.

12. The semiconductor device of claim 1, wherein the plurality of channel layers that comprise the concave-shaped regions include:
   a first channel layer comprising a first concave-shaped region,
      wherein the first concave-shaped region comprises a first depth, and
   a second channel layer below the first channel layer comprising a second concave-shaped region,
      wherein the second concave-shaped region comprises a second depth that is greater relative to the first depth.

13. A method, comprising:
   forming, over a semiconductor substrate, a plurality of nanostructure layers in a direction that is perpendicular to the semiconductor substrate,
      wherein the plurality of nanostructure layers comprises a plurality of sacrificial layers alternating with a plurality of channel layers;
   forming inner spacers on ends of the plurality of sacrificial layers;
   forming concave-shaped regions in ends of the plurality of channel layers;
   forming a seed layer on surfaces of the concave-shaped regions;
   forming, after forming the seed layer, a source/drain region adjacent to the inner spacers and the concave-shaped regions,
      wherein forming the source/drain region includes forming convex-shaped portions of an epitaxial layer of the source/drain region within the concave-shaped regions at the ends of the plurality of channel layers; and
   forming a gate structure including a portion that wraps around the plurality of channel layers.

14. The method of claim 13, further comprising:
   forming a buffer region adjacent to the inner spacers prior to forming the concave-shaped regions in the ends of the plurality of channel layers.

15. The method of claim 14, wherein forming the concave-shaped regions in the ends of the plurality of channel layers includes using an etching operation, and wherein the etching operation removes a portion of the buffer region.

16. The method of claim 15, wherein etching operation comprises:
   a cyclic flow of an etchant to cause the concave-shaped regions to have different depths in the ends of the plurality of channel layers.

17. A method, comprising:
   forming, over a semiconductor substrate, a first plurality of channel layers for an n-type metal-oxide nanostructure transistor and a second plurality of channel layers for a p-type metal-oxide nanostructure transistor,
      wherein forming the first plurality of channel layers comprises forming the first plurality of channel layers along a first axis that is perpendicular to the semiconductor substrate, and
      wherein forming the second plurality of channel layers comprises forming the second plurality of channel layers along a second axis that is perpendicular to the semiconductor substrate;
   depositing, over ends of the first plurality of channel layers, a masking material;
   removing, from ends of the second plurality of channel layers, portions to form concave-shaped regions at the ends of the second plurality of channel layers;
   removing the masking material after forming the concave-shaped regions;
   forming a first source/drain region adjacent to the first plurality of channel layers and a second source/drain region adjacent to the second plurality of channel layers,
      wherein forming the first source/drain region comprises forming a first portion of an epitaxial layer over the ends of the first plurality of channel layers, and
      wherein forming the second source/drain region comprises forming a second portion of the epitaxial layer within the concave-shaped regions at the ends of the second plurality of channel layers; and
   forming a first gate structure and a second gate structure,
      wherein forming the first gate structure comprises forming a portion that wraps around the first plurality of channel layers, and
      wherein forming the second gate structure comprises forming a portion that wraps around the second plurality of channel layers.

18. The method of claim 17, further comprising:
   performing a cleaning operation after removing the masking material and prior to forming the first source/drain region and the second source/drain region.

19. The method of claim 13, wherein a thickness of the convex-shaped portions is included in a range of approximately 2 nanometers to approximately 5 nanometers.

20. The method of claim 13, wherein a proximity of the gate structure to the source/drain region is included in a range of approximately 3 nanometers to approximately 6 nanometers.

* * * * *